(12) United States Patent
Torii

(10) Patent No.: US 8,014,204 B2
(45) Date of Patent: Sep. 6, 2011

(54) SEMICONDUCTOR DEVICE

(75) Inventor: Satoshi Torii, Yokohama (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/892,388

(22) Filed: Sep. 28, 2010

(65) Prior Publication Data

US 2011/0044112 A1    Feb. 24, 2011

Related U.S. Application Data

(63) Continuation of application No. PCT/JP2008/056444, filed on Mar. 31, 2008.

(51) Int. Cl.
*G11C 11/34* (2006.01)

(52) U.S. Cl. .............................. 365/185.18; 365/185.24

(58) Field of Classification Search .............. 365/185.18, 365/185.24
See application file for complete search history.

(56) References Cited

U.S. PATENT DOCUMENTS

| | | | |
|---|---|---|---|
| 4,258,378 | A | 3/1981 | Wall |
| 5,557,569 | A | 9/1996 | Smayling et al. |
| 5,610,858 | A | 3/1997 | Iwahashi |
| 5,671,177 | A | 9/1997 | Ueki |
| 6,028,788 | A | 2/2000 | Choi et al. |
| 6,169,307 | B1 | 1/2001 | Takahashi et al. |
| 6,188,605 | B1 | 2/2001 | Nomura et al. |
| 7,115,471 | B2 | 10/2006 | Shinada et al. |
| 2005/0083744 | A1 | 4/2005 | Arai et al. |
| 2005/0136597 | A1 | 6/2005 | Shinada et al. |
| 2007/0127292 | A1* | 6/2007 | Sakui et al. ............... 365/185.17 |
| 2007/0147113 | A1* | 6/2007 | Mokhlesi et al. ........ 365/185.03 |

FOREIGN PATENT DOCUMENTS

| | | |
|---|---|---|
| JP | 5-167044 A | 7/1993 |
| JP | 8-036894 A | 2/1996 |
| JP | 8-255495 A | 10/1996 |
| JP | 10-093058 A | 4/1998 |
| JP | 11-177068 A | 7/1999 |
| JP | 11-251537 A | 9/1999 |
| JP | 2005-116970 A | 4/2005 |
| JP | 2005-122772 A | 5/2005 |
| WO | 03/003473 A1 | 1/2003 |

OTHER PUBLICATIONS

International Search Report of PCT/JP2008/056444, mailing date May 20, 2008.
Supplementary European Search Report dated Mar. 4, 2011, issued in corresponding European Patent Application No. 08739557.0.
European Search Report dated Mar. 8, 2011, issued in corresponding European Patent Application No. 10195176.2.

* cited by examiner

*Primary Examiner* — Michael T Tran
(74) *Attorney, Agent, or Firm* — Westerman, Hattori, Daniels & Adrian, LLP

(57) ABSTRACT

A semiconductor device includes a first memory cell which includes a first memory transistor and a first selector transistor. The semiconductor device further includes a second memory cell which includes a second memory transistor and a second selector transistor. The semiconductor device further includes a first word line electrically coupled to a gate electrode of the first memory transistor and to a gate electrode of the second selector transistor, and a second word line electrically coupled to a gate electrode of the second memory transistor and to a gate electrode of the first selector transistor. The semiconductor device further includes a first source line electrically coupled to a source region of the first memory transistor and to a source region of the second memory transistor.

20 Claims, 49 Drawing Sheets

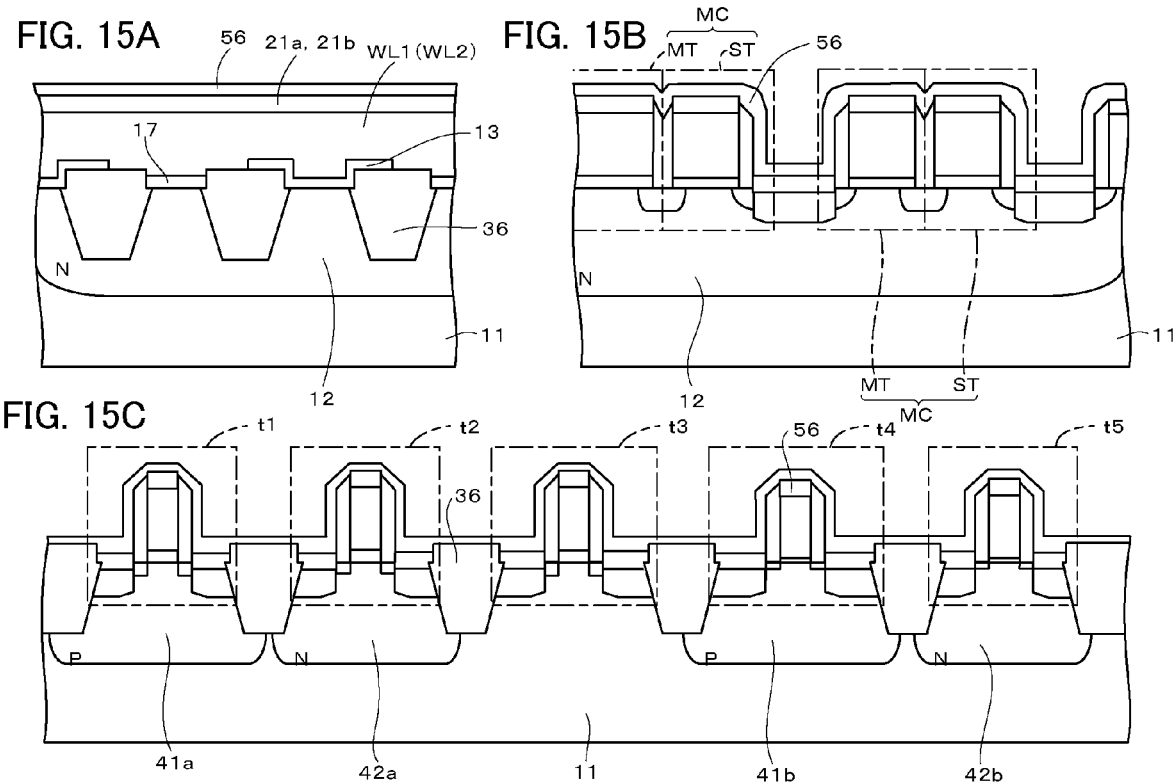

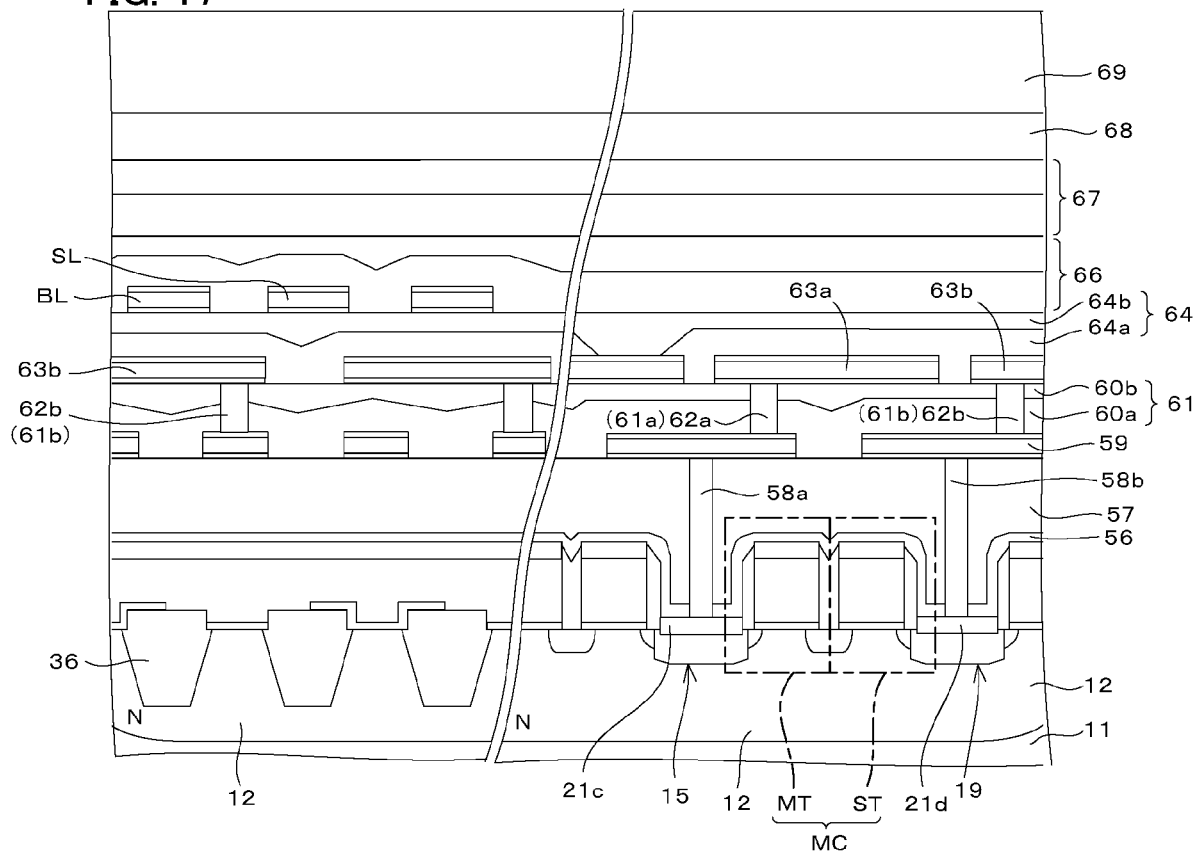

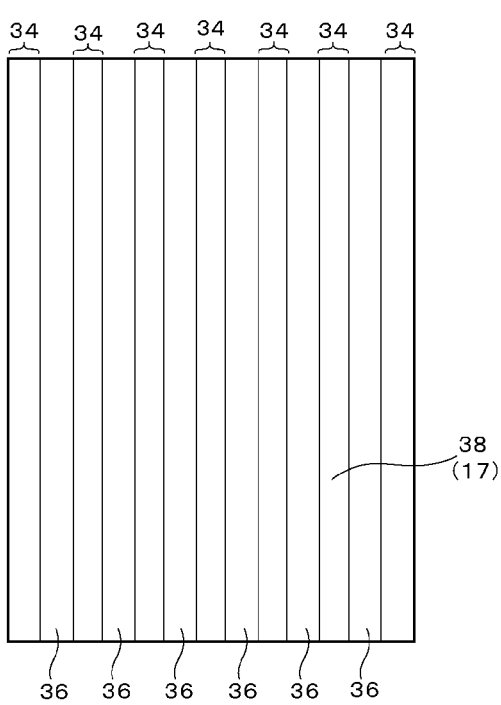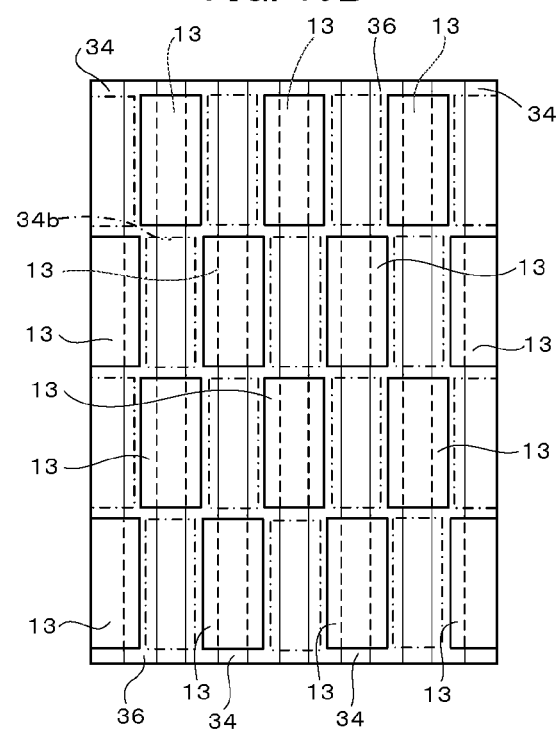

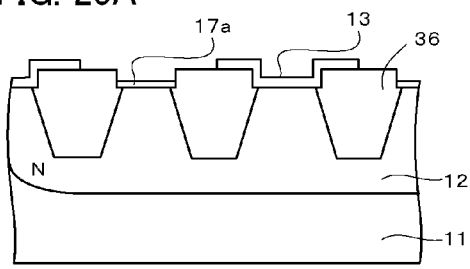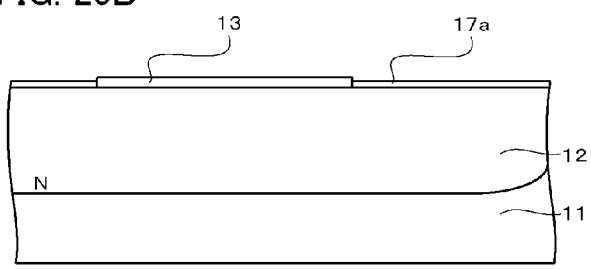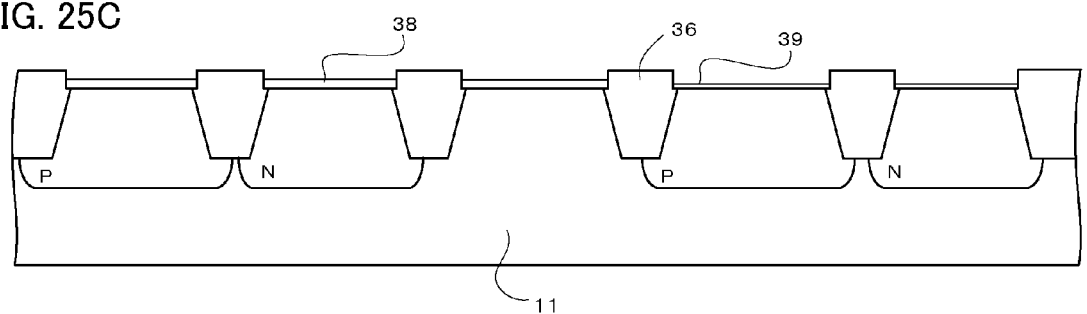

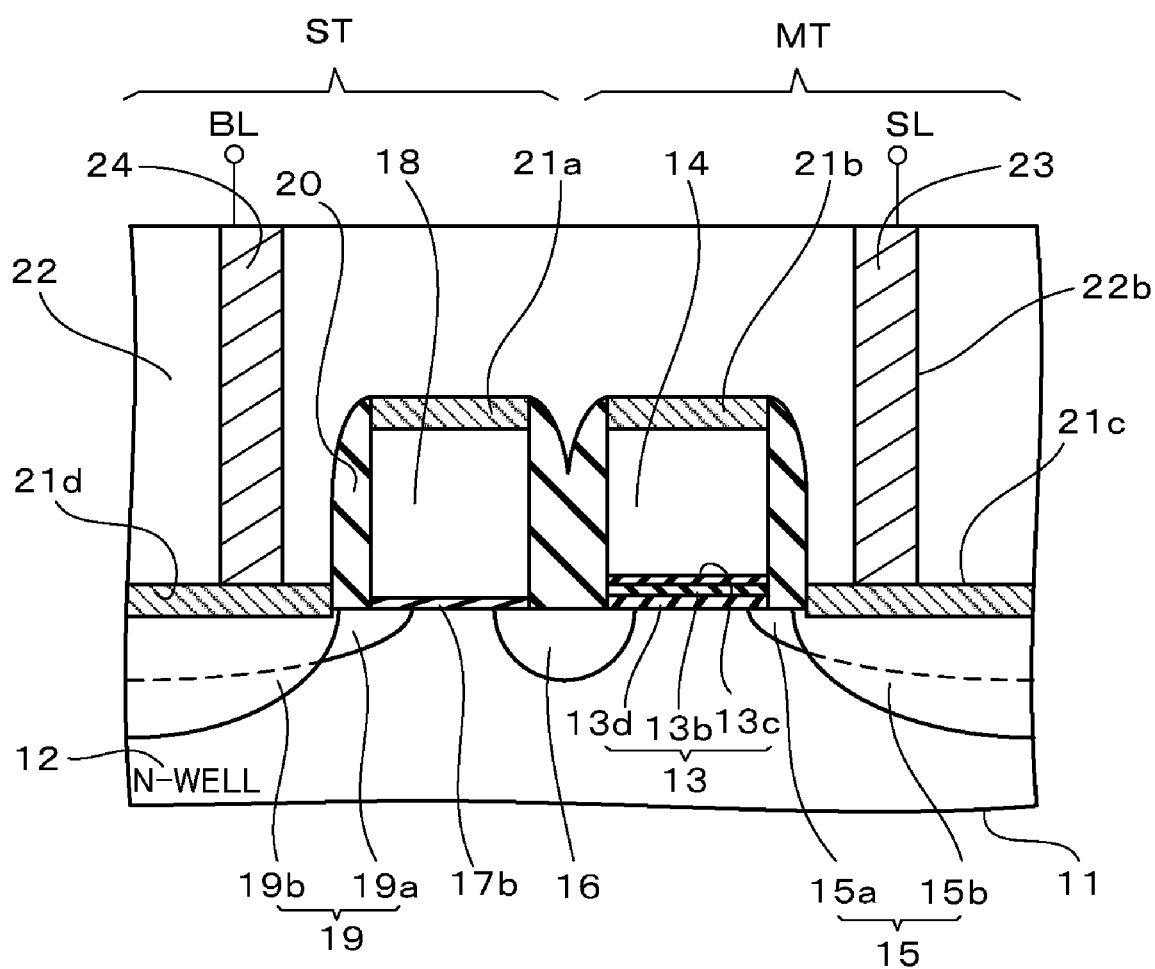

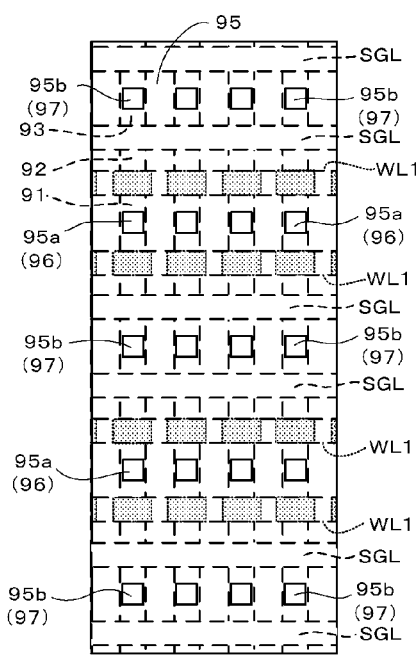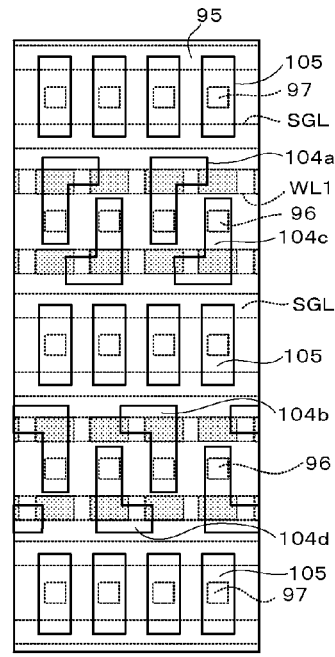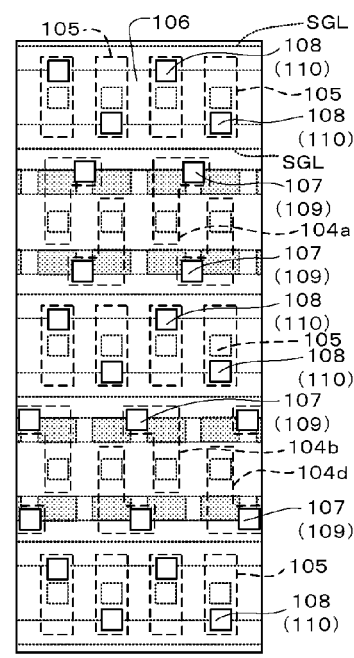

SEMICONDUCTOR DEVICE

CROSS-REFERENCE TO RELATED APPLICATION

This application is a U.S. continuation application filed under 35 USC 111(a) claiming benefit under 35 USC 120 and 365(c) of international application PCT/JP2008/56444, filed on Mar. 31, 2008, the entire contents of which are incorporated herein by reference.

FIELD

A certain aspect of the embodiments discussed herein is related generally to a semiconductor device, and more particularly to a semiconductor device which includes a memory cell having a memory transistor and a selector transistor.

BACKGROUND

As a method for writing information into a flash memory or an EEPROM as a non-volatile semiconductor memory device, such a method is widely used that channel hot electrons (CHEs) are generated in a channel region of a memory transistor and the generated channel hot electrons are injected into a charge storage or trapping layer of the memory transistor.

The writing method through the CHE injection may need to provide large current between a source and a drain of a selector transistor of such a memory device, resulting in large current dissipation.

As a further method for writing information into a memory cell without providing current flowing through such a channel region, such a writing method through avalanche injection is used that electrons or holes are generated by avalanche breakdown or band-to-band tunneling (BTBT) and the generated electrons or holes are injected into a charge storage or trapping layer of the memory transistor.

Similarly to the writing method through CHE injection, the writing method through avalanche injection performs a write operation by applying a voltage to a gate electrode and a source diffusion region of the memory transistor. However, the writing method through avalanche injection is different from the writing method through CHE injection in that the writing method through avalanche injection performs a write operation only by the use of substrate current.

A NOR-type memory cell formed of two transistors, i.e. a selector transistor and a memory transistor, is disclosed in Japanese Laid-open Patent Application Publication JP 2005-116970-A (patent document 1), for example.

In order to reduce current consumption in the two-transistor cell described above, it is desirable to employ such a writing method through avalanche injection. In this case, however, the selector transistor cannot control substrate current, and hence the selector transistor cannot be used to control enabling or disabling a write operation. Thus, a memory circuit of FIG. 2 in patent document 1 described above, which uses two-transistor cells for a NOR-type flash memory, has its memory transistors disposed on a side of a bit line and selects the memory transistor with the bit line and a word line.

However, coupling of the memory transistor to the bit line may provide variable parasitic capacitance formed by the memory transistor depending on its different written state, which may provide an unstable read operation. Thus, for providing a stable read operation, it is desirable to dispose the selector transistors on the side of the bit line and dispose the memory transistors on the side of the source line.

On the other hand, a memory circuit which couples selector transistors of two-transistor cells to a bit line and employs the writing method through CHE injection is disclosed in Japanese Laid-open Patent Application Publication JP 2005-122772-A (patent document 2). This memory circuit has a configuration such that a plurality of memory transistors which are coupled to a shared word line have respective source regions coupled to a shared source line.

If this memory circuit employs the writing method through avalanche injection to apply a voltage between the word line and the source line, the memory transistors are caused to be simultaneously in write enable states so that any of the memory transistors cannot be selected.

In addition, Japanese Laid-open Patent Application Publication JP HEI 11-177068-A (patent document 3), FIG. 10, discloses a memory circuit which employs the writing method through CHE injection. In this memory circuit, drain regions of selector transistors are coupled to a bit line, and source regions of memory transistors are coupled to a source line.

However, the memory circuit of patent document 3 described above provides no direct coupling between two-transistor cells and provides a source line and a bit line disposed for each column of the cells, so that many junctions are provided between the source and bit lines and the transistors. Thus, this memory circuit has a larger area of memory cells than that of each of the memory circuits of patent documents 1 and 2 described above.

SUMMARY

According to an aspect of the embodiment, a semiconductor device includes: a first memory cell which includes a first memory transistor and a first selector transistor, and a second memory cell which includes a second memory transistor and a second selector transistor. The semiconductor device further includes a first word line electrically coupled to a gate electrode of the first memory transistor and to a gate electrode of the second selector transistor, and a second word line electrically coupled to a gate electrode of the second memory transistor and to a gate electrode of the first selector transistor. The semiconductor device further includes a first source line electrically coupled to a source region of the first memory transistor and to a source region of the second memory transistor.

According to another aspect of the embodiment, a semiconductor device includes: a first memory cell which includes a first memory transistor and a first selector transistor, and a second memory cell which includes a second memory transistor and a second selector transistor. The semiconductor device further includes: a third memory cell which includes a third memory transistor, and a third selector transistor which shares a first drain region with the first selector transistor, and a fourth memory cell which includes a fourth memory transistor, and a fourth selector transistor which shares a second drain region with the second selector transistor. The semiconductor device further includes a first word line electrically coupled to a gate electrode of the first memory transistor and to a gate electrode of the second memory transistor, and a second word line electrically coupled to a gate electrode of the third memory transistor and to a gate electrode of the fourth memory transistor. The semiconductor device further includes a first source line electrically coupled to a source region of the first memory transistor and to a source region of the fourth memory transistor, a second source line electrically coupled to a source region of the second memory transistor, and a third source line electrically coupled to a source region of the third memory transistor. The semiconductor device further includes a first bit line electrically coupled to the first shared drain region, and a second bit line electrically coupled to the second shared drain region.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 15A-15C are a twelfth subset of the cross-sectional views for illustrating the example steps of forming the semiconductor device in accordance with the first embodiment of the present invention;

FIG. 17 is a cross sectional view of an example memory cell array area of the semiconductor device in accordance with the first embodiment of the present invention;

FIGS. 19A and 19B are a first subset of plan views for illustrating the example steps of forming the semiconductor device in accordance with the first embodiment of the present invention;

FIGS. 25A-25C are a third subset of the cross-sectional views for illustrating example steps of forming the gate insulating film in the steps of forming the semiconductor device in accordance with the second embodiment of the present invention.

FIG. 30 is a cross sectional view of an example semiconductor device in accordance with a fifth embodiment of the present invention;

DESCRIPTION OF PREFERRED EMBODIMENTS

An object of the embodiments is to provide a semiconductor device with a new array of memory cells.

According to the aspect of the embodiment, two memory cells have respective memory transistors and respective selector transistors, in which a gate electrode of the memory transistor of one of the memory cells and a gate electrode of the selector transistor of the other of the memory cells are coupled to a first word line, and a gate electrode of the selector transistor of the one memory cell and a gate electrode of the memory transistor of the other memory cell are coupled to a second word line. Source regions of the respective memory transistors of the two respective memory cells are coupled to a same source line.

Thus, a given voltage is applied to one of the first word line and the second word line and a given voltage is applied to the source line, so that a data bit is written by the avalanche injection into one of the memory transistors that receives both of the given voltages at the two lines. In addition, the source regions of both of the memory transistors are coupled to each other, so that effects of variable written states of the memory transistors on respective parasitic capacitances of respective bit lines are suppressed or reduced.

According to the aspect of the embodiment, first, second, third and fourth memory cells have respective memory transistors and respective selector transistors, in which drain regions of the first and third memory transistors of the first and third respective memory cells are formed as a shared or common region, and drain regions of the second and fourth memory transistors of the second and fourth respective memory cells are formed as a shared or common region. In addition, both of gate electrodes of the first and second memory transistors are coupled to a first word line, and both of gate electrodes of the second and fourth memory transistors are coupled to a second word line. In addition, a source region of the first memory transistor and a source region of the fourth memory transistor are coupled to a first source line, and second and third source lines are coupled to respective source regions of the other memory transistors.

Thus, a given voltage is applied to one of the first word line and the second word line and a given voltage is applied to the first, second and third source lines, so that a data bit is written by the avalanche injection into only one of the memory transistors that receives both of the given voltages at the two lines. In addition, the source regions of the four memory transistors are coupled to each other the source lines so that effects of variable written states of the four memory transistors on respective parasitic capacitances of respective bit lines are suppressed or reduced.

Embodiments of the present invention will be described with reference to the accompanying drawings.

First Embodiment

Figure 1:
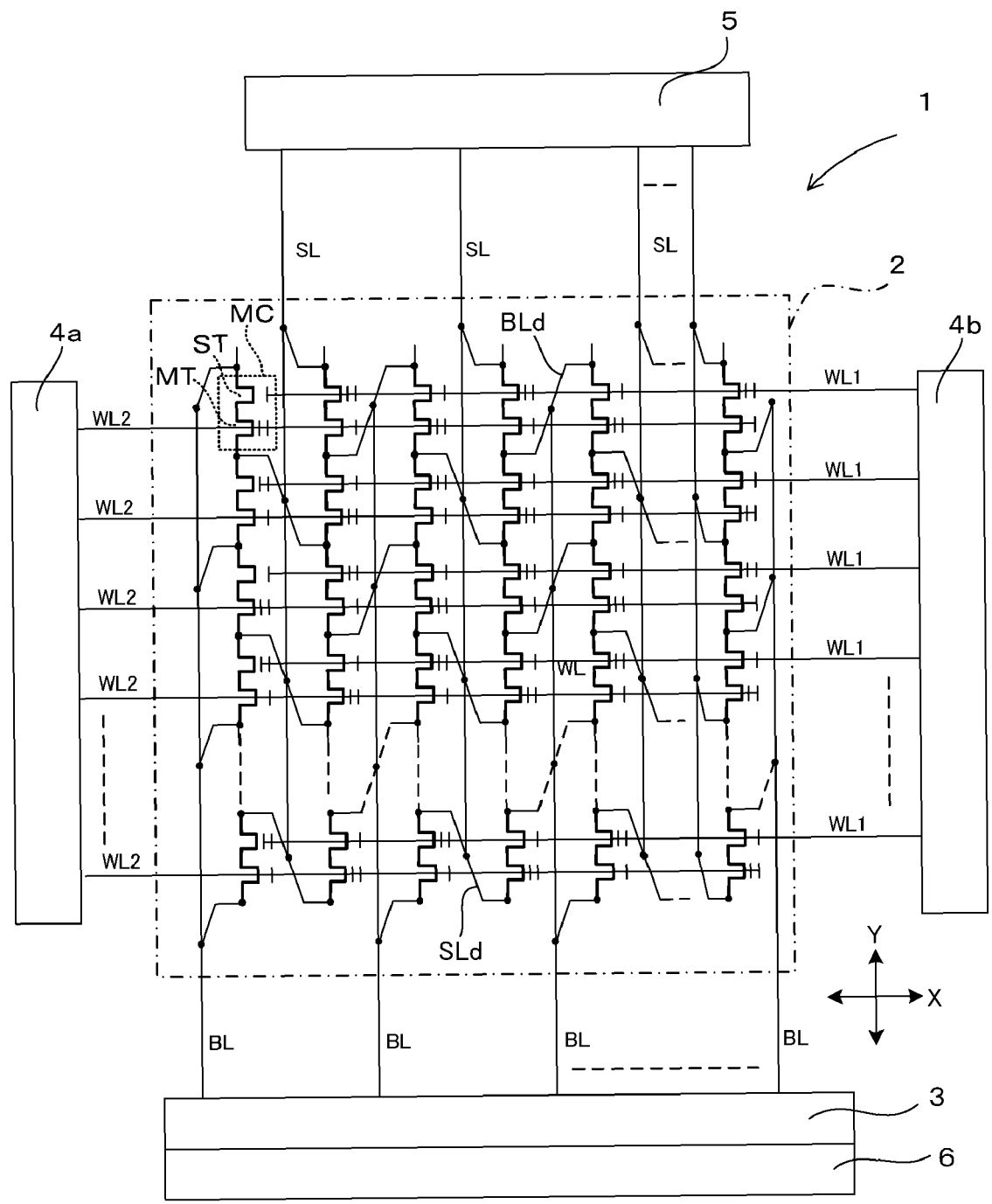
FIG. 1 illustrates an example memory circuit for a semiconductor device in accordance with an embodiment of the present invention.

FIG. 1 illustrates an example circuit and block diagram for a flash memory as a semiconductor device in accordance with a first embodiment of the present invention.

In FIG. 1, a flash memory 1 includes a memory cell array 2, and further includes, as peripheral circuits, a bit line decoder 3, a sense amplifier 6, first and second word line decoders 4a and 4b, a source line decoder 5, and the like. The bit line decoder 3 is also called a column decoder. The first and second word line decoders 4a and 4b are also called row decoders.

The memory cell array 2 has a plurality of memory cells MC's arranged in a matrix. The memory cells MC's are arranged such that a number, n, of memory cells MC's are arranged in each row or an X direction in FIG. 1, and a number, m, of memory cells MC's are arranged in each column or a Y direction in FIG. 1.

A plurality of word lines WL1 and WL2 are coupled to the corresponding word line decoders 4a and 4b. A plurality of source lines SL are coupled to the source line decoder 5. A plurality of bit lines BL are coupled to the bit line decoder 3.

The source lines SL and the bit lines BL are disposed substantially in parallel and alternately. The word lines WL1 and WL2 extend in a direction to cross the source lines SL and the bit lines BL, for example, in a direction perpendicular to the source lines SL and the bit lines BL.

In write, read and erase operations in the memory cell array 2, signals for these operations at the word lines WL1 and WL2 are controlled by the word line decoders 4a and 4b. In addition, signals for these operations at the bit lines BL are controlled by the bit line decoder 3, and signals for these operations at the source lines SL are controlled by the source line decoder 5. Specific examples of these signals will be described later.

The two symbols "WL1" and "WL2" indicating the word lines are used only for ease of understanding but are not used for grouping the word lines, unless otherwise explicitly specified in embodiments as described below.

Each memory cell MC includes a memory transistor MT and a selector transistor MT in series coupling. A drain of the selector transistor ST is electrically coupled through a coupling wiring to the bit line BL, and a source of the memory transistor MT is electrically coupled through a connection wiring to the source line SL.

Figure 2:
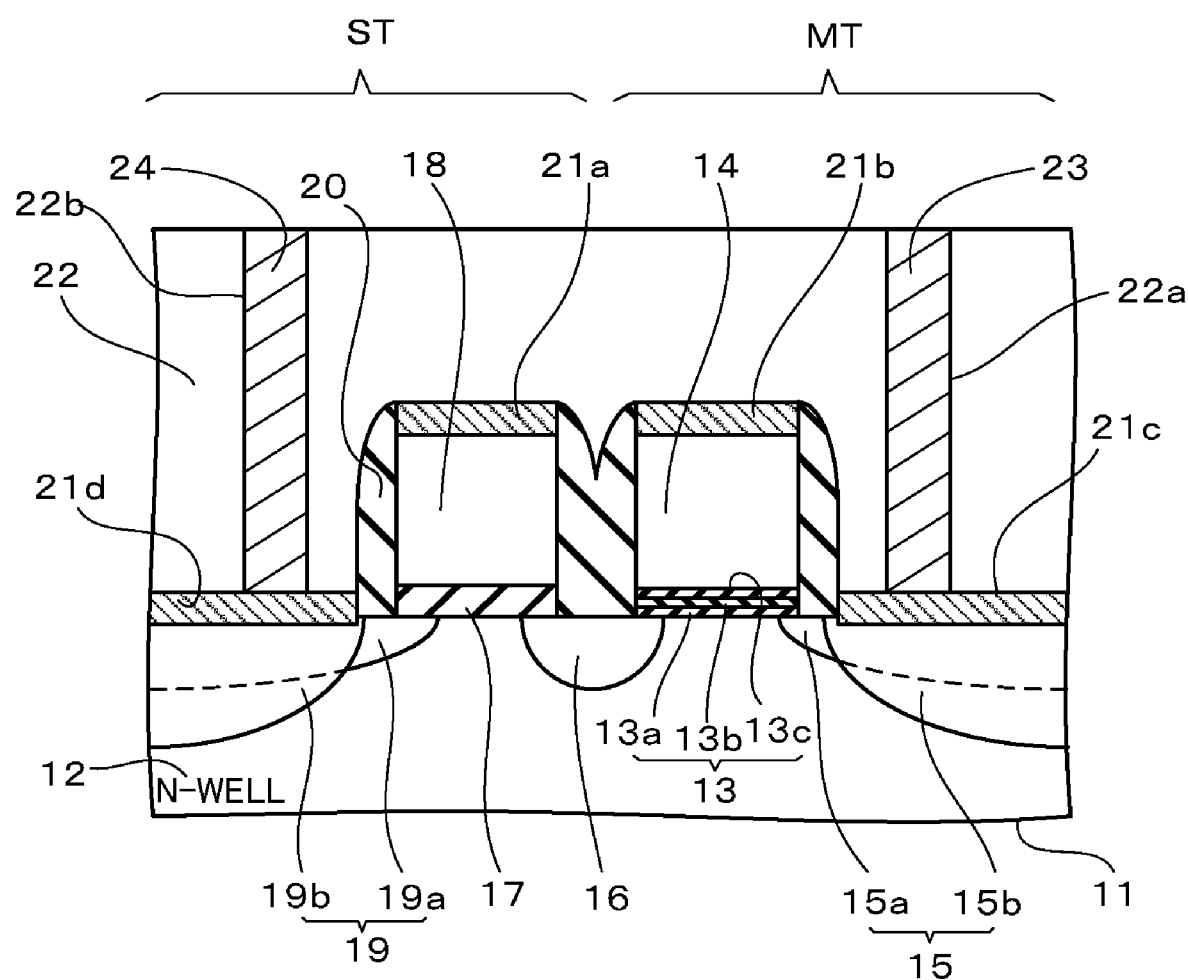
FIG. 2 is a cross sectional view of an example semiconductor device in accordance with a first embodiment of the present invention.

FIG. 2 illustrates an example structure of the memory cell MC which includes the memory transistor MT and the selector transistor ST.

The memory transistor MT includes a silicon oxide-nitride-oxide stack (ONO) film 13 as a charge storage or trapping layer formed on or over an N-type well 12 in a silicon substrate 11 as a semiconductor substrate, and a memory gate electrode 14 formed on or over the ONO film 13. The memory transistor MT may further include a p-type source region 15 and a p-type source and drain (source/drain) region 16, which are formed within the N-well 12 on respective opposite lateral sides of the memory gate electrode 14. The p-type source region 15 is formed of a p-type impurity diffusion region of high concentration 15b, and a p-type impurity extension region of low concentration 15a. The memory gate electrode 14 may be also referred to as a control gate electrode.

The ONO film 13 may have a structure of, for example, a lower silicon oxide film 13a, a silicon nitride film 13b, and an upper silicon oxide film 13c, which are formed in this order. In this case, the lower silicon oxide film 13a may have a thickness of 2.4 nm for example, the silicon nitride film 13b may have a thickness of 4 nm for example, and the upper silicon oxide film 13c may have a thickness of 4 nm for example.

The selector transistor ST includes a selector gate electrode 18 which may be formed on an interposing gate insulating film 17 and over or above the N-well 12. The selector transistor ST further includes the p-type source and drain (source/drain) region 16 and a p-type drain region 19, which may be formed within the N-well 12 on respective opposite lateral sides of the selector gate electrode 18. The p-type drain region 19 may be formed of a p-type impurity diffusion region 19b of high concentration, and a p-type impurity extension region 19a of low concentration.

The selector transistor ST and the memory transistor MT share the p-type source/drain region 16.

Side walls 20 are formed on surrounding lateral sides of each of the memory gate electrode 14 and the selector gate electrode 18. Silicide layers 21a and 21b are formed as upper layers over the selector gate electrode 18 and the memory gate electrode 14, respectively. Further silicide layers 21c and 21d are formed over respective surfaces of the p-type source region 15 and the p-type drain region 19. The silicide layers 21a to 21d may be formed of, for example, cobalt (Co) silicide layers with a thickness of 8 nm.

The memory gate electrode 14 and the selector gate electrode 18 may be formed and disposed substantially in parallel. The memory gate electrode 14 may be a portion of one of the two adjacent word lines WL1 and WL2. The selector gate electrode 18 may be a portion of the other of the two adjacent word lines WL1 and WL2.

An interlayer insulating film 22 is formed over the memory transistor MT and the selector transistor ST. In the interlayer insulating film 22, first and second contact holes 22a and 22b are formed on and to reach the respective silicide layers 21c and 21d formed over or on the p-type source region 15 and the p-type drain region 19, respectively. A first conductive plug 23 and a second conductive plug 24 are then buried or embedded in the first and second contact holes 22a and 22b, respectively.

The first conductive plug 23 over or above the p-type source region 15 is coupled to the source line SL. The second conductive plug 24 over or above the p-type drain region 19 is coupled to the bit line BL. Thus, differences of the written state of the memory transistor MT can be prevented from affecting parasitic capacitance of the bit line BL.

Referring also to FIG. 1, any two adjacent ones of the memory cells MC's in each column are coupled in series with each other by sharing either the p-type source region 15 or the p-type drain region 19. Thus, relative positions and orientations of the memory transistor MT and the selector transistor ST in each one of the memory cells MC's in series coupling along each column are opposite to those in adjacent one or ones of the memory cells MC's, and the memory transistor MT and the selector transistor ST alternate their relative positions and orientations in the memory cells MC's in and along each column. This arrangement thus reduces the number of junctions between the memory cells MC's, and the source lines SL and the bit lines BL, in the memory cell array 2.

For any two adjacent memory cells MC's along the word lines WL1 and WL2, the memory gate electrode 14 of one (MC) of the two adjacent memory cells MC's is coupled through the one word line WL1 or WL2 to the selector gate electrode 18 of the other (MC) of the two adjacent memory cells MC's. In addition, the selector gate electrode 18 of the one memory cell MC is coupled through the other word line WL2 or WL1 to the memory gate electrode 14 of the other memory cell MC.

In addition, for every two adjacent cells MC's along one of the word lines WL1 and WL2, the p-type source regions 15 of the two adjacent cells are coupled to a same one of the source lines SL, or the p-type drain regions of the two adjacent cells are coupled to a same one of the bit lines BL.

In this case, the two p-type source regions 15 of the two respective adjacent cells MC's may be disposed in respective relative positions which are aligned in a direction oblique to the longitudinal direction of the word lines WL1 and WL2, and may be electrically coupled to each other through a corresponding branch source line SLd, for example. Also, the two p-type drain regions 19 of the two respective adjacent cells MC's may be arranged in respective relative positions which are aligned in a direction oblique to the longitudinal direction of the word lines WL1 and WL2, and may be electrically coupled to each other through a corresponding branch bit line BLd, for example.

The branch source lines SLd are electrically coupled to the corresponding source lines SL. The branch bit lines BLd are electrically coupled to the corresponding bit lines BL.

In the configuration described above, selection of one of the source lines SL and one of the word lines WL1 and WL2 allows only one of the memory transistors MT coupled to the two selected source and word lines SL and WL1 or WL2 to simultaneously receive the two voltages developed at the two respective selected source and word lines SL and WL1 or WL2.

Now, TABLE 1 provides an example set of values of voltages applied to the word lines WL1 and WL2, the bit lines BL, and the source lines SL for write, read and erase operations of the memory cells MC's. TABLE 1 may be applicable to connections such that first word lines WL1 are coupled to the selector transistors ST, and second word lines WL2 are coupled to the memory transistors MT. In TABLE 1, parenthesized voltage values are applied to non-selected lines.

TABLE 1

|  | BL | SL | WL2 (SELECTOR TR) | WL1 (MEMORY TR) | N-WELL |
|---|---|---|---|---|---|
| WRITE | 0 V | −5 V | 0 V | 5 V | 0 V |
|  | (0 V) | (0 V) | (0 V) | (0 V) |  |
| READ | −1.8 V | 0 V | −1.8 V | 0 V | 0 V |
|  | (0 V) | (0 V) | (0 V) | (0 V) |  |
| ERASE | 5 V | 5 V | −5 V | −5 V | 5 V |

Figure 3A:
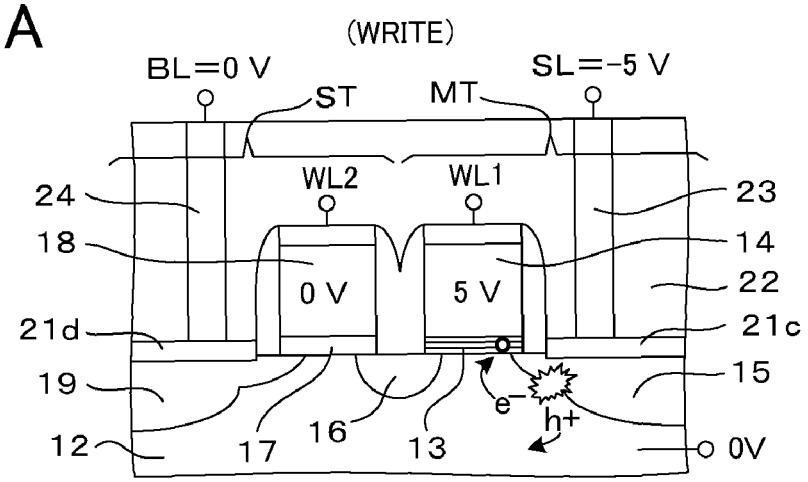
FIGS. 3A-3C are cross sectional views for illustrating operations of the example semiconductor device of FIG. 2.

As illustrated in FIG. 3A, the write operation for the memory cell MC applies a voltage of 5 V through the first word line WL1 to the memory gate electrode 14 of the memory transistor MT, and also applies a voltage of −5 V to the source line SL. In this case, the voltages at the bit line BL and the N-well 12 are set to be zero (0) V.

In order to turn off the selector transistor ST, the voltage of zero (0) V is applied through the second word line WL2 to the selector gate electrode 18.

Accordingly, electrons generated by tunneling between the bands of the p-type source region 15 and the N-well 12 are injected into the silicon nitride film 13b of the ONO film 13 due to the voltage applied between the memory gate electrode 14 and the N-well 12. As a result, a threshold of the memory transistor MT is changed to have a positive value. On the other hand, the voltages at the selector gate electrode 18 and the bit line BL are set to be zero (0) V, and hence no current flows through the channel region of the selector transistor ST. The voltage at the source line SL coupled to the non-selected memory cell MC is set to be zero (0) V, and hence no electron due to the band-to-band tunneling is generated.

Figure 3B:
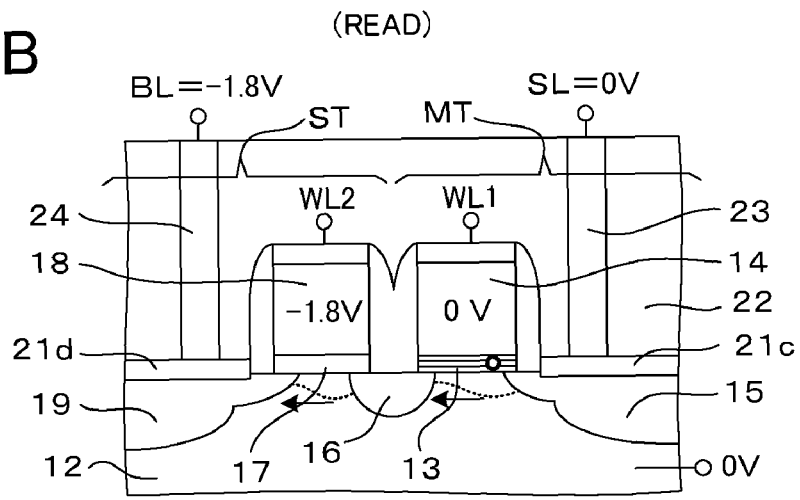

As illustrated in FIG. 3B, the read operation for the memory cell MC applies a voltage of −1.8 V through the second word line WL2 to the selector gate electrode 18 of the selector transistor ST, and also applies a voltage of −1.8 V to the bit line BL. On the other hand, the voltages at the memory gate electrodes 14, the bit lines BL, and the N-wells 12 are set to be zero (0) V.

Thus, a channel is formed in a surface layer portion of the N-well 12 under the selector gate electrode 18, and a potential difference is developed between the p-type drain region 19 and the p-type source region 15. In addition, in the memory transistor MT, the electrons trapped in the ONO film 13 form another channel under the memory gate electrode 14. Thus, a current flows from the p-type source region 15 to the p-type drain region 19.

On the other hand, in the state of no electron trapped in the ONO film 13, i.e., the erased state, no channel is formed under the memory gate electrode 14 at the potential of zero (0) V. Thus, no current flows from the p-type source region 15 to the p-type drain region 19.

The differences in the current flows described above are detected or sensed by the sense amplifiers 4 through the bit lines BL, and are read out as data bits representative of "0" and "1".

Figure 3C:
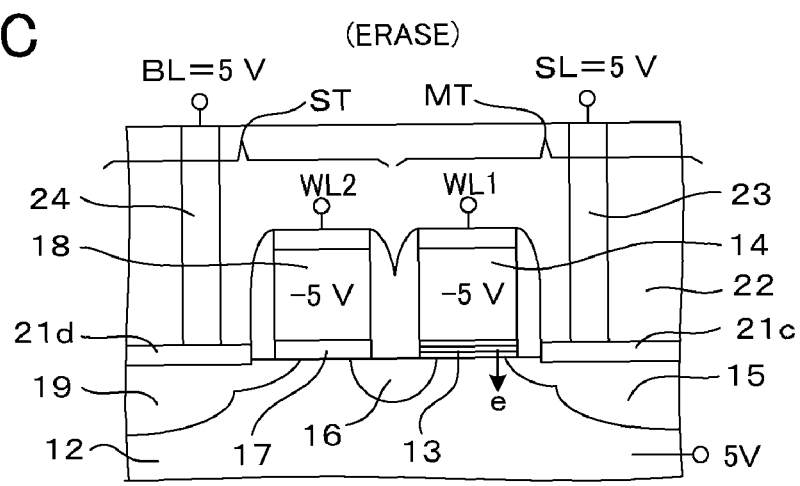

As illustrated in FIG. 3C, the data erasing operation for the memory cell MC applies a same voltage of −5 V through the first and second word lines WL1 and WL2 to the memory gate electrode 14 and to the selector gate electrode 18, and also applies a voltage of 5 V to the source line SL and to the bit line BL. In addition, the voltage at the N-well 12 is set to be 5 V.

Thus, the difference between the potentials at the N-well 12 and the memory gate electrode 14 produces the tunneling phenomena, and hence the electrons stored in the silicon nitride film 13b of the ONO film 13 of the memory transistor MT are drawn or moved back into the substrate, so that memory transistor MT is changed to be in an erased state. Thus, the threshold of the memory transistor MT is changed to have a negative value. Since the voltage of −5 V is applied to the first and second word lines WL1 and WL2, all of the memory cells MC's coupled to these word lines are caused to be in the erased state. The erase operation for individual cells will be described later.

Now, a process of producing, fabricating or manufacturing the memory cell array as described above is described below.

FIGS. 4A, 5A, 6A, 7A, 8A, 9A, 10A, 11A, 12A, 13A, 14A, 15A, and 16A, and FIG. 17 are cross-sectional views for illustrating example steps of producing a semiconductor device in accordance with the first embodiment of the present invention, and of a portion of the memory cell array area taken along a longitudinal direction of the word line. FIG. 4B, FIGS. 5B, 6B, 7B, 8B, 9B, 10B, 11B, 12B, 13B, 14B, 15B, and 16B, and FIG. 17 are further cross-sectional views for illustrating the example steps of producing the semiconductor device, and of a portion of the memory cell array area taken along a longitudinal direction of the bit line or the source line. FIGS. 4C, 5C, 6C, 7C, 8C, 9C, 10C, 11C, 12C, 13C, 14C, and 15C, and FIG. 18 are cross-sectional views for illustrating the example steps of producing the semiconductor device, and of a portion of the peripheral circuit area. FIGS. 19A to 19J are plan views for illustrating the example steps of producing the memory cell array of the semiconductor device in accordance with the first embodiment of the present invention.

Figure 4A:
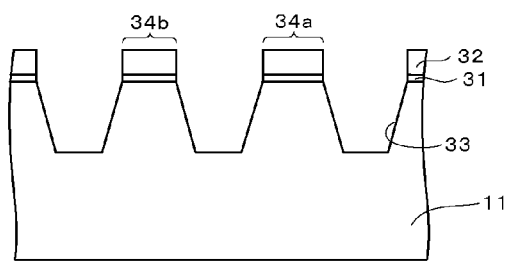
FIGS. 4A-4C are a first subset of cross-sectional views for illustrating example steps of forming an example semiconductor device in accordance with the first embodiment of the present invention.
Figure 4B:
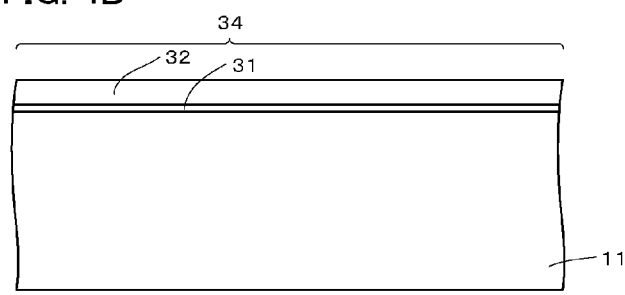
Figure 4C:
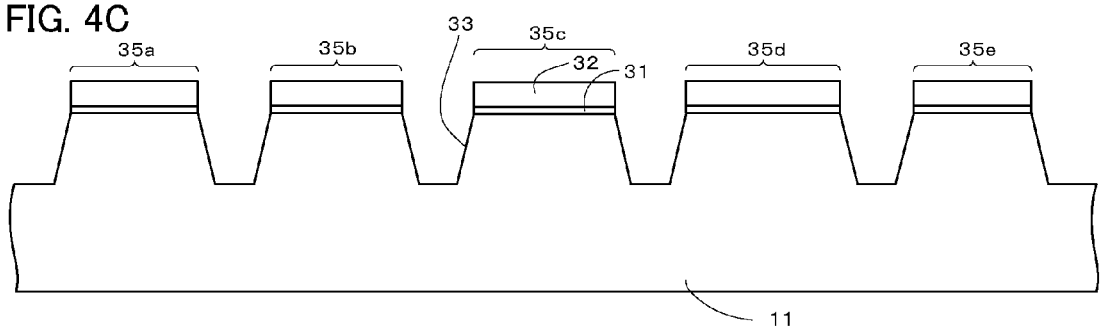

Next, the example steps of fabricating the structure as illustrated in FIGS. 4A to 4C are described below.

First, the silicon oxide film 31 with a thickness of 10 nm, for example, is formed over the silicon substrate 11 by means of the thermal oxidation technique or the chemical vapor deposition (CVD) technique. In addition, the silicon nitride film 32 with a thickness between 150 nm and 200 nm, for example, is formed over the formed silicon oxide film 31 by means of the CVD technique.

Subsequently, photoresist is applied onto the silicon nitride film 32, and then the applied photoresist is exposed and developed to thereby form a resist pattern (not illustrated) which has openings in regions for separating or isolating elements. The formed resist pattern is used as a mask to etch portions of the silicon nitride film 32 and the silicon oxide film 31 and portions of the silicon substrate 11 by means of the reactive ionic etching (RIE) technique, so that element separation trenches 33 are formed. The depth of the element separation trenches 33 in the silicon substrate 11 may be approximately 300 nm, for example.

The isolated regions of the silicon substrate 11 that are surrounded or sandwiched by the element separation tranches 33 include active regions.

In the memory cell array area of FIGS. 4A and 4B, for example, stripe-like active regions 34 are interposed adjacently between the stripe-like element separation trenches 33. The active regions 34 may include a memory transistor forming region 34a and a selector transistor forming region 34b.

In the peripheral circuit area of FIG. 4C, the active regions surrounded or sandwiched by the element separation trenches 33 may include a 5V NMOSFET region 35a, a 5V PMOSFET region 35b, a 5V low-threshold NMOSFET region 35c, a 1.8V NMOSFET region 35d, and a 1.8V PMOSFET region 35e, in order from left to right.

The resist pattern is removed, and then a silicon oxide film with a thickness of 3 nm may be formed in the element separation trenches 33 over their inside surfaces by means of the thermal oxidation technique.

Figure 5A:
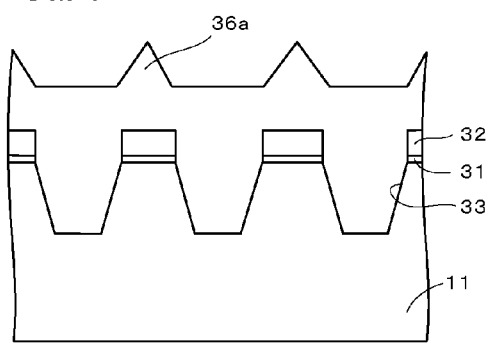
FIGS. 5A-5C are a second subset of the cross-sectional views for illustrating the example steps of forming the semiconductor device in accordance with the first embodiment of the present invention.
Figure 5B:
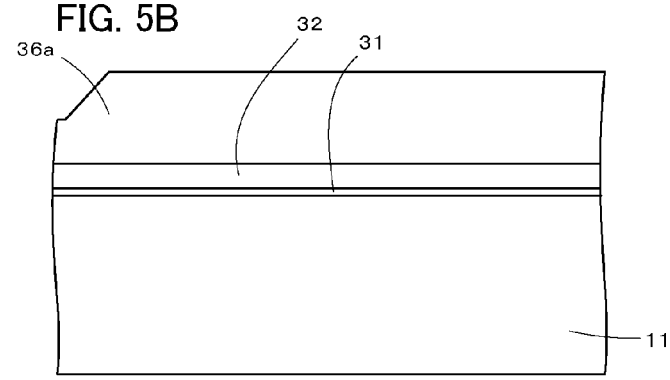
Figure 5C:
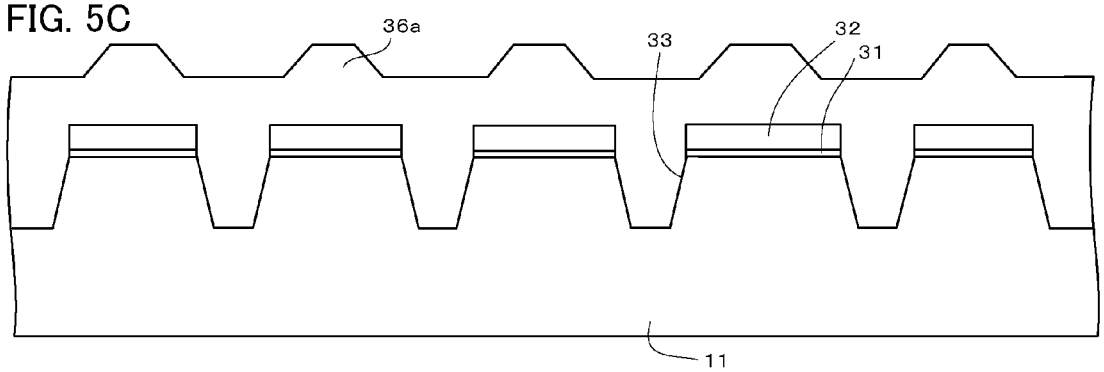

Next, as illustrated in FIGS. 5A to 5C, a silicon oxide film or layer 36a may be further deposited over the silicon nitride film 32 and in the element separation trenches 33 by means of the high-density plasma CVD technique. The silicon oxide film 36a may be deposited to have such a thickness that buries the entire inside spaces of the element separation trenches 33. The thickness may be 500 nm from an upper surface of the silicon nitride film 32, for example.

Figure 6A:
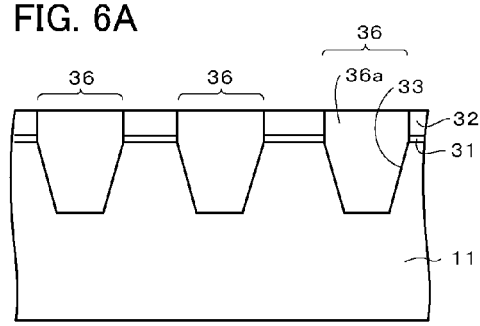
FIGS. 6A-6C are a third subset of the cross-sectional views for illustrating the example steps of forming the semiconductor device in accordance with the first embodiment of the present invention.
Figure 6B:
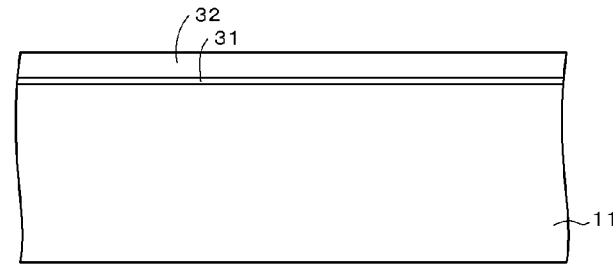
Figure 6C:
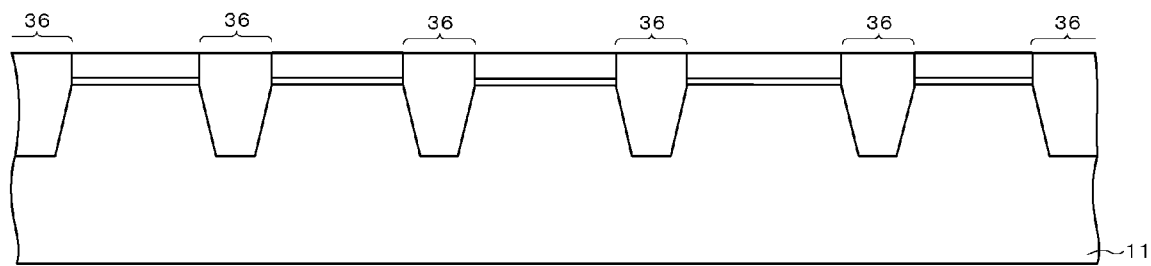

Next, as illustrated in FIGS. 6A to 6C, by means of the chemical mechanical polishing (CMP) technique, portions of the silicon oxide film 36a that lie over portions of the silicon nitride film 32 are removed and the remaining portions of the upper surface of the silicon oxide film 36a are planarized. In this case, the silicon nitride film 32 functions as a polish stopper film.

Thus, the portions of the silicon oxide film 36a which remain in the element separation trenches 33 are used for shallow trench isolation (STI) 36.

In the memory cell array area, as illustrated in a plan view of FIG. 19A, the regions of the STI 36, which are formed at the respective intervening positions between the stripe active regions 34, are formed to extend substantially in parallel to the bit lines BL and the source lines SL. The STI 36 are spaced apart from each other in a direction perpendicular to the word lines WL1 and WL2.

After that, the silicon oxide film 36a for the STI 36 is annealed for densification. After the annealing, the silicon nitride film 32 is removed by means of boiling phosphoric acid. Then, the silicon oxide film 31 formed first on the surface of the silicon substrate 11 is removed with the hydrofluoric acid.

Figure 7A:
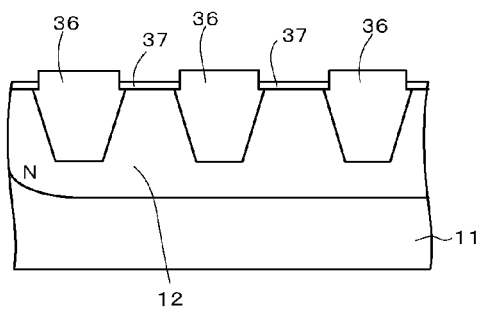
FIGS. 7A-7C are a fourth subset of the cross-sectional views for illustrating the example steps of forming the semiconductor device in accordance with the first embodiment of the present invention.
Figure 7B:
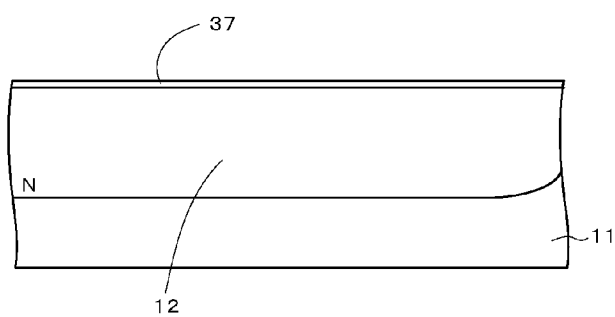
Figure 7C:
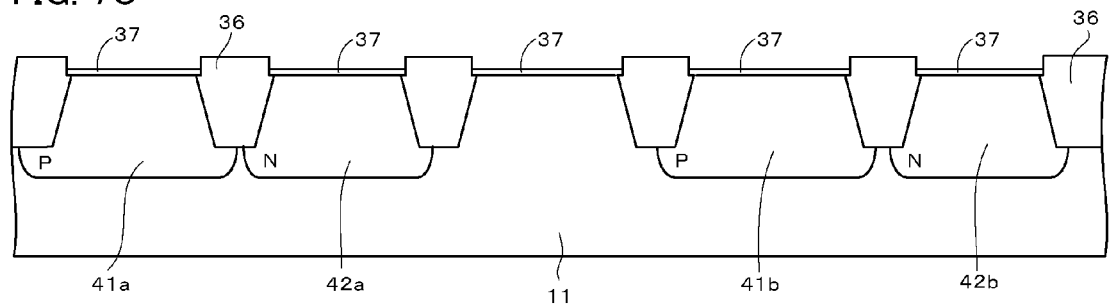

Next, as illustrated in FIGS. 7A to 7C, the upper surface of the silicon oxide 11 is thermally oxidized, so that sacrificial oxide films 37 with a thickness of 10 nm, for example, are formed on the surface.

Subsequently, n-type impurity ions, such as arsenic (As) ions or phosphor (P) ions, are implanted in the memory cell array area of the silicon substrate 11, so that the N-wells 12 are formed. The n-type impurity ions are implanted also in the 5V PMOSFET regions 35b and the 1.8V PMOSFET regions 35e (FIG. 4C) in the peripheral circuit area of the silicon substrate 11, so that the N-wells 42a and 42b are formed. The peripheral circuit area includes a logic circuit subarea.

Further, the p-type impurity ions, such as boron (B) ions, are implanted also in the 5V NMOSFET regions 35a and 1.8V NMOSFET regions 35d (FIG. 4C) in the peripheral circuit area of the silicon substrate 11, so that the P-wells 41a and 41b are formed.

The regions for implanting the n-type and p-type impurity ions are selected by coating non-ion-implanted regions with photoresist. Thus, the photoresist patterning, the ion implantation, and the photoresist removal are repeated for a number of times during the ion implantation process.

Figure 8A:
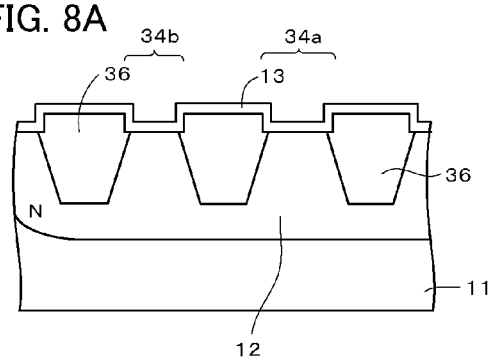
FIGS. 8A-8C are a fifth subset of the cross-sectional views for illustrating the example steps of forming the semiconductor device in accordance with the first embodiment of the present invention.
Figure 8B:
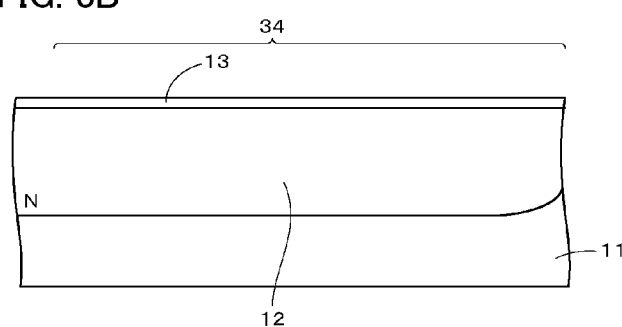
Figure 8C:
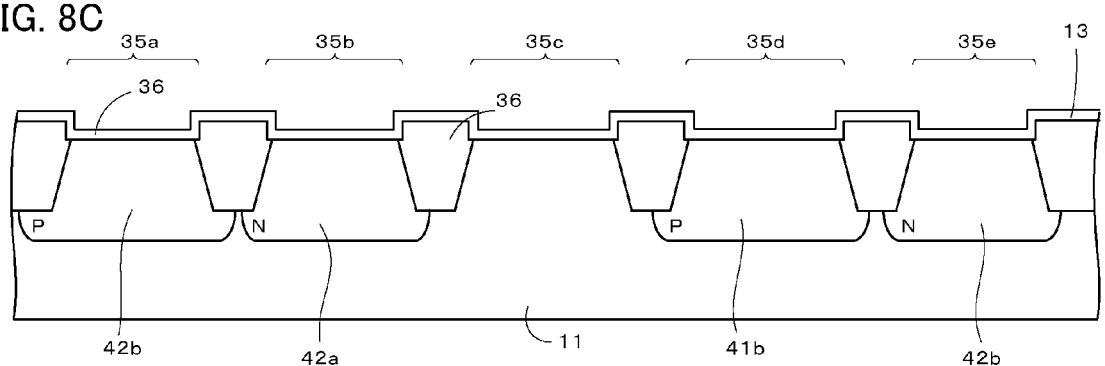

Next, the sacrificial oxide films 37 are removed by using the hydrofluoric acid, and then the ONO film 13 is formed over the silicon substrate 11, as illustrated in FIGS. 8A to 8C.

The ONO film 13 has a multi-layered structure as illustrated in FIG. 2. The ONO film 13 is formed by forming the lower silicon oxide film 13a with a thickness of 2.4 nm over the surface of the silicon substrate 11 by means of the thermal oxidation technique, and then by forming the silicon nitride film 13b over the lower silicon oxide film 13a by means of the CVD technique, and further by forming the upper silicon oxide film 13c over the silicon nitride film 13b, which is formed by thermally oxidizing an upper surface layer of the silicon nitride film 13b. Thus, the upper silicon nitride film 13c may have a thickness of 4 nm, and the remaining silicon nitride film 13b may have a thickness of 4 nm.

Figure 9A:
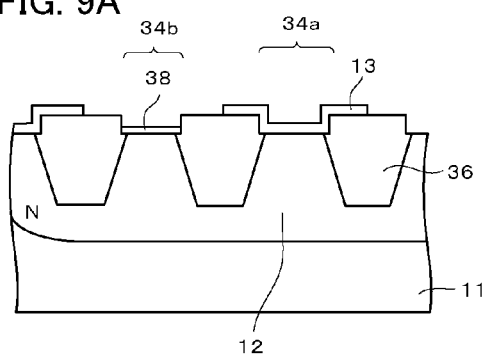
FIGS. 9A-9C are a sixth subset of the cross-sectional views for illustrating the example steps of forming the semiconductor device in accordance with the first embodiment of the present invention.
Figure 9B:
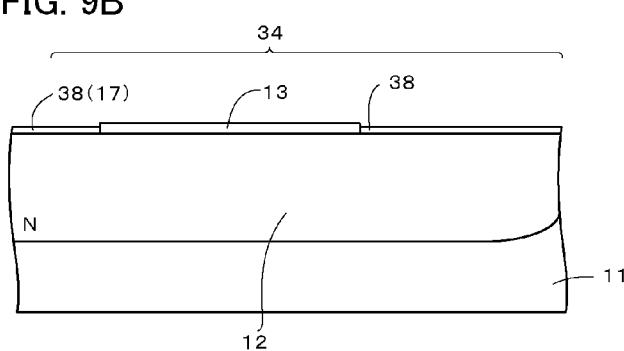
Figure 9C:
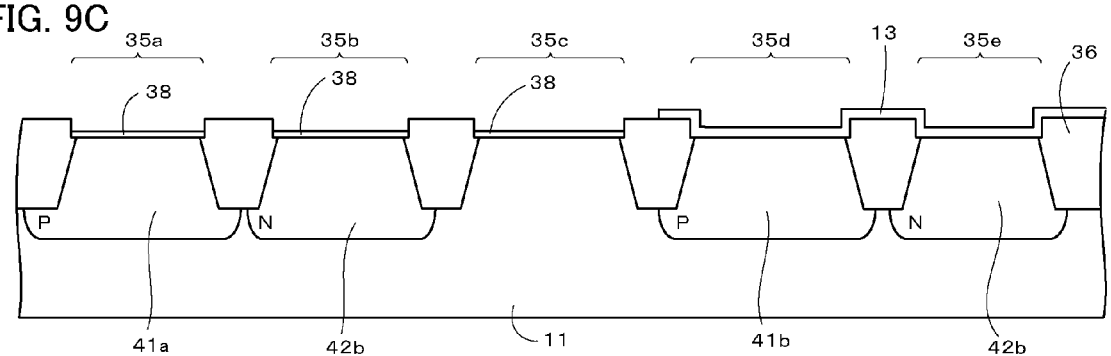

Next, the example steps of fabricating the structure of FIG. 9A to 9C are described below.

First, the memory transistor forming regions 34a in the memory cell array area, and the 1.8V NMOSFET regions 35d and the 1.8V PMOSFET regions 35e in the peripheral circuit area are coated with a resist pattern (not illustrated), and then the non-coated portions of the ONO film 13 are etched. The ONO film 13 may be etched by means of the reactive ion etching (RIE) technique and the wet etching technique with the hydrofluoric acid, for example.

The etching step thus exposes or uncovers the selector transistor forming regions 34b in the memory cell array area, and the 5V NMOSFET regions 35a, the 5V PMOSFET regions 35b, and the 5V low-threshold NMOSFET regions 35c in the peripheral circuit area, on the surface of the silicon substrate 11.

After that, by means of the thermal oxidation technique, a silicon oxide film with a thickness of 9 nm, for example, is deposited or grown as a first gate insulating film 38 on the surface portions in the regions of the silicon substrate 11 that are not covered with the ONO film 13.

Accordingly, the structure of FIGS. 9A to 9C is formed.

Further, the regions in the peripheral circuit area other than the 1.8V NMOSFET regions 35d and the 1.8V PMOSFET regions 35e are coated with a resist pattern (not illustrated), and then the non-coated portions of the ONO film 13 in these regions are etched. After the etching, the resist pattern is removed.

Figure 10A:
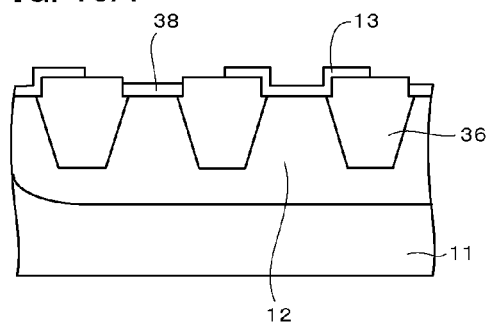
FIGS. 10A-10C are a seventh subset of the cross-sectional views for illustrating the example steps of forming the semiconductor device in accordance with the first embodiment of the present invention.
Figure 10B:
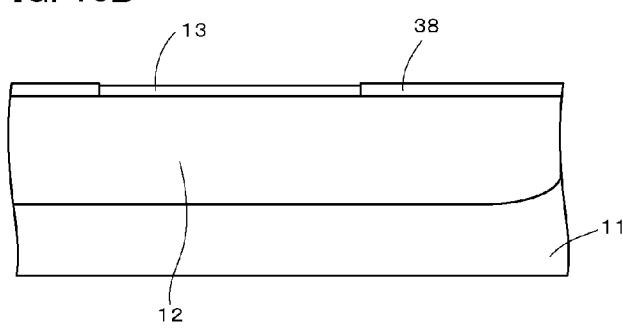
Figure 10C:
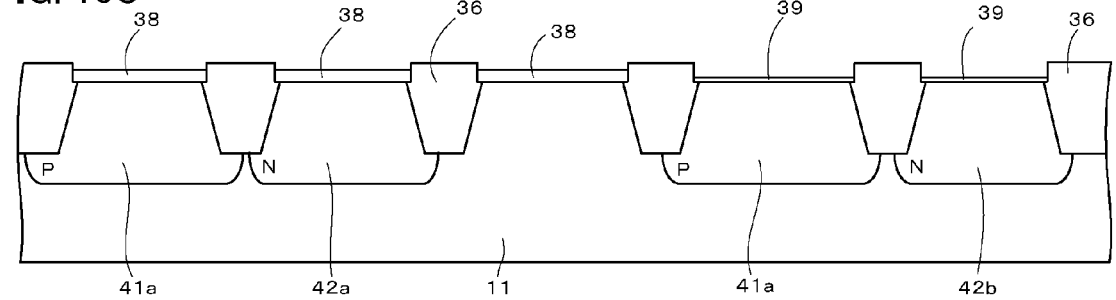

Next, as illustrated in FIGS. 10A to 10C, by means of the thermal oxidation technique, the first gate insulating film 38 is made thicker to have a thickness of 12 nm, and a silicon oxide film is deposited or grown as the second gate insulating film 39 to have a thickness of 3 nm over the surfaces of the 1.8V NMOSFET regions 35d and the 1.8V PMOSFET regions 35e.

The first gate electrode 38 in the selector transistor forming region 34b is used as the gate insulating film 17 as illustrated in FIG. 2.

Thus, the first gate insulating film 38 of the thickness of 12 nm is formed in the selector transistor forming region 34b. The first gate insulating film 38 of the thickness of 12 nm is also formed in the 5V NMOSFET region 35a, the 5V PMOSFET region 35b, and the 5V low-threshold NMOSFET region 35c.

Accordingly, as illustrated in FIG. 19B, in the memory cell array area, the ONO film 13 is separated into pieces separated on the underlying STI 36, and has a pattern to expose the selector transistor forming regions 34b, and to cover the memory transistor forming regions 34a.

Figure 11A:
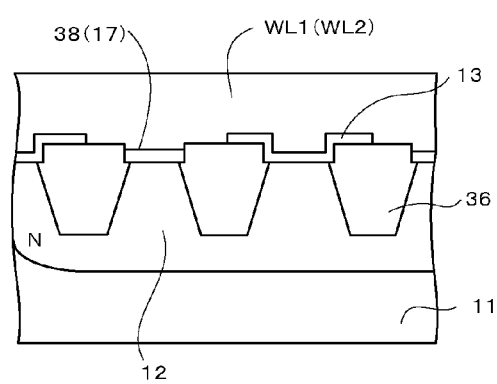
FIGS. 11A-11C are an eighth subset of the cross-sectional views for illustrating the example steps of forming the semiconductor device in accordance with the first embodiment of the present invention.
Figure 11B:
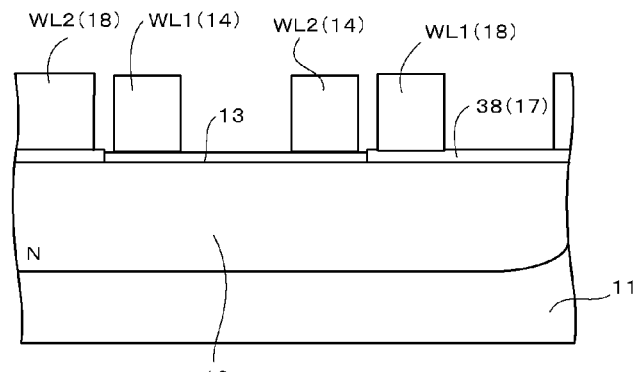
Figure 11C:
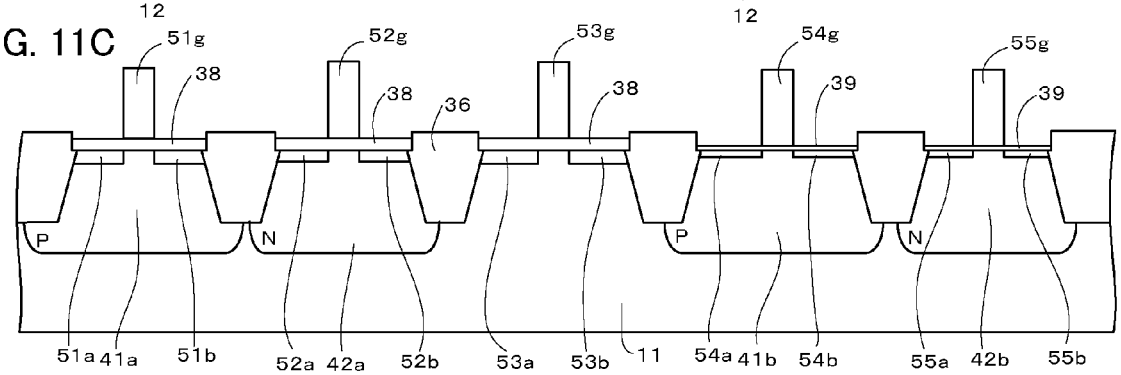

Next, the example steps of fabricating the structure of FIGS. 11A to 11C are described below.

First, by means of the CVD technique, a poly-silicon film with a thickness of 180 nm film is formed over the ONO film 13 and the first and second gate insulating films 38 and 39. The poly-silicon film may be formed by first forming an amorphous silicon film and then thermally processing the amorphous silicon film.

Further, a resist pattern (not illustrated) is formed over the poly-silicon film so as to coat the word line forming regions, the gate electrode forming regions and other wiring forming regions. The non-covered portions of the poly-silicon film are then etched by means of the RIE technique. The RIE technique may use chlorine-based gas as etching gas.

Figure 19C:
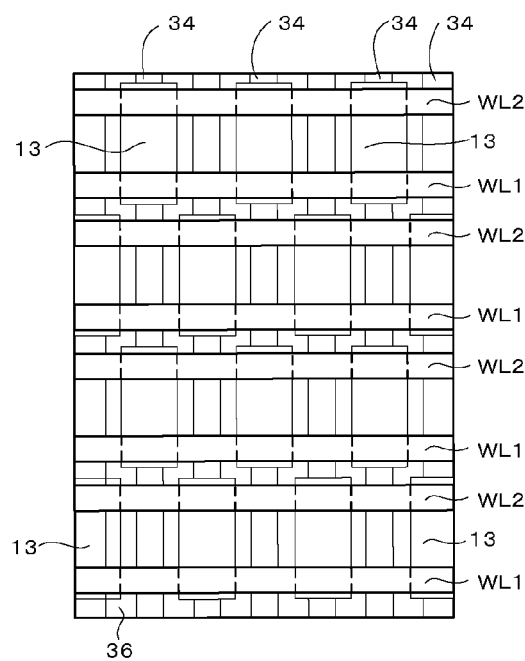
FIGS. 19C and 19D are a second subset of the plan views for illustrating the example steps of forming the semiconductor device in accordance with the first embodiment of the present invention.

Thus, as illustrated in FIGS. 11A and 11B, and FIG. 19C, in the memory cell array area, the poly-silicon film is processed to form stripes extending in a row direction, which are used as the word lines WL1 and WL2.

In the memory transistor forming regions of the memory cell array area, as illustrated in FIG. 19C, the word lines WL1 and WL2 overlap the portions of the ONO film 13. Portions of the word lines WL1 and WL2 are used as the selector gate electrodes 14 and the memory gate electrodes 18 as illustrated in FIG. 2. A distance between the selector gate electrode 14 and the memory gate electrode 18 in each memory cell may be approximately 0.18 μm, for example.

On the other hand, in the peripheral circuit area, as illustrated in FIG. 11C, gate electrodes 51g, 52g, 53g, 54g and 55g and additional wirings, which are formed of the stripe-like poly-silicon film, are formed in the 5V NMOSFET regions 35a, the 5V PMOSFET regions 35b, the 5V low-threshold NMOSFET regions 35c, the 1.8V NMOSFET regions 35d, and the 1.8V PMOSFET regions 35e, respectively.

Subsequently, the gate electrodes 51g, 53g, and 54g in the peripheral circuit area are used as a mask to implant the n-type impurity ions in the P-wells 41a and 41b and the 5V low-threshold NMOSFET region 35c in the peripheral circuit area, so that the n-type extension regions 51a, 51b, 53a, 53b, 54a, and 54b are formed. In addition, the gate electrodes 52g and 55g are used as a mask to implant the p-type impurity ions in the N-wells 42a and 42b, so that the p-type extension regions 52a, 52b, 55a, and 55b in the source/drain regions are formed.

In the p-type impurity or n-type impurity ion implantation, the non-ion-implanted regions are coated with photoresist.

Figure 12A:
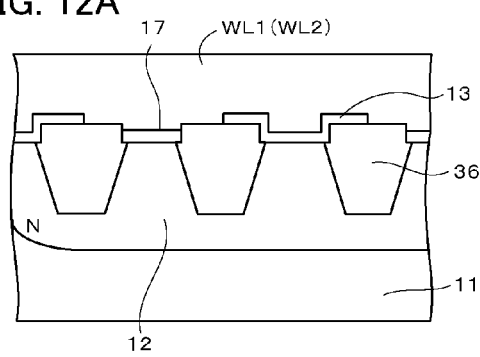
FIGS. 12A-12C are a ninth subset of the cross-sectional views for illustrating the example steps of forming the semiconductor device in accordance with the first embodiment of the present invention.
Figure 12B:
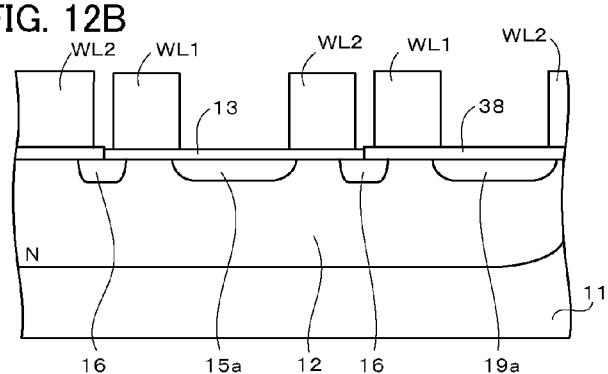
Figure 12C:
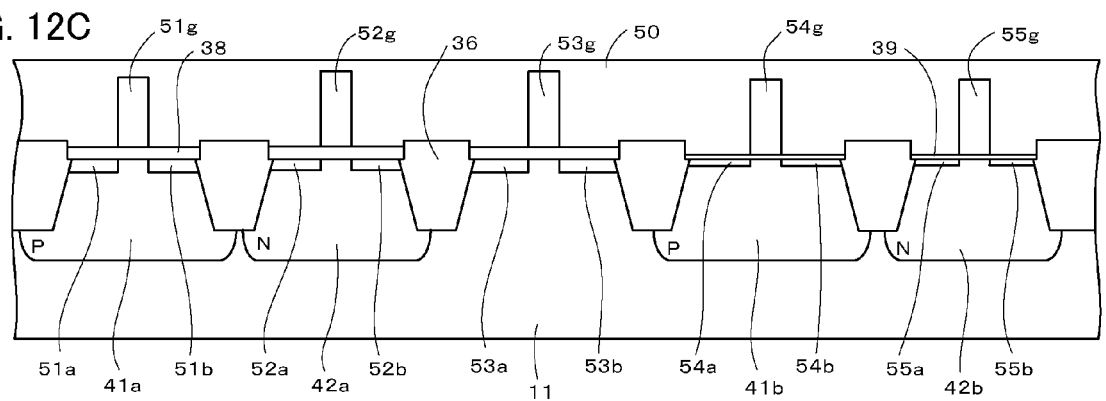

Next, as illustrated in FIGS. 12A to 12C, the peripheral circuit area is coated with photoresist 50, and the memory cell array area is exposed or made uncoated.

Further, the word lines WL1 and WL2 are used as a mask to remove portions of the upper silicon oxide film 13c and the silicon nitride film 13b of the ONO film 13 in the regions that are not covered with the word lines WL1 and WL2, by means of the reactive ion etching (RIE) technique. In this case, corresponding portions of the lower silicon oxide film 13a of the ONO film 13 remains. Meanwhile, portions of the gate insulating film 17 that are not coated with the word lines WL1 and WL2 are etched to become thinner.

Figure 19D:
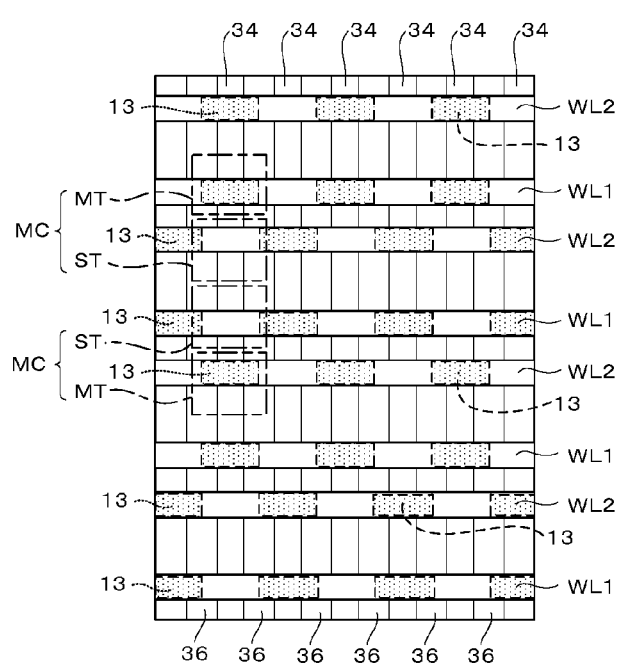

In the memory cell array area, as illustrated in FIG. 19D, portions of the ONO films 13 that are under the word lines WL1 and WL2, i.e. the memory gate electrodes 14, remain unetched as they are.

After that, the word lines WL1 and WL2 are used as a mask to implant the p-type impurity ions in the memory cell array area. In this case, the ion implantation conditions may be that boron fluoride ions are implanted at a dose of $3\times10^{14}/cm^2$ with ion implant energy of 30 keV.

Thus, the p-type extension regions 15a and 19a and the p-type source/drain regions 16 are formed in the N-well 12 and below and adjacently to the word lines WL1 and WL2 and on the lateral opposite sides of the word lines WL1 and WL2, as illustrated in FIG. 2. The p-type source/drain region 16 is formed in a region between the memory gate electrode 14 and the selector gate electrode 18 in each of the memory cell regions. After that, the photoresist 50 is removed.

Figure 13A:
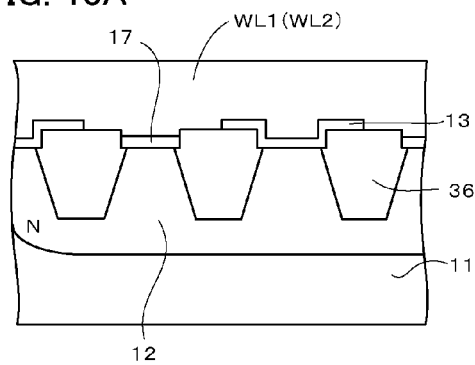
FIGS. 13A-13C are a tenth subset of the cross-sectional views for illustrating the example steps of forming the semiconductor device in accordance with the first embodiment of the present invention.
Figure 13B:
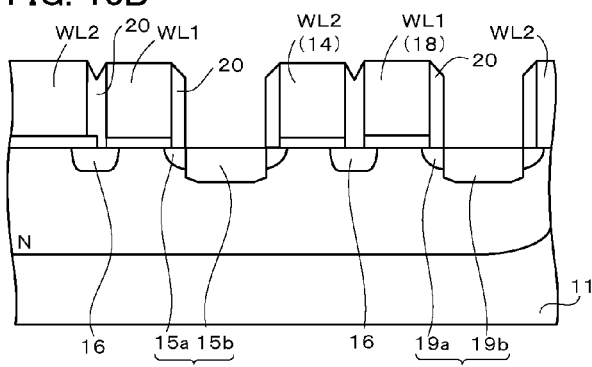
Figure 13C:
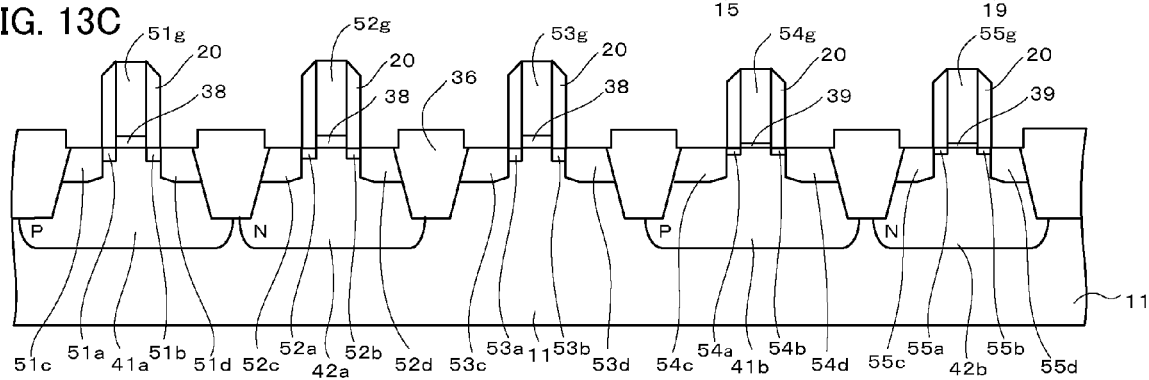

Next, the example steps of fabricating the structure of FIGS. 13A to 13C are described below.

A silicon oxide film with a thickness of about 100 nm is formed over the word lines WL1 and WL2, the gate electrodes 51g, 52g, 53g, 54g, and 55g, and the silicon substrate 11, by means of the CVD technique. Subsequently, the silicon oxide film is etched back to thereby expose or uncover portions of the silicon substrate 11, and partially remains as sidewalls 20 on the lateral sides of each of the word lines WL1 and WL2 and the gate electrodes 51g, 52g, 53g, 54g, and 55g.

The side wall 20 remains thus embedded or buried in the space between the selector gate electrode 18 and the memory gate electrode 14.

Subsequently, in the memory cell array area, the word lines WL1 and WL2, and the side walls 20 are used as a mask to implant boron fluoride ions as p-type impurity ions in the N-well 12. Simultaneously, in the peripheral circuit area, the gate electrodes 52g and 55g and the side walls 20 are used as a mask to implant the boron fluoride ions as the p-type impurity ions also in the N-wells 42a and 42b.

In this case, the side wall 20 blocks the ions from being implanted in the region between the selector transistor ST and the memory transistor MT, and hence a p-type high-concentration impurity diffusion region cannot be formed in the p-type source/drain region 16.

Thus, in the active region 34 of the memory cell array area that extend to cross the word lines WL1 and WL2, a p-type high-concentration impurity diffusion region 19b is formed in the p-type drain region 19 to be shared by the adjacent selector transistors ST, and a p-type high-concentration impurity diffusion region 15b is formed in the p-type source region 15 to be shared by the adjacent memory transistors MT.

Further, in the N-wells 42a and 42b of the peripheral circuit area, p-type high-concentration impurity diffusion regions 52c, 52d, 55c, and 55d are formed as source/drain regions adjacently to the gate electrodes 52g and 55g and on the lateral opposite sides of the gate electrodes 52g and 55g.

After that, in the peripheral circuit area, the gate electrodes 51g, 53g, and 54g, and the side walls 20 are used as a mask to implant arsenic ions as the n-type impurity ions in the P-wells 41a and 41b, so that n-type high-concentration impurity diffusion regions 51c, 51d, 53c and 53d are formed as source/drain regions.

In implanting the n-type impurity and p-type impurity ions as described above, the non-ion-implanted regions are coated with photoresist.

The impurity ions implanted as described above are activated by annealing.

Figure 14A:
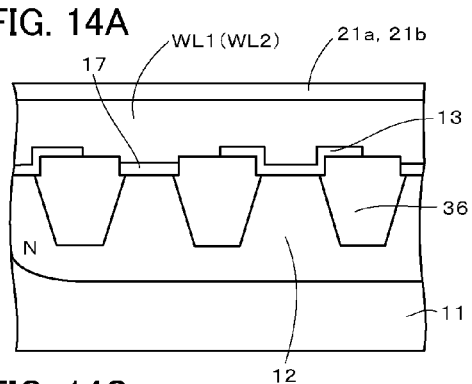
FIGS. 14A-14C are an eleventh subset of the cross-sectional views for illustrating the example steps of forming the semiconductor device in accordance with the first embodiment of the present invention.
Figure 14B:
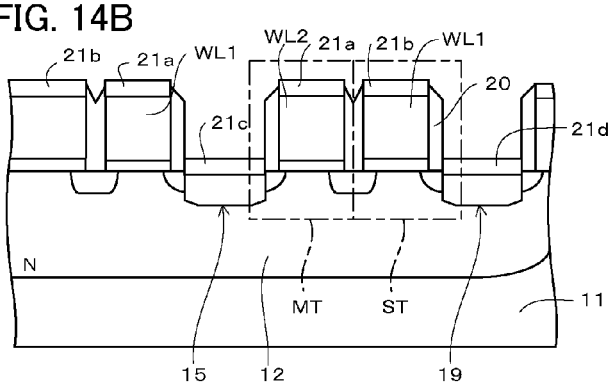
Figure 14C:
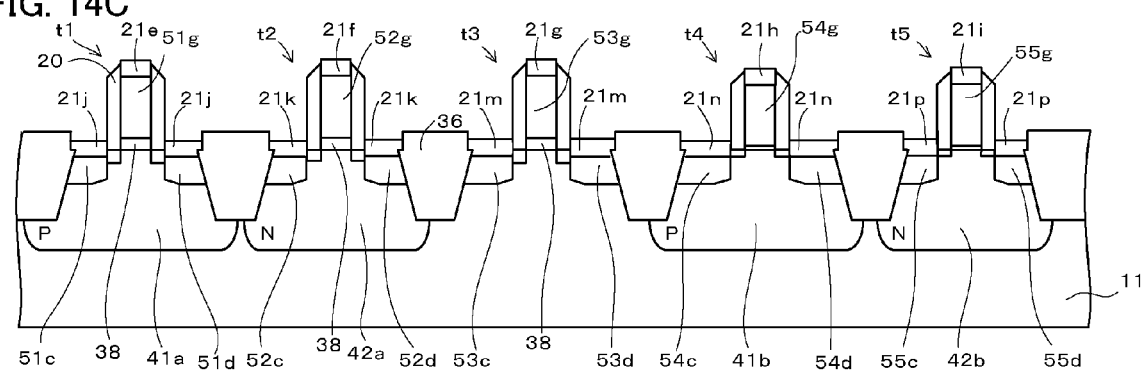

Next, the example steps of fabricating the structure of FIGS. 14A to 14C are described below.

First, a film such as cobalt (Co) film is deposited on the entire upper surface of the structure of FIGS. 13A to 13C by means of the sputtering technique. Subsequently, by manes of thermal process at a temperature between 400° C. and 900° C., the cobalt film is reacted with the poly-silicon films of the word lines WL1 and WL2 and the gate electrodes 51g, 52g, 53g, 54g, and 55g, to thereby form silicide. Thus, silicide layers 21a, 21b, 21e, 21f, 21g, 21h, and 21i are formed on the upper surfaces of the word lines WL1 and WL2, and the gate electrodes 51g, 52g, 53g, 54g, and 55g, respectively.

Simultaneously, the cobalt film is reacted with the silicon substrate 1, so that silicide layers 21c, 21d, 21j, 21k, 21m, 21n, and 21p are formed. After that, the unreacted cobalt film is removed with the hydrofluoric acid or the like.

Accordingly, a bulk semiconductor process is completed. Thus, the memory cells MC's are formed in each of the stripe active regions 34 of the memory cell array area, so that the selector transistor ST and the memory transistor MT alternate their relative positions and orientations in the memory cells MC's in each stripe active region 34. On the other hand, in the peripheral circuit area, NMOSFET's $t_1$, $t_4$, and $t_3$ are formed in the positions of the P-wells 41a, 41b, and the like, and PMOSFET's $t_2$ and $t_5$ are formed in the positions of the N-wells 42a and 42b.

Next, as illustrated in FIGS. 15A to 15C, a silicon nitride film 56 with a thickness of 20 nm is formed as an etching stopper film over the silicide layers 21a-21k, 21m, 21n and 21p, STI 36, and the like, by means of the CVD technique. Further, a BPSG (Boron Phosphorous Silica Glass) film with a thickness of 1600 nm is formed as a first interlayer insulating film 57 over the silicon nitride film 56 by means of the CVD technique, and is subsequently planarized by means of thermal processing.

Figure 16A:
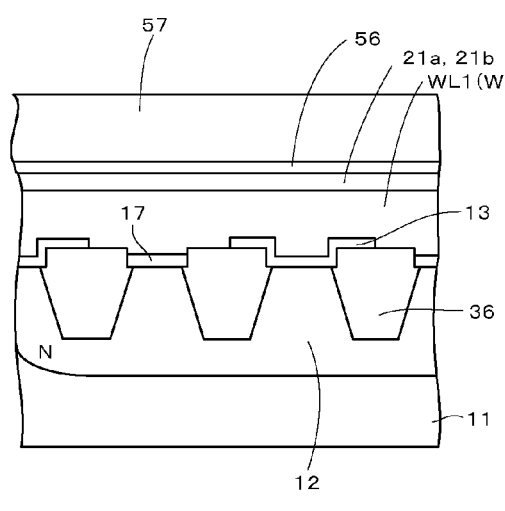
FIGS. 16A and 16B illustrate a thirteenth subset of the cross-sectional views for illustrating the example steps of forming the semiconductor device in accordance with the first embodiment of the present invention.
Figure 16B:
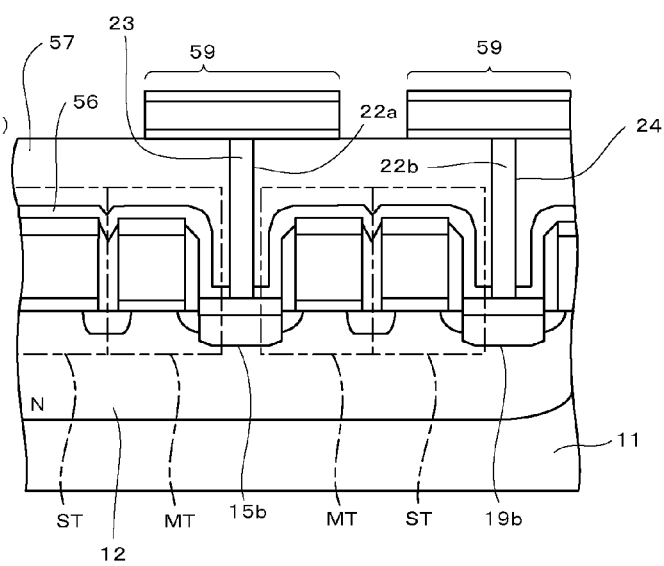

Next, as illustrated in FIGS. 16A and 16B, the first interlayer insulating film 57 and the silicon nitride film 56 are patterned by means of the photolithography technique for etching, so that contact holes 22a and 22b are formed to reach upper surface portions of the respective p-type high-concentration impurity diffusion regions 15b and 19b. The first interlayer insulating film 57 and the silicon nitride film 56 correspond to the interlayer insulating film 22 as illustrated in FIG. 2.

Subsequently, a titan (Ti) film with a thickness of 30 nm, a titan nitride (TiN) film with a thickness of 20 nm, and a tungsten (W) film with a thickness of 300 nm are formed or deposited in this order, within the contact holes 22a and 22b and over an upper surface of the first interlayer insulating film 57. After that, by means of the CMP technique, portions of these films which overlie the first interlayer insulating film 57 are removed, and also the upper surface of the first interlayer insulating film 57 is planarized.

Figure 19E:
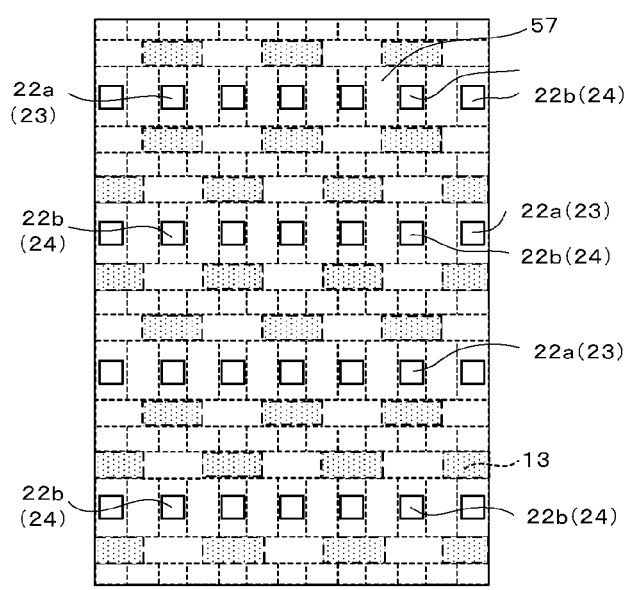
FIGS. 19E and 19F are a third subset of the plan views for illustrating the example steps of forming the semiconductor device in accordance with the first embodiment of the present invention.

Thus, the portions of the W film, the TiN film, and the Ti film that remain within the contact holes 22 and 22b are used as the conductive contact plugs 23 and 24. The conductive contact plugs 23 and 24 formed in the memory cell array area are coupled to the respective p-type high-concentration impurity diffusion regions 15b and 19b within the active regions 34, as illustrated in FIG. 19E.

Subsequently, a first conductive film, which is formed of a titan (Ti) film with a thickness of 60 nm, a titan nitride (TiN) film with a thickness of 30 nm, an aluminum (Al) film with a thickness of 360 nm, a Ti film with a thickness of 5 nm, and a TiN film with a thickness of 70 nm, in this order, is formed over the first interlayer insulating film 57 and the conductive contact plugs 23 and 24, by means of the sputtering technique.

Figure 19F:
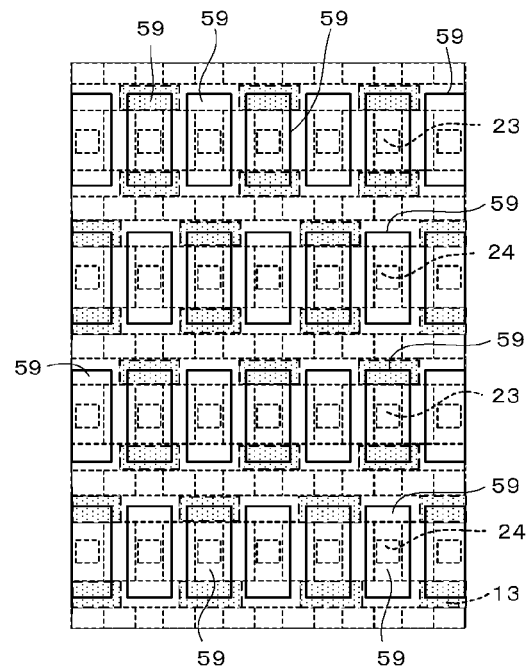

Further, the first conductive film is patterned by means of the photolithography technique for etching, so that conductive pads 59 are formed to be coupled separately to the conductive contact plugs 23 and 24. Thus, as illustrated in FIG. 19F, the conductive pads 59 are formed above the p-type high-concentration impurity diffusion regions 15b and 19b and their peripheral regions, and are arranged in a matrix or in row and column directions.

Next, the example steps of fabricating the structure of FIG. 17 are described below.

First, by means of the high-density plasma CVD technique, a lower silicon oxide film 60a with a thickness of 720 nm is formed to cover the conductive pads 59. Subsequently, by means of the CVD technique using TEOS (tetraethoxysilane) as reactive gas, an upper silicon oxide film 60b with a thickness of 1100 nm is formed over the lower silicon oxide film 60a. The two successively formed silicon oxide films 60a and 60b are referred to as a second interlayer insulating film 61. Further, an upper surface of the second interlayer insulating film 61 is polished by means of the CMP technique so as to be planarized.

Figure 19G:
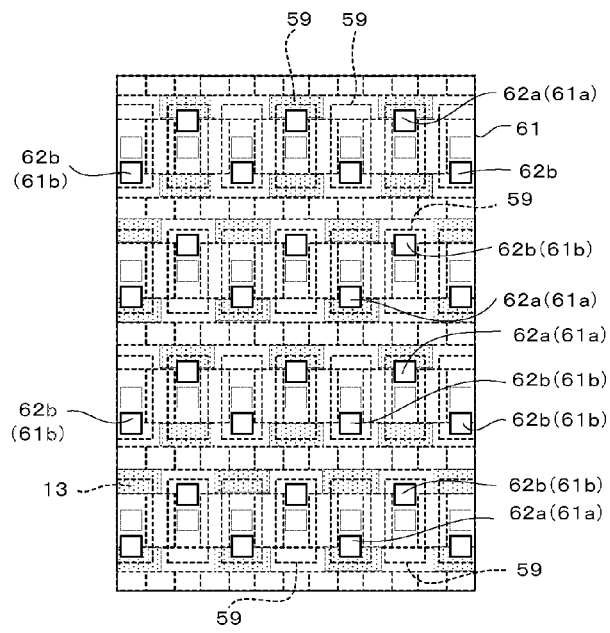
FIGS. 19G and 19H are a fourth subset of the plan views for illustrating the example steps of forming the semiconductor device in accordance with the first embodiment of the present invention.

Next, the second interlayer insulating film 61 is patterned by means of the photolithography technique for etching, so that first and second via holes 61a and 61b are formed to reach upper surface portions of the conductive pads 59. As illustrated in FIG. 19G, each of the first via holes 61a is formed in association with each of the p-type source regions 15, and each of the second via holes 61b is formed in association with each of the p-type drain regions 19.

The first via hole 61a is disposed to reach an upper surface portion of the corresponding conductive pad 59 at a position closer to its one end, so that the first via hole 61a is coupled to the p-type source region 15. The second via hole 61b is disposed to reach an upper surface portion of the different, corresponding conductive pad 59 at a position closer to its one end, so that the second via hole 61b is coupled to the p-type drain region 19. The first via holes 61a and the second via holes 61b are located at corresponding alternate positions or different staggered positions along the lengths of the word lines WL1 and WL2. The first via holes 61a are disposed along the same active regions 34, and the second via holes 61b are disposed along the other, same active regions 34.

Next, a TiN film with a thickness of 10 nm, a TiN film with a thickness of 7 nm, and a W film with a thickness of 300 nm are formed in this order within the first and second via holes 61a and 61b and over the second interlayer insulating film 61.

Subsequently, by means of the CMP technique, portions of the W film, the TiN film and the Ti film which overlie the second interlayer insulating film 61 are polished and removed. Thus, remaining portions of the W film, the TiN film, and the Ti film within the first and second via holes 61a and 61b are used as first and second vias 62a and 62b, respectively.

Next, a second conductive film, which is formed of a Ti film with a thickness of 60 nm, a TiN film with a thickness of 30 nm, an Al film with a thickness of 360 nm, a Ti film with a thickness of 5 nm, and a TiN film with a thickness of 70 nm, in this order, is formed over the second interlayer insulating film 61 and the first and second vias 62a and 62b, by means of the sputtering technique, for example.

Figure 19H:
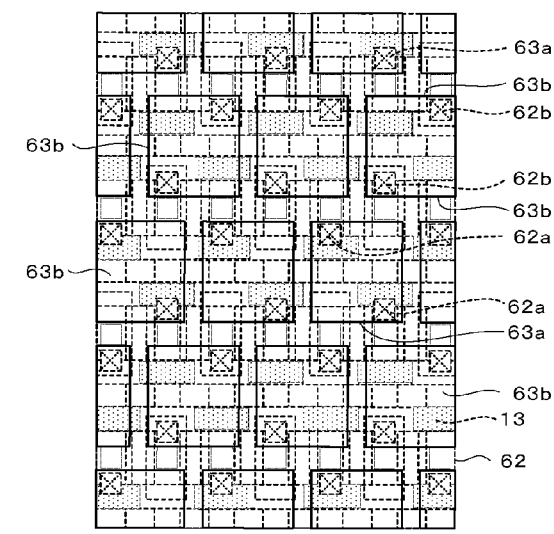

Further, the second conductive film is patterned by means of the photolithography technique for etching, so that substantially rectangular branch source lines 63a and substantially rectangular branch bit lines 63b are formed, as illustrated in FIG. 19H. The branch source line 63a corresponds to the branch source line SLd of FIG. 1, and the branch bit line 63b corresponds to the branch bit line BLd of FIG. 1.

The branch source lines 63a and the branch bit lines 63b are arranged in a staggered or zigzag pattern and in alternate rows, in a direction perpendicular to the word lines WL1 and WL2.

The branch source line 63a couples the two, first vias 62a arranged in opposing corners or adjacently in a direction oblique to the word lines WL1 and WL2, so that the branch source line 63a is electrically coupled to the p-type source region 15 of the memory transistor MT through the first via 62a and the like.

On the other hand, the branch bit line 63b couples the two, second vias 62b arranged in different opposing corners or adjacently in another direction symmetrically oblique to the word lines WL1 and WL2, so that the branch bit line 63b is electrically coupled to the p-type drain region 19 of the selector transistor ST through the second via 62b and the like.

Next, by means of the high-density plasma CVD technique, a lower silicon oxide film 64a with a thickness of 720 nm is formed to cover the branch source lines 63a and the branch bit lines 63b. Subsequently, by means of the CVD technique using TEOS as reactive gas, an upper silicon oxide film 64b with a thickness of 1100 nm is formed over the lower silicon oxide film 64a. The two successively formed silicon oxide films 64a and 64b are referred to as a third interlayer insulating film 64. Further, an upper surface of the third interlayer insulating film 64 is polished by means of the CMP technique so as to be planarized.

Figure 19I:
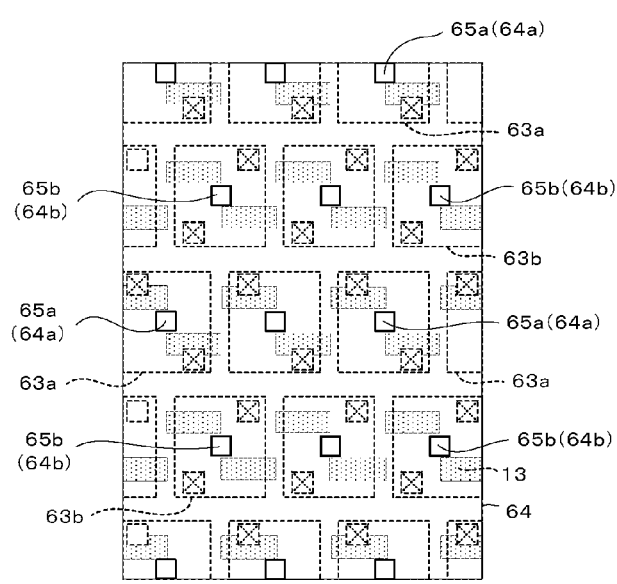
FIGS. 19I and 19J are a fifth subset of the plan views for illustrating the example steps of forming the semiconductor device in accordance with the first embodiment of the present invention.

Next, the third interlayer insulating film 64 is patterned by means of the photolithography technique for etching, so that a third via hole 64a and a fourth via hole 64b are formed to reach respective upper-surface center portions of the branch source line 63a and the branch bit line 63b, as illustrated in FIG. 19I.

Subsequently, a Ti film with a thickness of 10 nm, a TiN film with a thickness of 7 nm, and a W film with a thickness of 300 nm are formed or deposited in this order, within the third and fourth via holes 64a and 64b and over the third interlayer insulating film 64.

Subsequently, portions of the W film, the TiN film, and the Ti film that overlie an upper surface of the third interlayer insulating film 64 are polished and removed, by means of the CMP technique. Thus, remaining portions of the W film, the TiN film, and the Ti film within the third via hole 64a and a fourth via hole 64b are used as a third via 65a and a fourth via 65b, respectively.

Next, a third conductive film, which is formed of a Ti film with a thickness of 60 nm, a TiN film with a thickness of 30 nm, an Al film with a thickness of 360 nm, a Ti film with a thickness of 5 nm, and a TiN film with a thickness of 70 nm, in this order, is formed over the third interlayer insulating film 64 and the third and fourth vias 65a and 65b, by means of the sputtering technique, for example.

Figure 19J:
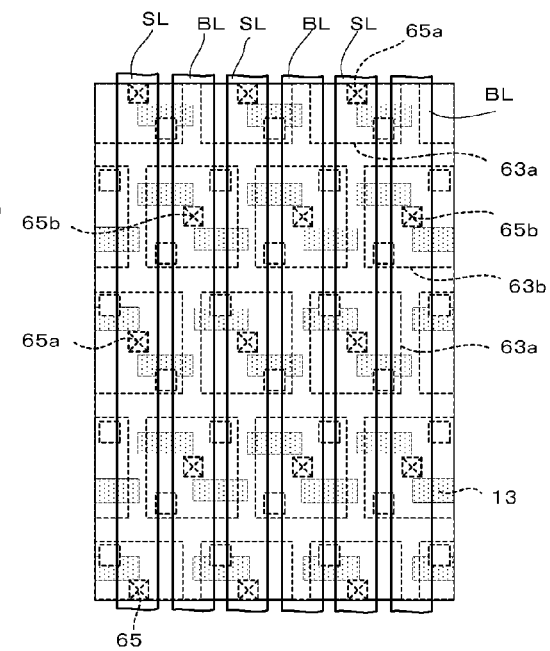

Further, the third conductive film is patterned by means of the photolithography technique for etching, so that source lines SL and bit lines BL are formed in alternate columns to extend in a direction perpendicular to the word lines WL1 and WL2, as illustrated in FIG. 19J.

Each of the source lines SL is electrically coupled to the branch source lines 63a through the third vias 65a formed in a direction perpendicular to the word lines WL1 and WL2. Each of the bit lines BL is electrically coupled to the branch bit lines 63b through the fourth vias 65b formed in a direction perpendicular to the word lines WL1 and WL2.

Thus, the memory cells MC's formed in the memory cell array area have electrical couples as illustrated in FIG. 1.

After that, a fourth interlayer insulating film 66 and a fifth interlayer insulating film 67 are formed to cover the source lines SL and the bit lines BL, as illustrated in FIG. 17. The fourth interlayer insulating film 66 and the fifth interlayer insulating film 67 are formed in a manner substantially similar to that in which the third interlayer insulating film 64 is formed. After that, a silicon oxide film 68 is formed over the fifth interlayer insulating film 67 by the high-density plasma CVD technique. Finally, a silicon nitride film with a thickness of 1000 nm is formed as an uppermost film 69 to cover the silicon oxide film 68 by means of the plasma CVD technique.

As described above, in the memory cell array area, the metal wiring patterns in the three layers are formed. The three layers of the metal wiring patterns are composed of the conductive pads 59 over the first interlayer insulating films 57, the branch source lines 63a and the branch bit lines 63b over the second interlayer insulating film 61, and the source lines SL and the bit lines BL over the third interlayer insulating film 64. In the peripheral circuit area, however, such metal wiring patterns in more than three layers, for example, five layers, may be formed.

Figure 18:
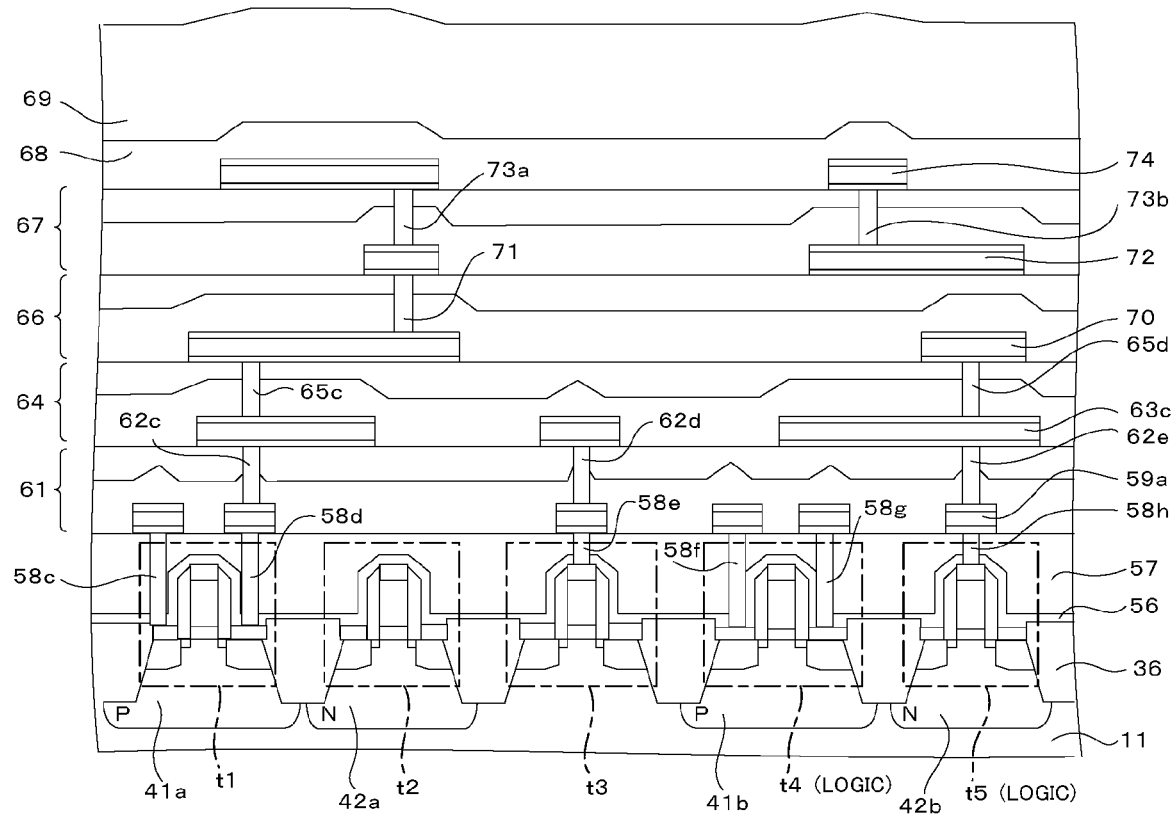
FIG. 18 is a cross sectional view of an example peripheral circuit area of the semiconductor device in accordance with the first embodiment of the present invention.

Next, referring to FIG. 18, example steps of forming the wirings in the peripheral circuit area are described briefly below.

During the steps of forming the conductive contact plugs 23 and 24 in the memory cell array area, simultaneously in the peripheral circuit area, conductive contact plugs 58c-58h are formed to be coupled to respective portions of the NMOS-FETs $t_1$, $t_3$ and $t_4$, and the PMOSFETs $t_2$ and $t_5$.

While the conductive pads 59 are formed in the memory cell array area, simultaneously in the peripheral circuit area, first metal wirings 59a are formed over the first interlayer insulating film 57 and to be coupled to the conductive contact plugs 58c-58h.

In the second interlayer film 61 covering the first metal wirings 59a, the fifth vias 62c, 62d and 62e are formed to be coupled to portions of the first metal wirings 59a simultaneously while the first vias 62a and 62b are formed in the memory cell array area.

After that, while the branch source lines 63a and the branch bit lines 63b are formed in the memory cell array area, simultaneously in the peripheral circuit area, second metal wirings 63c to be coupled to the fifth vias 62c, 62d and 62e are formed over the second interlayer insulating film 61.

The second metal wirings 63c are covered by the third interlayer insulating film 64, and are coupled to sixth vias 65c and 65d which are formed in the third interlayer insulating film 64.

Further, in the peripheral circuit area, third metal wirings 70 are formed over the third interlayer insulating film 64 simultaneously while the source lines SL and the bit lines BL are formed. In the subsequently formed fourth interlayer insulating film 66, a seventh via 71 is formed to be coupled to a portion of the third metal wiring 70. After that, a fourth metal wiring layer 72, the fifth interlayer insulating film 67, eighth vias 73a and 73b, fifth metal wirings 74, the silicon oxide film 68, and the uppermost covering film 69 are formed in this order.

The sixth, seventh and eighth vias 65c and 65d, 71, 73a, and 73b are formed in a manner substantially similar to that in which the third and fourth vias 65a and 65b of the memory cell array area are formed. The fourth and fifth metal wirings 72 and 74 are formed in a manner substantially the same as or substantially similar to that in which the metal third wirings 70 are formed.

According to the process described above, the memory cell array as illustrated in FIG. 1 is thus formed by providing, in a layer between the layers of the memory cells MC's and the bit lines BL, the branch bit lines 63a and the branch source lines 73b for interconnecting the memory cells MC's arranged in the opposing corners or adjacently in the oblique direction.

However, the branch bit lines 63a and the branch source lines 63b are formed simultaneously with the second metal wirings 63c of the peripheral circuit area, and hence the number of steps may not increase in the process described above, in comparison with the conventional process.

Second Embodiment

Figure 20:
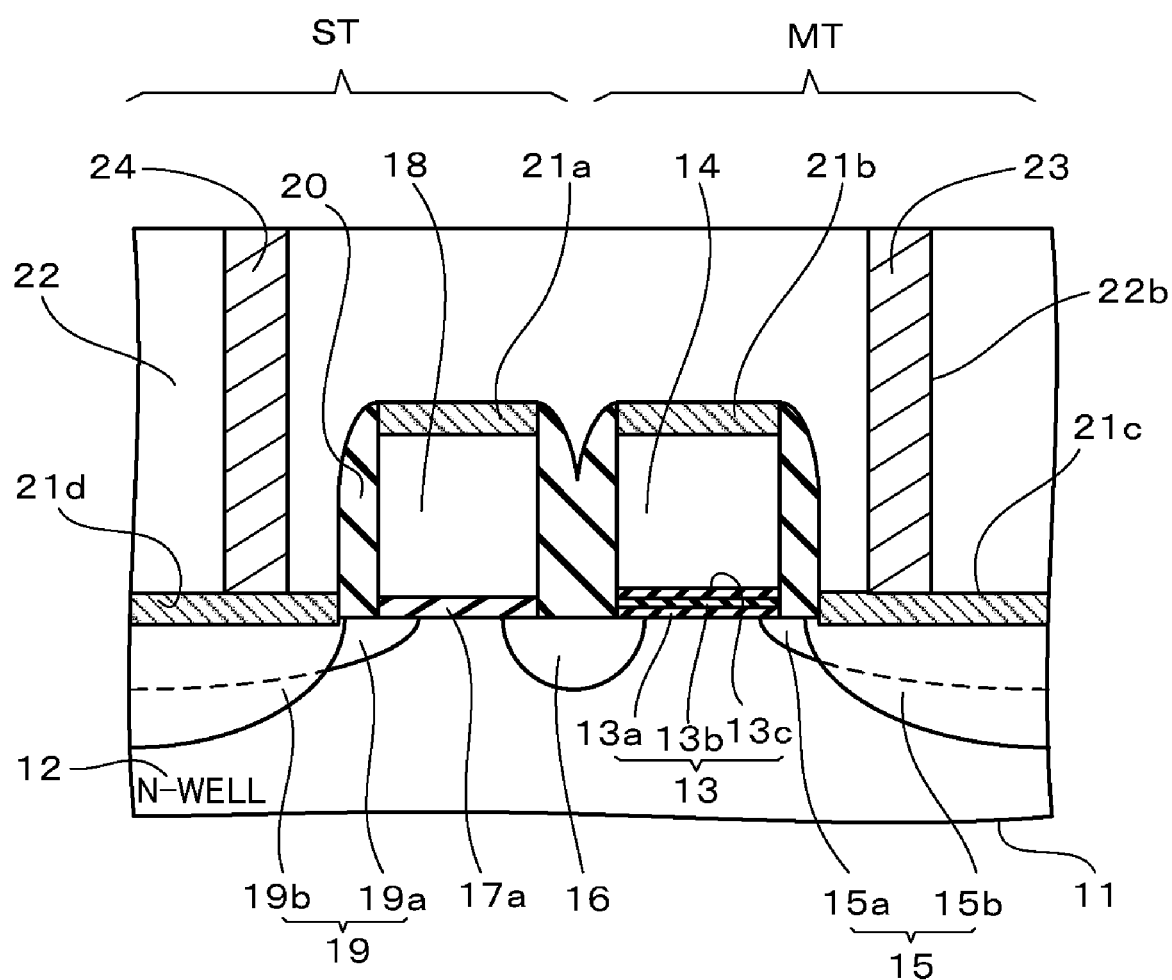
FIG. 20 is a cross sectional view of an example semiconductor device in accordance with a second embodiment of the present invention.

FIG. 20 is a cross sectional view of an example memory cell in a flash memory as a semiconductor device in accordance with a second embodiment of the present invention. In FIG. 20, symbols and numerals similar to those of FIG. 2 indicate elements similar to those of FIG. 2.

The memory cell MC of FIG. 20 includes a memory transistor MT and a selector transistor ST.

Similarly to the first embodiment, the memory transistor MT includes a memory gate electrode 14, a p-type source region 15, a shared p-type source and drain (source/drain) region 16, an ONO film 13, and the like. Similarly to the first embodiment, the selector transistor ST includes a selector gate electrode 18, the shared p-type source and drain (source/drain) region 16, a p-type drain region 19, and the like.

In the selector transistor ST, an interposing gate insulating film 17a is formed between the selector gate electrode 18 and the N-well 12. The gate insulating film 17a may have a thickness of 7 nm, for example, that is made thinner than the gate insulating film 17 in the first embodiment. Thus, a withstand voltage of the gate insulating film 17a is lower than a memory erase voltage for the ONO film 13.

However, in the selector transistor ST, the thinned thickness of the gate insulating film 17a and application of a voltage higher than the threshold voltage to the selector gate electrode 18 facilitate to form a channel in the surface layer portion of the N-well between the p-type source/drain region 16 and the p-type drain region 19. This causes larger current to flow in the formed channel in selector transistor ST than the channel current in the selector transistor ST in the first embodiment. This may reduce probability of a read-out error of the memory cell.

The erase operation of the memory cell MC is performed in a manner as described below.

Figure 21:
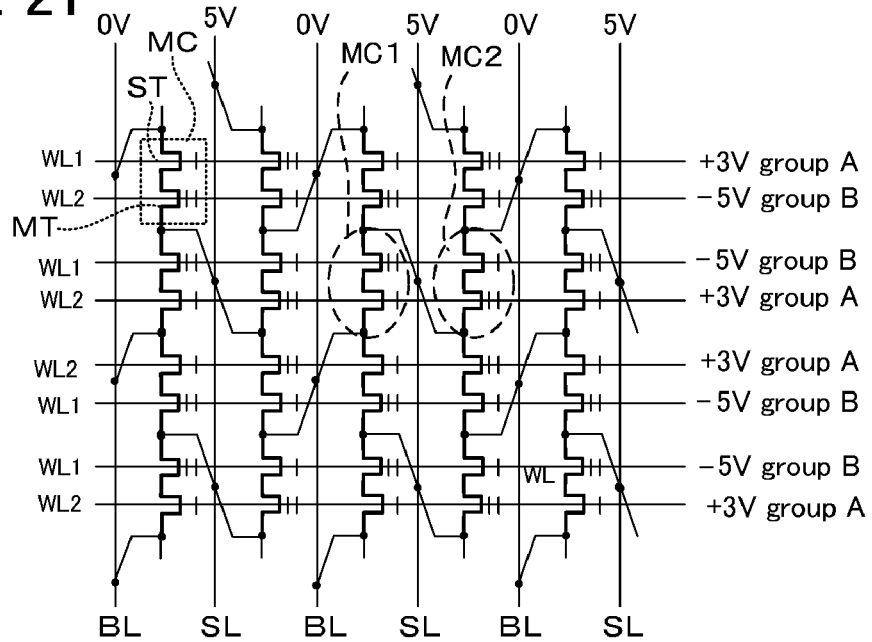
FIG. 21 illustrates an example circuit of a memory cell array of the example semiconductor device in accordance with the second embodiment of the present invention.

FIG. 21 illustrates an example of a combination of voltages for the erase operation to be applied to the bit lines BL, the source lines SL, the first word lines WL1, and the second word lines WL2, in the memory cell array.

In the memory cell MC, a voltage of +3 V is applied to either one of the two groups of word lines WL1 and WL2 coupled to the memory gate electrodes 14 and the selector gate electrodes 18, and a voltage of −5 V is applied to the other of the two groups of word lines WL1 and WL2, while a voltage of 5 V is applied to both of the source lines SL and the N-wells 12, and a voltage of zero (0) V is applied to the bit lines BL.

The erase operation of the memory cell MC includes two steps as described below.

Figure 22A:
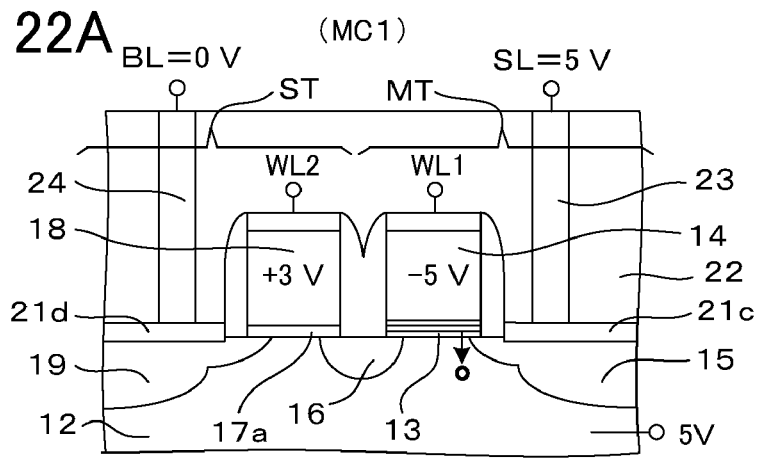
FIGS. 22A and 22B are cross sectional views for illustrating operations of the example semiconductor device of FIG. 20.

In the first step for the erase operation, as illustrated in FIG. 22A, in a first memory cell MC1, a voltage of −5 V is applied to the memory gate electrode 14, and a voltage of +3 V is applied to the selector electrode 18.

Thus, the electrons stored in the silicon nitride film 13b of the ONO film 13 are moved into the N-well 21 due to the tunneling effect, so that the stored data bit is erased. No channel is formed under the selector gate electrode 18.

Figure 22B:
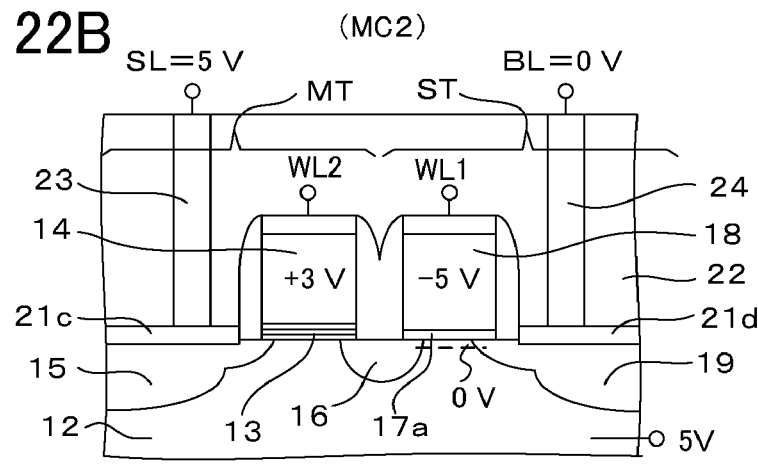

In this case, as illustrated in FIG. 22B, in a second memory cell MC2 disposed adjacently to the first memory cell MC1 in the longitudinal direction of the word line, the voltage of −5 V is applied to the selector gate electrode 18, and hence forms a channel under the selector gate electrode 18 of the selector transistor ST. However, the voltage of the channel is zero (0) V, because the voltage of the bit line BL is set to be zero (0) V. On the other hand, the voltage of +3 V is applied to the memory gate electrode 14, and hence no channel is formed under the memory gate electrode 14 and the potential difference in the N-well 12 is small, so that no electron is injected into the memory transistor MT.

In the second step for the erase operation, the voltages applied to the adjacent word lines WL2 and WL1 in a reverse manner from those applied to the adjacent word lines WL1 and WL2 in the first step. Thus, in the second memory cell MC2, the voltage of +3 V is applied to the memory gate electrode 14, and the voltage of −5 V is applied to the selector gate electrode 18.

Thus, in the second memory cell MC2, the electrons stored in the ONO film 13 of the memory transistor MT are moved into the N-well 21 due to the tunneling effect, so that the stored data bit is erased. In this case, in the first memory cell MC1, the selector transistor ST forms a channel. However, the voltage of the channel is zero (0) V, because the voltage of the bit line BL is set to be zero (0) V.

As described above, in the erase operation, the bit line BL is set to be zero (0) V, and hence the voltage as low as −5 V is applied to the gate insulating film 17a of the selector transistor ST in the memory cell MC subject to the erase operation, so that the gate insulating film 17a may be made thinner than that (17) in the first embodiment.

The voltage of 3 V is thus applied to the word line WL2 coupled to the selector transistor ST in the memory cell subject to the erase operation, so that the voltage of 3 V prevents the selector transistor ST from being turned ON, and hence prevents current from flowing from the source line SL to the bit line BL in the memory cell MC.

The memory cell illustrated in FIG. 20 may be used as the memory cell MC in the memory cell array as illustrated in FIG. 1.

Next, the example steps of forming the gate insulating film 17a of the selector transistor ST to be thinner than the gate insulating film 38 of the 5V NMOSFET $t_1$ in the peripheral circuit area are described below.

First, according to the steps in the first embodiment as described above, the STI 36 is formed on the silicon substrate 11, then the N-wells 12, 42a, and 42b, and the P-wells 41a, and 41b are formed, and then the ONO film is formed, as illustrated in FIG. 8.

Subsequently, the gate insulating film 17a of the selector transistor ST is formed according to the steps as described below.

First, portions of the ONO film 13 that lie in the 5V NMOSFET region 35a, the 5V PMOSFET region 35b, and the 5V low-threshold NMOSFET region 35c in the peripheral circuit area are removed, by means of the reactive ion etching (RIE) technique and the wet etching technique with the hydrofluoric acid, for example. For this purpose, remaining portions of the ONO film 13 in the remaining regions are coated with the photoresist.

Figure 23A:
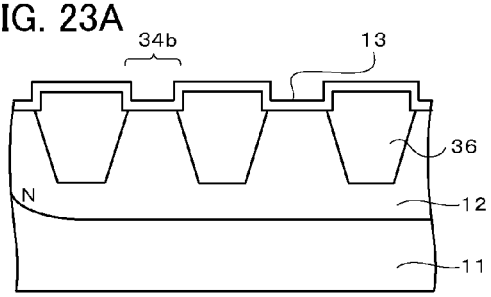
FIGS. 23A-23C illustrate are a first subset of cross-sectional views for illustrating example steps of forming a gate insulating film in steps of forming the semiconductor device in accordance with the second embodiment of the present invention.
Figure 23B:
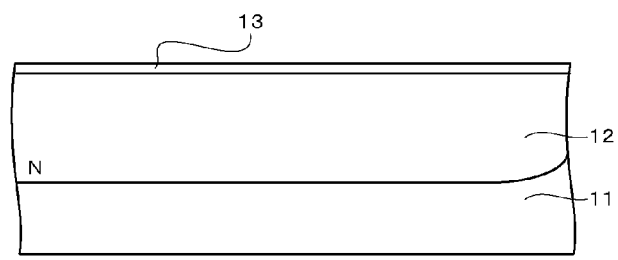
Figure 23C:
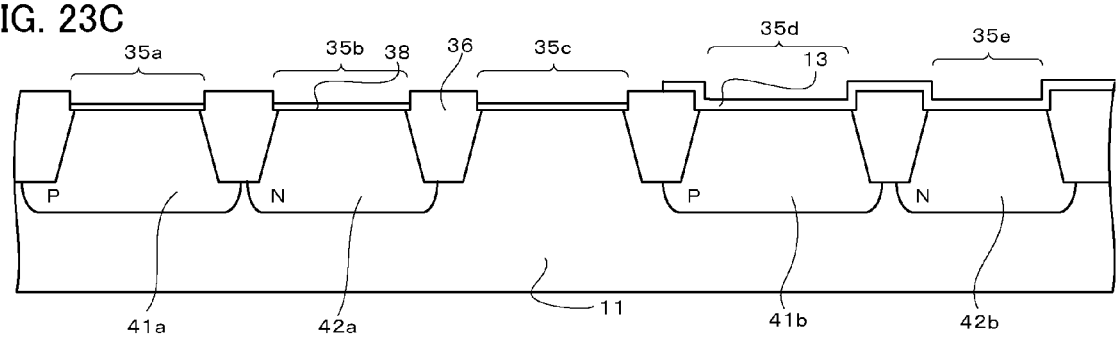

Next, as illustrated in FIGS. 23A to 23C, after the photoresist is removed, the surface of the silicon substrate 11 in the 5V NMOSFET region 35a, the 5V PMOSFET region 35b, and the 5V low-threshold NMOSFET region 35c in the peripheral circuit area is thermally oxidized, so that the silicon oxide film with a thickness of 5 nm is formed as the gate insulating film 38.

Subsequently, according to steps similar to those in the first embodiment, a portion of the ONO film 13 in the selector transistor forming region 34b is removed.

Figure 24A:
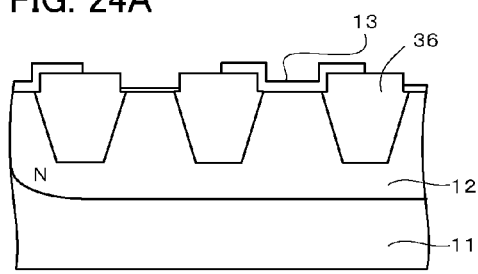
FIGS. 24A-24C are a second subset of the cross-sectional views for illustrating example steps of forming the gate insulating film in the steps of forming the semiconductor device in accordance with the second embodiment of the present invention.
Figure 24B:
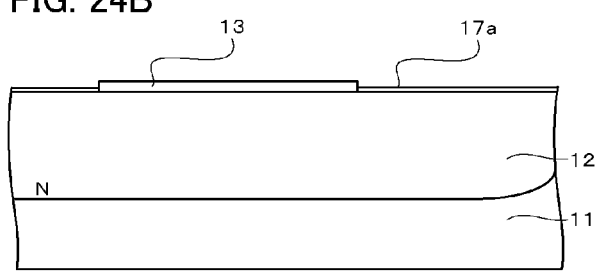
Figure 24C:
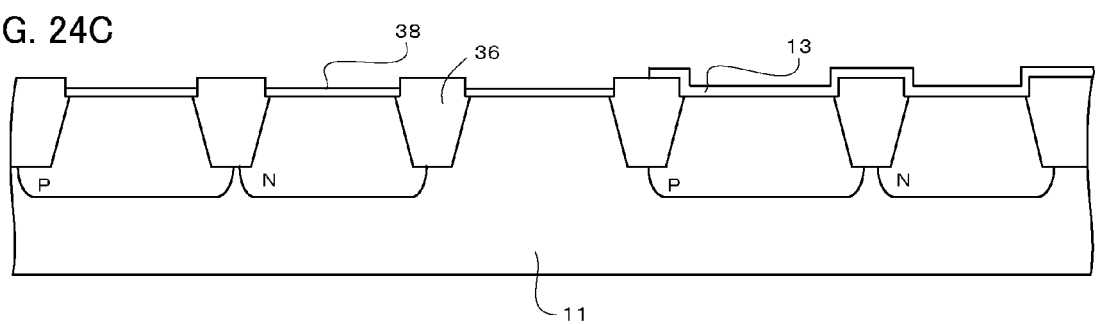

After that, as illustrated in FIGS. 24A to 24C, the surface of the silicon substrate 11 in the selector transistor forming region 34b is thermally oxidized, so that a silicon oxide film with a thickness of 4 nm is formed as the gate insulating film 17a. The gate oxide film 38 formed in the peripheral circuit area is thickened to have a thickness of 9 nm.

Next, according to steps similar to those in the first embodiment, portions of the ONO film 13 in the 1.8V NMOSFET region 35d and 1.8V PMOSFET region 35e in the peripheral circuit area are etched and removed.

After that, as illustrated in FIGS. 25A to 25C, the surface of the silicon substrate 11 in the 1.8V NMOSFET region 35d and the 1.8V PMOSFET region 35e is thermally oxidized to form a silicon oxide film with a thickness of 3 nm as the gate insulating film 39. Meanwhile, the gate insulating film 38 in each of the 5V NMOSFET region 35a, the 5V PMOSFET region 35b, and the 5V low-threshold NMOSFET region 35c are thickened to has a thickness of 12 nm, and the gate insulating film 17a in the selector transistor forming region 34b is thickened to have a thickness of 7 nm.

After that, the memory device is fabricated according to steps similar to those in the first embodiment.

The withstand voltage of the gate insulating film 17a of the thus formed selector transistor ST is lower than the potential difference between the word lines WL1 and WL2 and the source line SL in the memory erase operation. Advantageously, however, no absolute voltage larger than the withstand voltage is applied to the gate insulating film 17a in the write operation and the read operation as illustrated in TABLE 1, and in the erase operation as described above.

Third Embodiment

Figure 26:
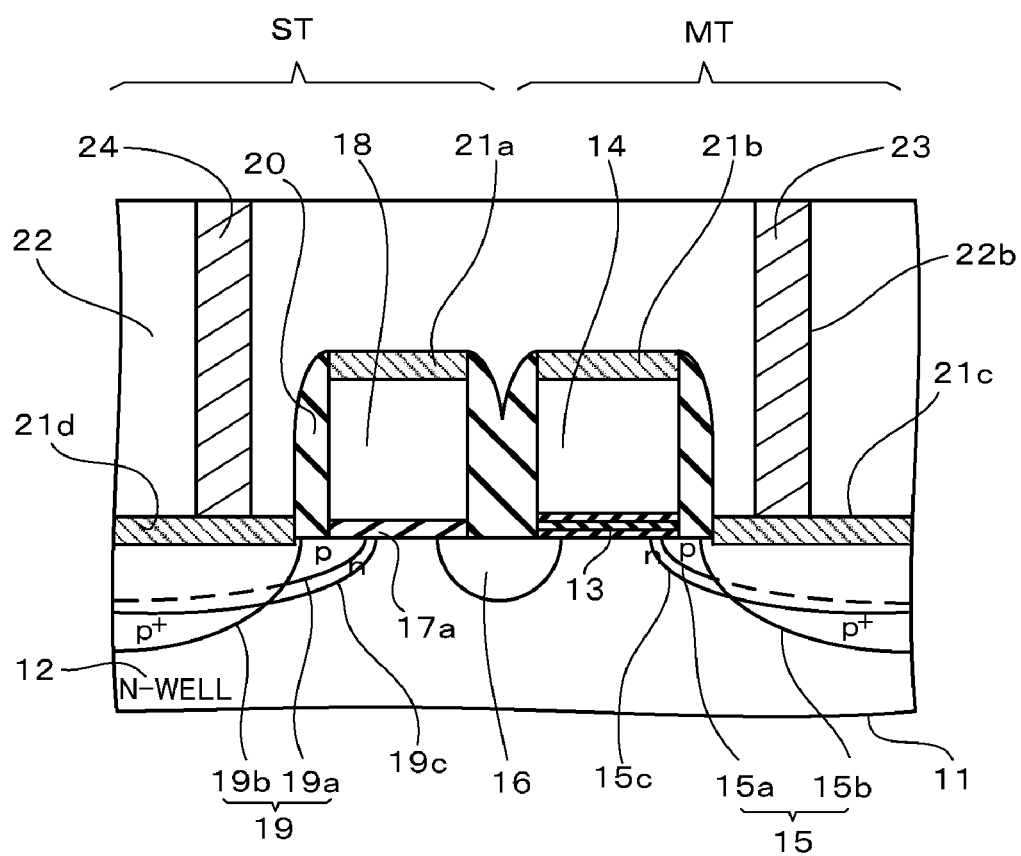
FIG. 26 is a cross sectional view of an example semiconductor device in accordance with a third embodiment of the present invention.

FIG. 26 is a cross sectional view of an example memory cell in a flash memory as a semiconductor device in accordance with a third embodiment of the present invention. In FIG. 26, symbols and numerals similar to those of FIG. 2 indicate elements similar to those of FIG. 2.

The memory cell MC of FIG. 26 includes a memory transistor MT and a selector transistor ST.

Similarly to the second embodiment, the memory transistor MT includes a memory gate electrode 14, a p-type source region 15, a shared p-type source and drain (source/drain) region 16, an ONO film 13, and the like. Similarly to the second embodiment, the selector transistor ST includes a selector gate electrode 18, a p-type drain region 19, the shared p-type source and drain (source/drain) region 16, a gate insulating film 17a, and the like. The gate insulating film 17a of the selector transistor ST may have a thickness similar to that in the first embodiment.

Further, n-type impurity diffusion regions 15c and 19c, which have higher impurity concentration than that of the N-well 12, are formed around lower boundaries or interfaces of or beneath the p-type source region 15 and the p-type drain region 19, respectively.

Thus, distribution of the impurity concentration of the p-n junction on the boundary or interface between the p-type source region 15 and the N-well 12 changes sharply, and hence the diffusion potential becomes high. This facilitates the electrons, which are generated due to the avalanche breakdown or the band-to-band tunneling, to be injected into the ONO film 13.

An n-type impurity diffusion region is not formed around the p-type source/drain region 16 in this embodiment, so that the avalanche breakdown or the band-to-band tunneling phenomena is prevented from occurring in the p-type source/drain region 16 due to the potential difference between the p-type source/drain region 16 and the N-well 12, in an erase operation similar to that in the second embodiment.

The memory cell in this embodiment may be used as the memory cell MC for the circuit as illustrated in FIG. 1.

Next, the example steps of forming the n-type impurity regions 15c and 19c of the memory cell MC are described below.

First, according to the steps as described above in the first embodiment, the STI 36, the N-wells 12, 42a, and 42b, and the P-wells 41a and 41b are formed in the silicon substrate 11. Further, the ONO film 13, and the word lines WL1 and WL2 are formed over them. After that, as illustrated in FIGS. 12A and 12B, the p-type extension regions 15a and 19a are formed laterally in the silicon substrate 11 around and between the memory gate electrodes 14 and the selector gate electrode 18. The memory gate electrode 14 and the selector gate electrode 18 form portions of the word lines WL1 and WL2.

Figure 27:
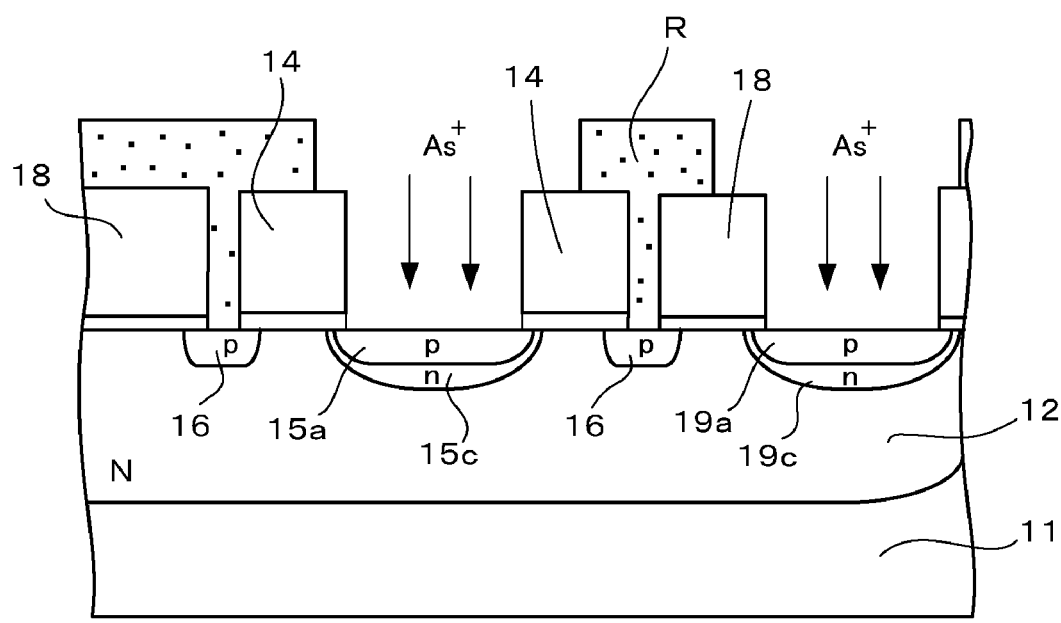
FIG. 27 is a cross-sectional view for illustrating example steps of implanting n-type impurity ions in steps of forming the semiconductor device in accordance with the third embodiment of the present invention.

After that, as illustrated in FIG. 27, a resist pattern R is formed in the memory cell array area, and then the p-type extension regions 15a and 19a are uncovered and exposed, while the p-type source/drain region 16 and other regions remain coated. The resist pattern R is formed by applying photoresist to the entire surface of the silicon substrate 11 to coat the word lines WL1 and WL2 and the like and then exposing and developing the photoresist.

Subsequently, the arsenic ions as the n-type dopant ions are implanted at a dose of $1 \times 10^{13}/cm^2$ with acceleration energy at 20 keV in the p-type extension regions 15 and 19 which are not coated with the resist pattern, so that the n-type impurity diffusion regions 15c and 19c are formed.

The resist pattern R is then removed. Then, similarly to the first embodiment, the side walls 20 are formed, and then the p-type high-concentration impurity diffusion regions 15b and 19b are formed in the p-type source region 15 and the p-type drain region 19, respectively, in the silicon substrate 11. After the impurity ion implantation, the implanted impurity is activated by the thermal processing.

In the following steps similar to those in the first embodiment, the memory device is produced. This completes the production of the memory cell as illustrated in FIG. 26.

Fourth Embodiment

Figure 28:
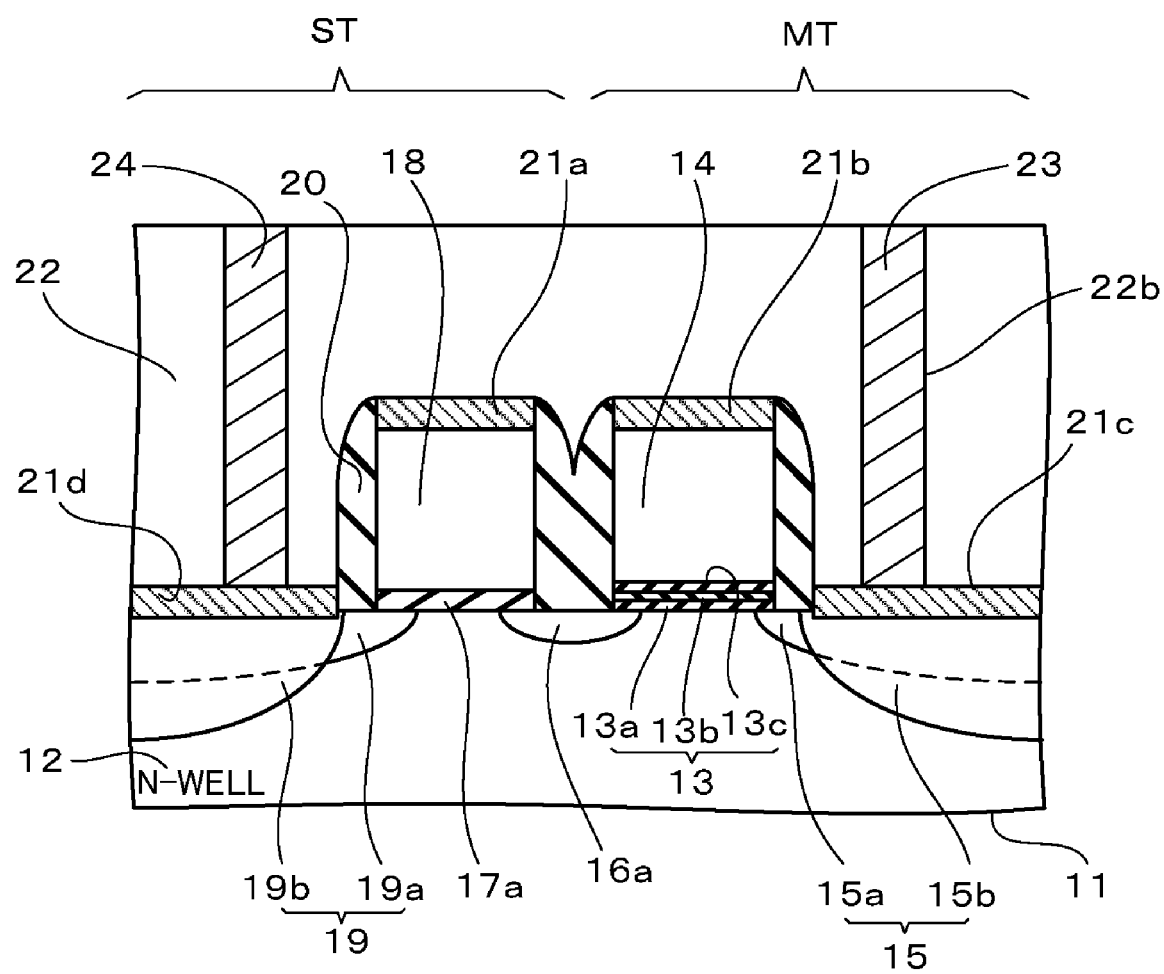
FIG. 28 is a cross sectional view of an example semiconductor device in accordance with a fourth embodiment of the present invention.

FIG. 28 is a cross sectional view of an example memory cell in a flash memory as a semiconductor device in accordance with a fourth embodiment of the present invention. In FIG. 28, symbols and numerals similar to those of FIG. 2 indicate elements similar to those of FIG. 2.

The memory cell MC of FIG. 28 includes a memory transistor MT and a selector transistor ST.

Similarly to the second embodiment, the memory transistor MT includes a memory gate electrode 14, a p-type source region 15, a shared p-type source and drain (source/drain) region 16a, an ONO film 13, and the like. Similarly to the second embodiment, the selector transistor ST includes a selector gate electrode 18, a p-type drain region 19, the shared p-type source and drain (source/drain) region 16a, a gate insulating film 17a, and the like.

However, the impurity concentration of the p-type source/drain region 16a between the memory gate electrode 14 and the selector gate electrode 18 is lower than that of the p-type source/drain region 16 in the second embodiment, and hence is an LDD (lightly-doped drain) region.

In the structure as described above, the diffusion potential in the p-n junction between the memory gate electrode 14 and the selector gate electrode 18 is lowered, so that the avalanche breakdown or the band-to-band tunneling is hindered from occurring.

For example, in the erase operation with the two-steps as described in the second embodiment, and in the memory cell MC not subject to the erase operation, application of a voltage of 5 V to the N-well 12 and a voltage of 0 V to the p-type drain region 19 may develop a potential difference of about 5 V in the p-type source/drain region 16*a*. However, the avalanche breakdown or the band-to-band tunneling is hindered from occurring in the p-type source/drain region 16*a*, so that a write error is prevented from occurring in the memory cell MC.

Next, the example steps of forming the p-type source/drain region 16*a* which has lower impurity concentration than that of the p-type impurity extension regions 15*a* and 19*a* are described below.

First, according to the steps as described above in the first embodiment, the STI 36, the N-wells 12, 42*a*, and 42*b*, and the P-wells 41*a* and 41*b* are formed in the silicon substrate 11. Further, the ONO film 13, and the word lines WL1 and WL2 are formed over them.

Figure 29A:
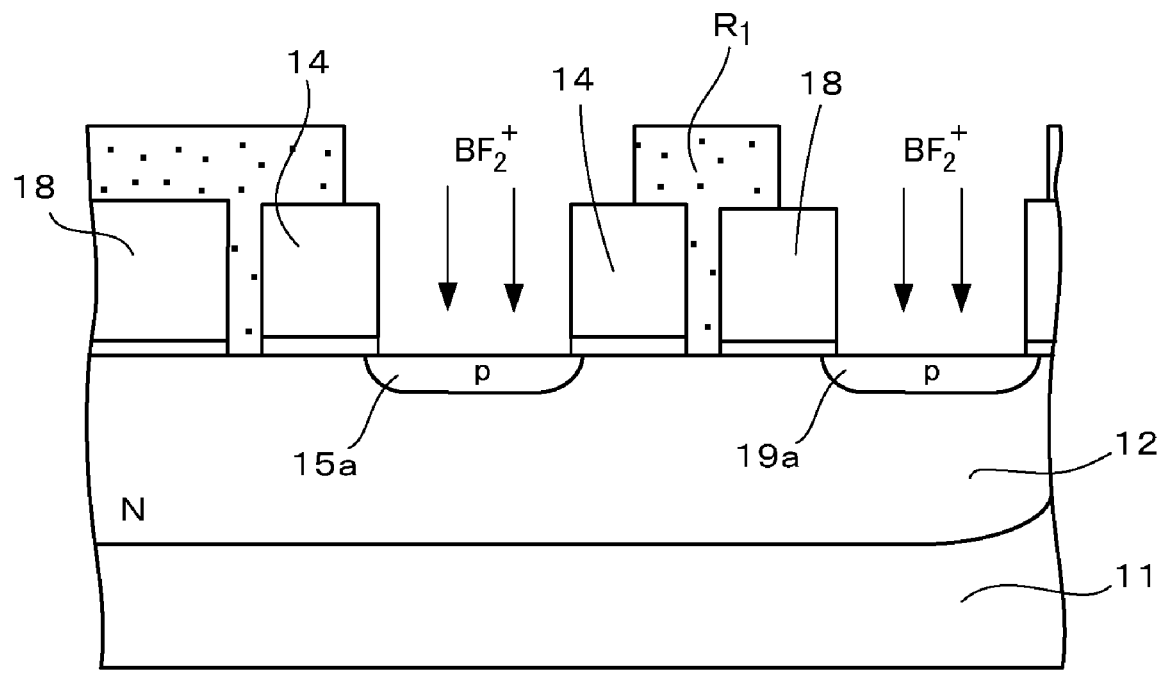
FIGS. 29A and 29B are cross-sectional views for illustrating example steps of implanting impurity ions in steps of forming the semiconductor device in accordance with the fourth embodiment of the present invention.

After that, as illustrated in FIG. 29A, photoresist is applied to the entire surface of the silicon substrate 11 and then the photoresist is exposed and developed, so that a resist pattern $R_1$ is formed to coat the peripheral circuit area and to coat a region between the two word lines WL1 and WL2 used as the selector gate electrode 18 and the memory gate electrode 14.

Subsequently, the boron fluoride ions as the p-type impurity ions are implanted at a dose of $3\times10^{14}/cm^2$ with acceleration energy at 30 keV in the N-well 12 in the regions between the adjacent memory gate electrodes 14 and between the adjacent selector gate electrodes 18. Thus, the p-type extension regions 15*a* and 19*a* are formed in the p-type source region 15 and the p-type drain regions 19, respectively. After that, the resist pattern $R_1$ is removed.

Figure 29B:
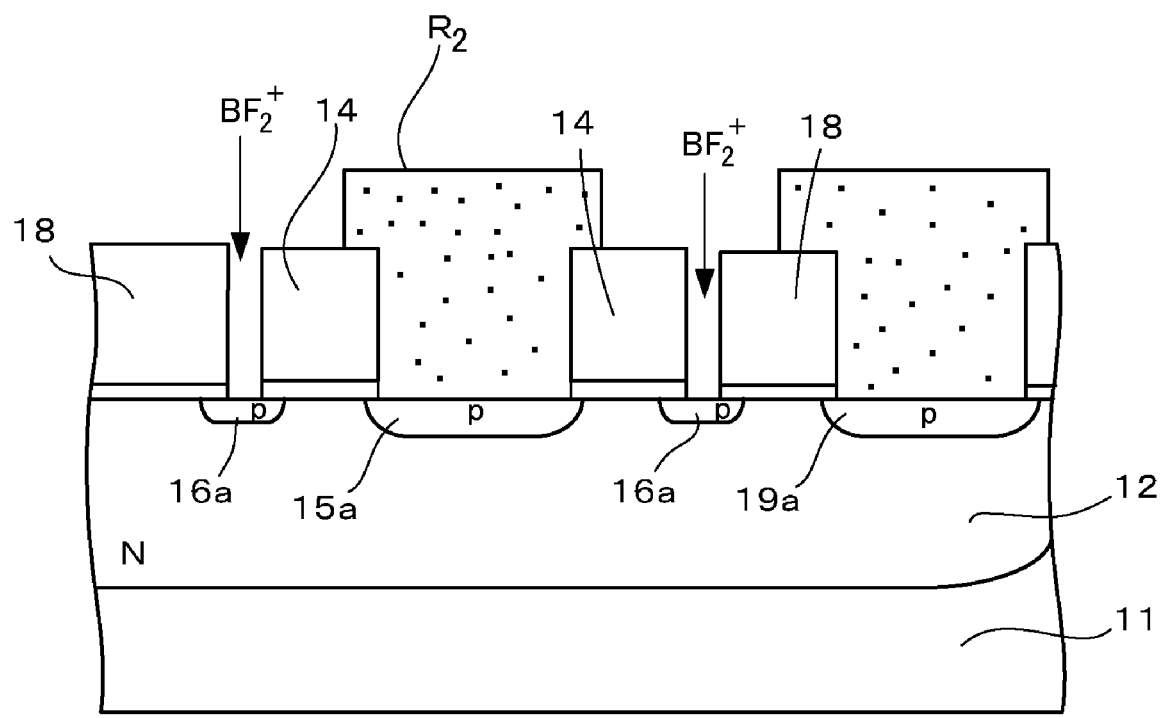

After that, as illustrated in FIG. 29B, photoresist is applied again to the entire surface of the silicon substrate 11 and then the photoresist is exposed and developed, so that a resist pattern $R_2$ is formed to uncover or expose the region between the selector gate electrode 18 and the memory gate electrode 14, and to coat the remaining regions.

Subsequently, the boron fluoride ions as the p-type impurity ions are implanted at a dose of $5\times10^{13}/cm^2$ with acceleration energy at 30 keV in the N-well 12 in the region between the selector gate electrode 18 and the memory gate electrode 14. Thus, the p-type low-concentration impurity source/drain region 16*a* of is formed. After that, the resist pattern $R_2$ is removed.

After that, in a manner similar to that in the first embodiment, the side walls 20 are formed, and then the p-type high-concentration impurity diffusion regions 15*b* and 19*b* are formed, so that the memory cell MC as illustrated in FIG. 28 is formed. The following steps are similar to those in the first embodiment.

Fifth Embodiment

FIG. 30 is a cross sectional view of an example memory cell for an OTP (one time programmable) ROM as a semiconductor device in accordance with a fifth embodiment of the present invention. In FIG. 30, symbols and numerals similar to those of FIG. 20 indicate elements similar to those of FIG. 20.

Similarly to the second embodiment, in the memory cell MC as illustrated in FIG. 30, the memory transistor MT includes a memory gate electrode 14, a p-type source region 15, a shared p-type source and drain (source/drain) region 16, and the like. Similarly to the second embodiment, the selector transistor ST includes a selector gate electrode 18, a p-type drain region 19, the shared p-type source and drain (source/drain) region 16, and the like. Similarly to the memory cells in FIG. 1, the memory cell MC is coupled to the word lines WL1 and WL2, the bit line BL, and the source line SL.

The memory cell MC of FIG. 30 is different from the memory cell MC described in the second embodiment in that the lower silicon oxide film 13*d* within the ONO film 13 of the memory transistor MT may have a larger thickness of 4 nm, for example, and the gate insulating film 17*b* of the selector transistor ST may have a smaller thickness of 3 nm, for example.

Thus, the electrons stored in the silicon nitride film 13*b* of the ONO film 13 in the memory transistor MT are hard to leak out of the silicon nitride film 13*b*, and hence the ONO film 13 provides a good retention characteristic. Similarly to the second embodiment, the thinner gate insulating film 17*b* in the selector transistor ST ensures provision of larger current in a read operation.

A write operation and a read operation in this embodiment are similar to those for the memory cell as described in the first embodiment.

Next, the write operation and the read operation for the memory cells MC's are described. TABLE 2 provides an example set of values of voltages applied to the elements for write and read operations of the memory cells MC's.

TABLE 2 may be applicable to connections such that the first word lines WL1 are coupled to the selector transistors (TR) ST, and the second word lines WL2 are coupled to the memory transistors (TR) MT. In TABLE 2, parenthesized voltage values are applied to non-selected lines.

TABLE 2

| | BL | SL | WL2 (SELECTOR TR) | WL1 (MEMORY TR) | N-WELL |
|---|---|---|---|---|---|
| WRITE | 0 V | −5 V | 0 V | 1.8 V | 0 V |
| | (0 V) | (0 V) | (0 V) | (0 V) | |
| READ | −1.8 V | 0 V | −1.8 V | 0 V | 0 V |
| | (0 V) | (0 V) | (0 V) | (0 V) | |

The write operation for the memory cell MC applies a voltage of 1.8 V through the word line WL1 to the memory gate electrode 14 of the memory transistor MT, and also applies a voltage of −5 V to the source line SL. In this case, the voltages at the bit line BL, and the N-well 12 are set to be zero (0) V.

Accordingly, electrons generated by tunneling between the bands of the p-type source region 15 and the N-well 12 are injected into the silicon nitride film 13*b* of the ONO film 13 due to the voltage applied at the memory gate electrode 14. As a result, the threshold of the memory transistor MT is changed to have a positive value. On the other hand, the voltage of the bit line BL is set to be zero (0) V, and hence no current flows through the channel region of the selector transistor ST.

The voltage at the source line SL coupled to the non-selected memory cell MC is set to be zero (0) V, and hence no electron due to the band-to-band tunneling is generated. The read operation for the memory cell MC is similar to that for the memory cell in the first embodiment.

As can be seen from TABLE 2, in this embodiment, the voltage conditions for the operations advantageously need not provide for an erase operation. Thus, TABLE 2 is different from TABLE 1 in that there is no absolute voltage to be applied which is larger than the voltages for the read operation to be applied to the word lines WL and the bit lines BL. Thus, no absolute voltage larger than the withstand voltage of the low-voltage transistor is applied to the word lines WL and the bit lines BL.

Thus, the word line decoders 4a and 4b and the bit line decoder 3 can be formed of the low-voltage transistors. The low-voltage transistor has a small area, so that dimensions or sizes of the peripheral circuits can be reduced. Further, the performance of the low-voltage transistor can provide a fast read operation.

Next, the example steps of forming the gate insulating film 17b of the selector transistor ST to be thinner than the gate insulating film 38 of the 5V NMOSFET t₁ in the peripheral circuit area are described below.

First, according to the steps in the first embodiment as described above, the STI regions 36 are formed on the silicon substrate 11, then the N-wells 12, 42a, and 42b, and the P-wells 41a, and 41b are formed, and then the ONO film 13 is formed over them, as illustrated in FIGS. 8A to 8C. In this embodiment, however, each of the lower silicon oxide film 13d, the upper silicon oxide film 13c and the silicon nitride film 13b of the ONO film 13 may have a thickness of 4 nm. The lower silicon oxide film 13d is formed by means of the thermal oxidation technique, similarly to the first embodiment.

Subsequently, the gate insulating film 17b of the selector transistor ST is formed according to the steps as described below.

First, the ONO films 13 in the 5V NMOSFET region 35a, the 5V PMOSFET region 35b, and the 5V low-threshold NMOSFET region 35c in the peripheral circuit area may be removed by means of the reactive ion etching (RIE) technique and the wet etching technique with the hydrofluoric acid, for example. In this case, portions of the ONO film 13 that are formed in the other regions are coated with photoresist.

Further, the photoresist is removed. After that, in a manner similarly to that as illustrated in FIGS. 23A to 23C, a silicon oxide film with a thickness of about 9 nm, for example, may be formed as the gate insulating film 38, by thermally oxidizing the surface of the silicon substrate 11 in the 5V NMOSFET region 35a, the 5V PMOSFET region 35b, and the 5V low-threshold NMOSFET region 35c in the peripheral circuit area.

Next, the portions of the ONO film 13 that are formed in the selector transistor forming regions 34b are etched, while the memory transistor forming regions in the memory cell array area and the portions of the peripheral circuit area are coated with the resist pattern.

The etching step thus exposes or uncovers the selector transistor forming regions 34b in the memory cell array area, and the 1.8V NMOSFET regions 35d and the 1.8V PMOSFET regions 35e in the peripheral circuit area, on the surface of the silicon substrate 11.

Figure 31A:
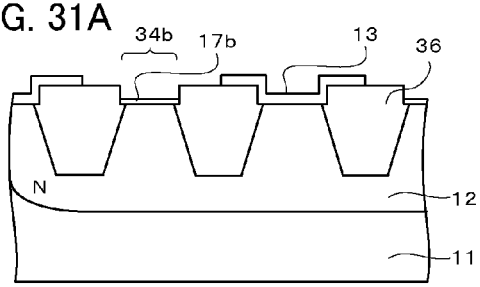
FIGS. 31A-31C are cross sectional views for illustrating example steps of forming a gate insulating film in steps of forming the semiconductor device in accordance with the fifth embodiment of the present invention.
Figure 31B:
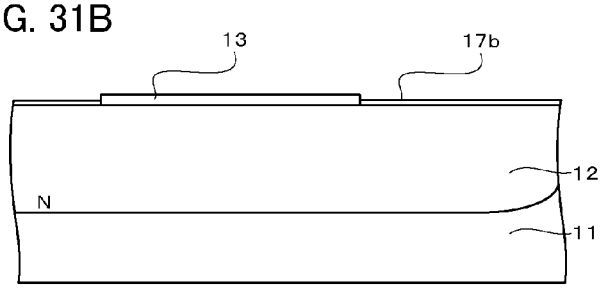
Figure 31C:
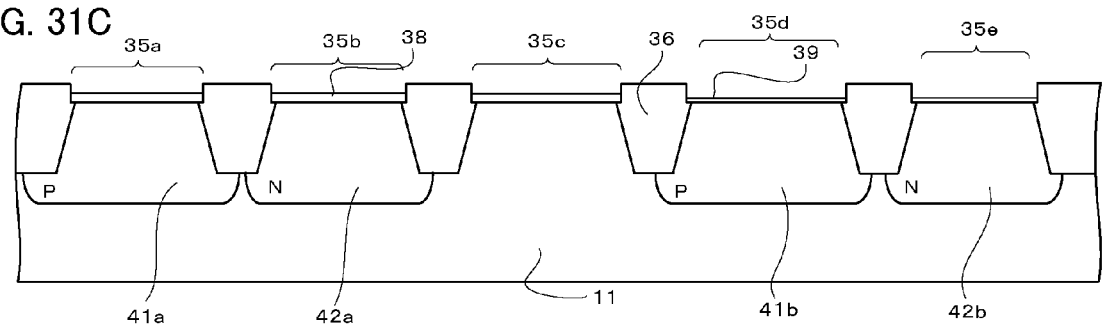

Subsequently, as illustrated in FIGS. 31A to 31C, the surface of the silicon substrate 11 in the selector transistor forming regions 34b, and the 1.8V NMOSFET regions 35d and the 1.8V PMOSFET regions 35e in the peripheral circuit area may be thermally oxidized to form the silicon oxide film as the gate insulating films 17b and 39 to have a thickness of 3 nm. Meanwhile, the gate oxide film 38, which has been formed in the portions of the peripheral circuit area, may be thickened to have an increased thickness of 12 nm.

After that, the memory device is fabricated according to further steps similar to those in the first embodiment.

The withstand voltage of the gate insulating film 17b of the thus formed selector transistor ST may be lower than the potential difference between the word lines WL1 and WL2 and the bit line BL. Advantageously, however, no absolute voltage larger than the withstand voltage is applied to the gate insulating film 17b as described above.

Sixth Embodiment

Figure 32:
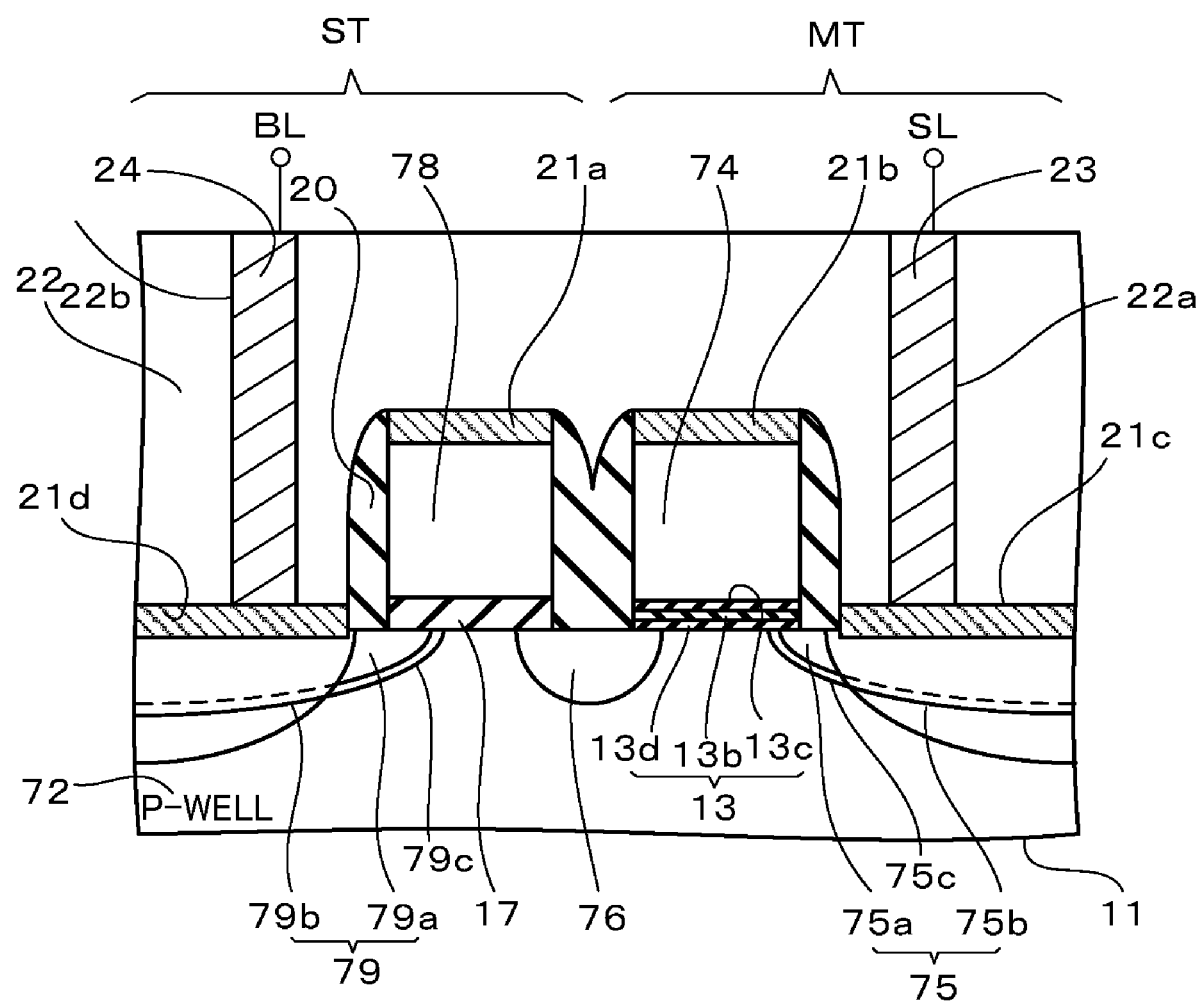
FIG. 32 is a cross sectional view of an example semiconductor device in accordance with a sixth embodiment of the present invention.

FIG. 32 is a cross sectional view of an example memory cell in a flash memory as a semiconductor device in accordance with a sixth embodiment of the present invention. In FIG. 32, symbols and numerals similar to those of FIG. 2 indicate elements similar to those of FIG. 2.

The memory cell MC of FIG. 32 includes an n-type memory transistor MT and an n-type selector transistor ST. The selector transistor ST is coupled to the bit line BL, and the memory transistor MT is coupled to the source line SL.

The memory transistor MT includes an ONO film 13 as a charge storage or trapping layer formed over or on a P-type well 72 in a silicon substrate 11, and a memory gate electrode 74 formed over the ONO film 13. The memory transistor MT further includes an n-type source region 75 and an n-type source and drain (source/drain) region 76, which are formed in the P-well 72 on respective opposite lateral sides of a memory gate electrode 74. Impurity for adjusting or modifying the threshold voltages is implanted in the P-well 72 in the n-type source region 75 and the n-type source/drain region 76.

The selector transistor ST includes a selector gate electrode 78 which is formed on an interposing gate insulating film 17 and over or above the P-well 72. The selector transistor ST further includes an n-type drain region 79 and the n-type source and drain (source/drain) region 76, which are formed in the P-well 72 on respective opposite lateral sides of the selector gate electrode 78. The selector transistor ST and the memory transistor MT share the n-type source/drain region 76.

The selector gate electrode 78 and the memory gate electrode 74 are portions of the word line WL1 or WL2, and are disposed substantially in parallel.

The n-type source region 75 and the n-type drain region 79 are formed of respective n-type impurity diffusion regions of high concentration 75b and 79b, and respective n-type impurity extension regions of low concentration 75a and 79a.

Further, the p-type impurity diffusion regions 75c and 79c, which have higher impurity concentration than that of the P-well 72, are formed around lower boundaries or interfaces of or beneath the n-type source region 75 and the n-type drain region 79, respectively. Thus, distribution of the impurity concentration of each of the p-n junctions, which are formed between the n-type source region 75 and the n-type drain region 79, and their respective surrounding regions, changes sharply. This facilitates the avalanche breakdown or the band-to-band tunneling to occur.

Silicide layers 21a and 21b are formed as upper layers over the memory gate electrode 74 and the selector gate electrode 78, respectively. Further silicide layers 21c and 21d are formed over respective surfaces of the n-type source region 75 and the n-type drain region 79. These silicide layers may be formed of, for example, cobalt silicide layers with a thickness of 8 nm. Further, insulating side walls 20 are formed on surrounding lateral sides of the memory gate electrode 74 and the selector gate electrode 79.

The memory transistor MT and the selector transistor ST are covered by an interlayer insulating film 22. In the interlayer insulating film 22, first and second contact holes 22a and 22b are formed to reach upper surface portions of the n-type source region 75 and the n-type drain region 79, respectively. A first conductive plug 23 and a second conductive plug 24 are buried or embedded in the first and second contact holes 22a and 22b, respectively. The first conductive plug 23 over or above the n-type source region 75 is coupled to the source line SL. The second conductive plug 24 over or above the n-type drain region 79 is coupled to the bit line BL.

Thus, differences of the written state of the memory transistor MT are prevented from affecting parasitic capacitance of the bit line BL.

The memory cells MC's, each of which has the structure as described above, have connections similarly to those in the first embodiment. Thus, for any two adjacent memory cells MC's in each row, the memory gate electrode 74 of the memory transistor MT of one (MC) of the two adjacent memory cells MC's and the selector gate electrode 78 of the selector memory transistor ST of the other adjacent memory cell MC are coupled to the one word line WL1 or WL2. In addition, the selector gate electrode 78 of the one memory cell MC and the memory gate electrode 14 of the other memory cell MC are coupled to the other word line WL2 or WL1.

The memory cells MC's arranged in a matrix or in rows and columns are coupled to the source lines SL and the bit lines BL in a manner similar to that in the first embodiment.

In the configuration described above, operative selection of one of the source lines SL and one of the word lines WL1 and WL2 allows only one of the memory transistors MT that is coupled to the two selected source and word lines SL and WL1 or WL2, to simultaneously receive the two voltages developed at the two respective selected source and word lines SL and WL1 or WL2. Thus, the electrons generated by the avalanche breakdown or the band-to-band tunneling can be injected into the ONO film 13 as the charge storage or trapping layer.

Next, the write, read and erase operations in the memory cells MC's are described. TABLE 3 provides an example set of values of voltages applied to the elements for write, read and erase operations of the memory cells MC's.

TABLE 3 may be applicable to connections such that the first word lines WL1 are coupled to the selector transistors (TR) ST, and the second word lines WL2 are coupled to the memory transistors (TR) MT. In TABLE 3, parenthesized voltage values are applied to non-selected lines.

TABLE 3

|  | BL | SL | WL2 (SELECTOR TR) | WL1 (MEMORY TR) | P-WELL |
|---|---|---|---|---|---|
| WRITE | 0 V | 5 V | 0 V | 5 V | 0 V |
|  | (0 V) | (0 V) | (0 V) | (0 V) |  |
| READ | 1.8 V | 0 V | 1.8 V | 0 V | 0 V |
|  | (0 V) | (0 V) | (0 V) | (0 V) |  |
| ERASE | 0 V | 5 V | −5 V | −5 V | 0 V |

First, the write operation for the memory cell MC applies a voltage of 5 V through the word line WL1 to the memory gate electrode 74, and also applies a voltage of 5 V to the source line SL. In this case, the voltages at the bit line BL, and the N-well 12 are set to be zero (0) V.

Accordingly, the electrons generated in the p-n junction between the n-type source region 75 and the P-well 72 due to the avalanche breakdown are injected into the silicon nitride film 13b of the ONO film 13. As a result, a threshold of the memory transistor MT is changed to have a positive value.

Meanwhile, the voltages of the selector gate electrode 78 and the bit line BL are set to be zero (0) V, and hence no current flows through the channel region of the selector transistor ST. The voltage at the source line SL coupled to the non-selected memory cell MC is set to be zero (0) V, and hence no electron due to the avalanche breakdown is generated.

The read operation for the memory cell MC applies a voltage of 1.8 V through the word line WL2 to the selector gate electrode 78, and also applies a voltage of 1.8 V to the bit line BL. Meanwhile, the voltages at the memory gate electrodes 74, the source lines SL, and the P-wells 72 are set to be zero (0) V.

Thus, in the selected memory cell MC, a channel is formed under the selector gate electrode 78, and a potential difference is developed between the n-type drain region 79 and the n-type source region 75.

In the memory transistor MT, when the electrons are stored in the ONO film 13, the electrons prevent a channel form being formed under the memory gate electrode 74. Thus, no current flows from the n-type source region 75 to the n-type drain region 79.

On the other hand, in the state of no electron stored in the ONO film 13, i.e., the erased state, a channel is formed under the memory gate electrode 74 at the potential of zero (0) V. Thus, current flows from the n-type source region 75 to the n-type drain region 79.

The differences of the current flows described above are detected or sensed by the sense amplifiers 4, and are read out as data bits.

The data erasing operation for the memory cell MC applies a voltage of −5 V through the word lines WL1 and WL2 to the selector gate electrode 78 and to the memory gate electrode 74, also applies a voltage of 5 V to the source line SL, and also applies a voltage of zero (0) V to the bit line BL. Meanwhile, the voltage at the P-well 72 is set to be zero (0) V.

Accordingly, in the n-type source region 75, the hot holes generated by the band-to-band tunneling effect are injected into the ONO film 13 of the memory transistor MT. Thus, the threshold of the memory transistor MT is changed to have a negative value.

Now, a process of producing, fabricating or manufacturing the memory cell array as described above is described below. The wirings coupled to the memory cells MC's are formed according to the steps in the first embodiment as described above and illustrated in FIGS. 19A to 19J. Thus, the following describes a bulk semiconductor process for the most part.

FIGS. 33A, 34A, 35A, 36A, 37A, and 38A are cross sectional views for illustrating the example steps of producing the semiconductor device in accordance with the sixth embodiment of the present invention, and of a portion of the memory cell array area taken along a longitudinal direction of the word line. FIGS. 33B, 34B, 35B, 36B, 37B, and 38B are further cross-sectional views for illustrating the example steps of producing the semiconductor device, and of a portion of the memory cell array area taken along a longitudinal direction of the bit line or the source line. FIGS. 33C, 34C, 35C, 36C, 37C, and 38C are cross-sectional views for illustrating the example steps of producing the semiconductor device, and of a portion of the peripheral circuit area.

Figure 33A:
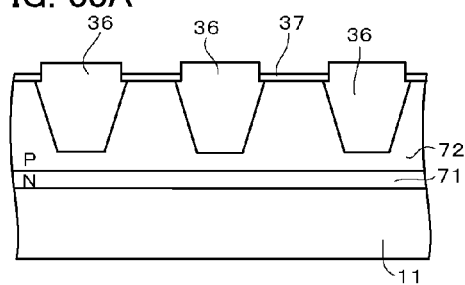
FIGS. 33A-33C are a first subset of cross-sectional views for illustrating example steps of forming a semiconductor device in accordance with the sixth embodiment of the present invention.
Figure 33B:
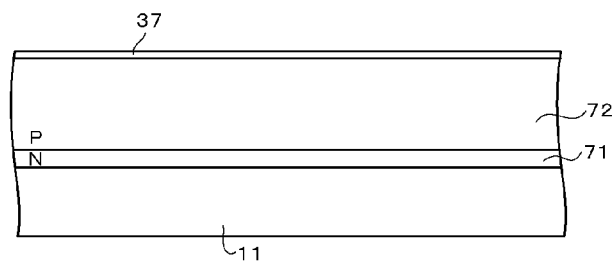
Figure 33C:
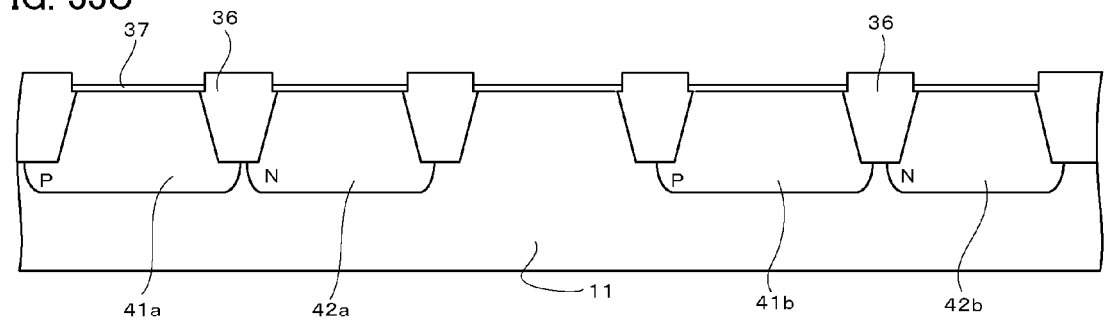

Next, the example steps of fabricating the structure as illustrated in FIGS. 33A to 33C are described below.

According to a process similar to that in the first embodiment, the STI 36 is formed on the silicon substrate 11. After that, a sacrificial oxide film or layer 37 is formed on a surface of the silicon oxide 11. The silicon substrate 11 is of a p-type in this case.

After that, the peripheral circuit area of the silicon substrate 11 is coated with photoresist, and portions of the memory cell array area are exposed or made uncoated. The n-type impurity ions are implanted in the portions of the memory cell array area under the suitable conditions, so that buried or embedded N-wells 71 are formed in a deeper region below the STI 36.

Further, by implanting the p-type impurity ions, P-wells 72 for flash are formed in shallower regions than the embedded N-well 71. The P-wells 72, the embedded N-wells 71, and the underlying p-type silicon substrate 11 form a triple well structure.

Similarly to the first embodiment, the P-wells 41a and 41b, and the N-wells 42a and 42b are formed in the peripheral circuit area of the silicon substrate 11.

The embedded N-well 71 and the P-well 72 are surrounded by a further N-well (not illustrated).

After that, n-type or p-type impurity ions for adjusting or modifying the threshold voltages are implanted in the P-wells 72 in the memory cell area, and also in the P-wells 41a and 41b and the N-wells 42a and 42b in the peripheral circuit area, and the like.

Next, the sacrificial oxide film 37 is removed by using the hydrofluoric acid, and then the ONO film 13 is formed over the silicon substrate 11, in a manner similar to that as illustrated in FIGS. 8A to 8C. The ONO film 13 has a three-layered structure as illustrated in FIG. 32.

Figure 34A:
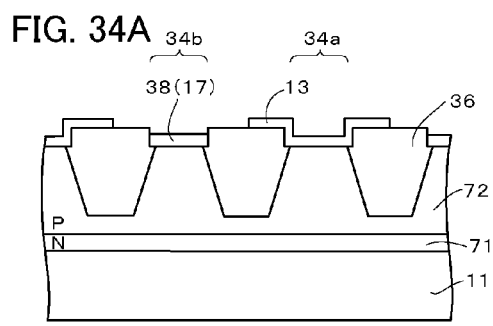
FIGS. 34A-34C are a second subset of cross-sectional views for illustrating the example steps of forming the semiconductor device in accordance with the sixth embodiment of the present invention.
Figure 34B:
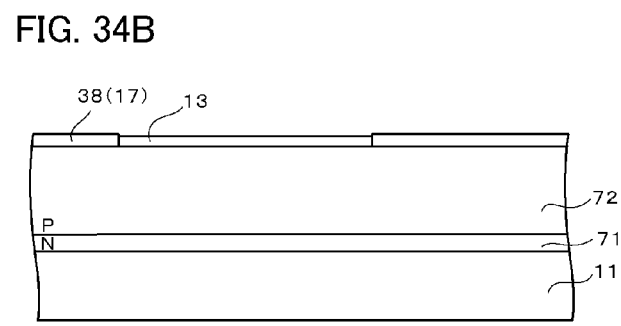
Figure 34C:
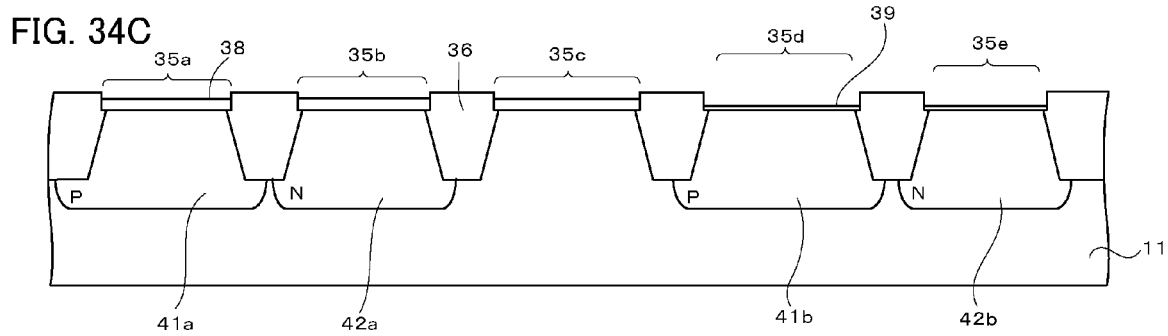

Next, as illustrated in FIGS. 34A to 34C, the gate insulating film 17 formed of a silicon oxide film with a thickness of 7 nm is formed on the surface of the silicon substrate 11 in the selector transistor region 34b, according to a process similar to that in the first embodiment.

Further, a gate insulating film 38 formed of a silicon oxide film with a thickness of 12 nm is formed on the surface of the silicon substrate 11 in the 5V NMOSFET region 35a, the 5V PMOSFET region 35b, and the 5V low-threshold NMOSFET region 35c. In addition, a gate insulating film 39 formed of a silicon oxide film with a thickness of 3 nm is formed on the surface of the silicon substrate 11 in the 1.8V NMOSFET region 35d and the 1.8V PMOSFET region 35e.

Figure 35A:
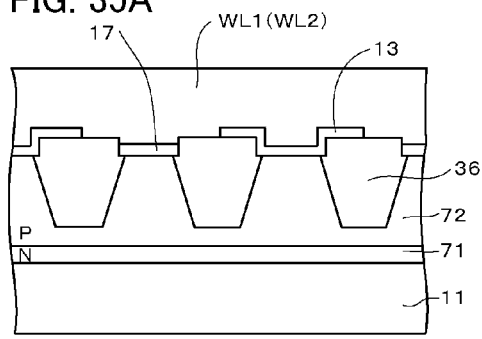
FIGS. 35A-35C are a third subset of cross-sectional views for illustrating the example steps of forming the semiconductor device in accordance with the sixth embodiment of the present invention.
Figure 35B:
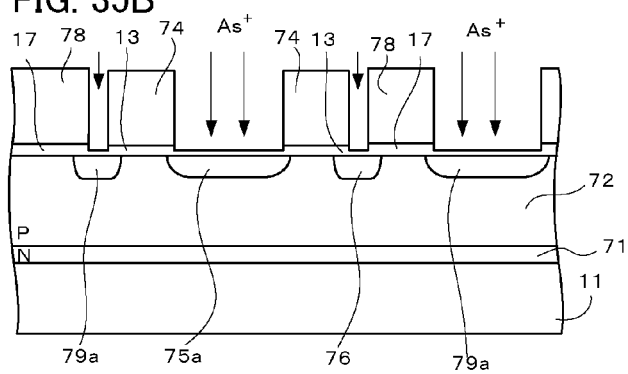
Figure 35C:
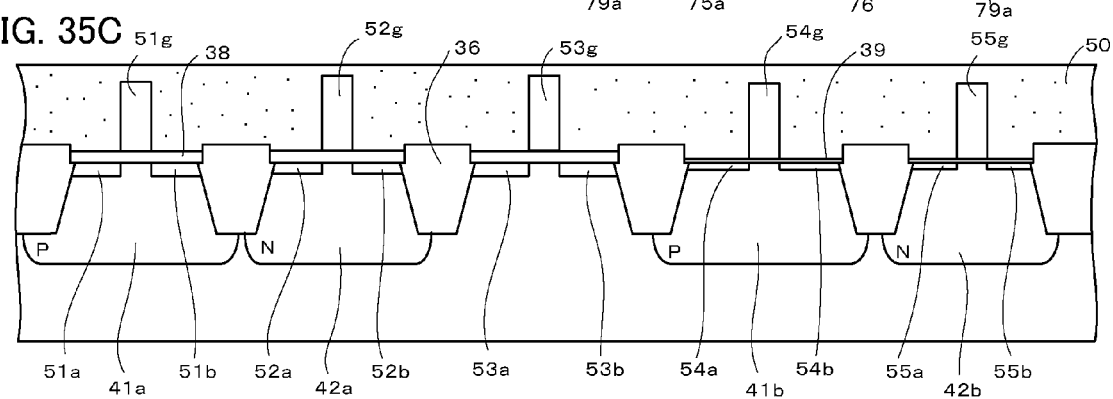

Next, the example steps of fabricating the structure of FIGS. 35A to 35C are described below.

First, according to a process similar to that of the first embodiment, the word lines WL1 and WL2 which extend in the row direction are formed in the memory cell array area. Portions of the word lines WL1 and WL2 are formed by the selector gate electrode 78 and the memory gate electrode 74 as illustrated in FIG. 32. In the memory transistor forming regions, as illustrated in the plain view of FIG. 19C, the word lines WL1 and WL2 overlap the portions of the ONO film 13.

Further, according to a process similar to that of the first embodiment, in the peripheral circuit area, gate electrodes 51g, 52g, 53g, 54g and 55g and other wirings are formed in the 5V NMOSFET region 35a, the 5V PMOSFET region 35b, the 5V low-threshold NMOSFET region 35c, the 1.8V NMOSFET region 35d, and the 1.8V PMOSFET region 35e, respectively.

Subsequently, according to a process similar to that of the first embodiment, the n-type extension regions 51a, 51b, 53a, 53b, 54a, and 54b are formed in the P-wells 41a and 41b and the 5V low-threshold NMOSFET region 35c in the peripheral circuit area. In addition, the p-type extension regions 52a, 52b, 55a, and 55b are formed in the N-wells 42a and 42b in the peripheral circuit area.

Next, the peripheral circuit area is coated with photoresist 50, and portions of the memory cell array area are exposed or made uncoated.

Further, the word lines WL1 and WL2 are used as a mask to remove portions of the upper silicon oxide film 13c and the silicon nitride film 13b of the ONO film 13 by means of the reactive ion etching (RIE) technique. The lower silicon oxide film 13d of the ONO film 13 remains. Thus, as illustrated the plain view of FIG. 19D, the ONO film 13 remaining under the memory gate electrode 74 is used as a charge storage or trapping layer.

After that, the word lines WL1 and WL2 are used as a mask to implant the p-type impurity ions in the memory cell array area. In this case, the ions may be arsenic ions, and the ions may be implanted at a dose of $6\times10^{14}/cm^2$ with ion implant energy of 20 keV.

Thus, the n-type extension regions 75a and 79a and the n-type source and drain (source/drain) regions 76 are formed in the P-wells 72 and below and adjacently to the lateral opposite sides of the word lines WL1 and WL2, as illustrated in FIG. 32. After that, the photoresist 50 is removed.

Figure 36A:
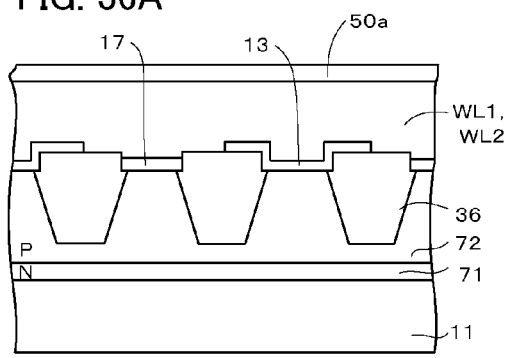
FIGS. 36A-36C are a fourth subset of cross-sectional views for illustrating the example steps of forming the semiconductor device in accordance with the sixth embodiment of the present invention.
Figure 36B:
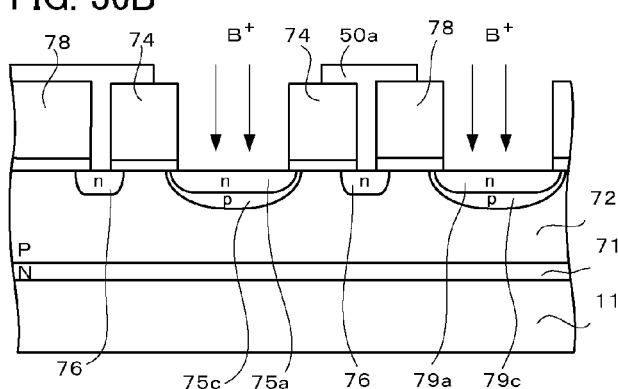
Figure 36C:
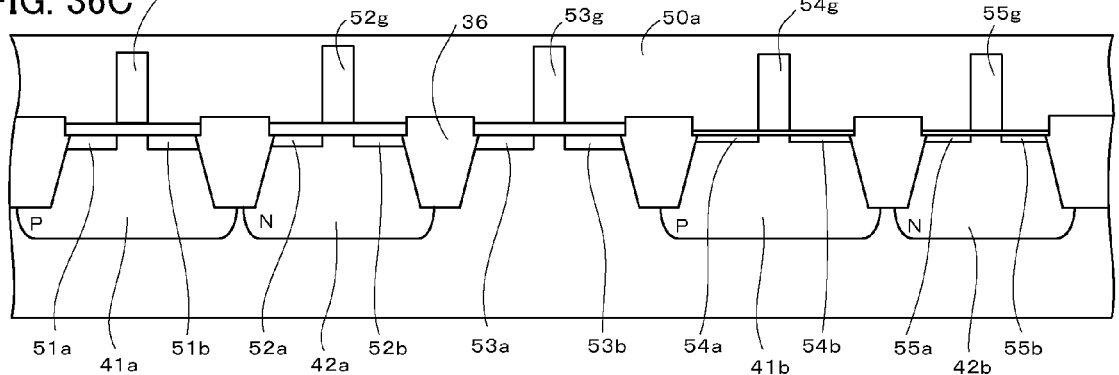

Next, the example steps of fabricating the structure of FIGS. 36A to 36C are described below.

First, a photoresist pattern 50a is formed over the surface of the silicon substrate 11, so that the n-type extension regions 75a and 79a of the memory cell array area are exposed or made uncoated, and the n-type source/drain region 76 and other regions are coated with the photoresist. The photoresist pattern 50a is provided by applying the photoresist to the entire surface of the silicon substrate 11 to coat the word lines WL1 and WL2 and the like and then exposing and developing the photoresist.

Subsequently, the boron ions are implanted at a dose of $1\times10^{13}/cm^2$ with acceleration energy at 20 keV in the n-type extension regions 75a and 79a which are not coated by the resist pattern 50a, so that the p-type impurity diffusion regions 75c and 79c are formed around lower boundaries or interfaces of or beneath the n-type extension regions 75a and 79a.

After that, in a process similar to that in the first embodiment, the side walls 20 are formed on surrounding lateral sides of the word lines WL1 and WL2, the gate electrodes 51g, 52g, 53g, 54g and 55g. The side wall 20 is thus embedded or buried in the space between the selector gate electrode 78 and the memory gate electrode 74.

Figure 37A:
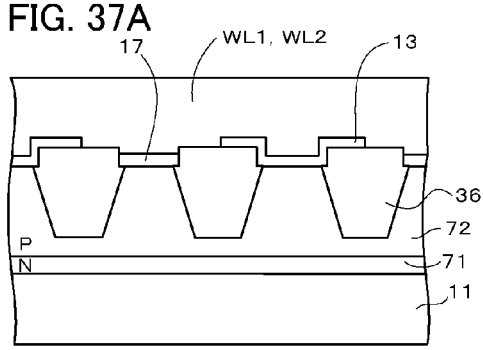
FIGS. 37A-37C are a fifth subset of cross-sectional views for illustrating the example steps of forming the semiconductor device in accordance with the sixth embodiment of the present invention.
Figure 37B:
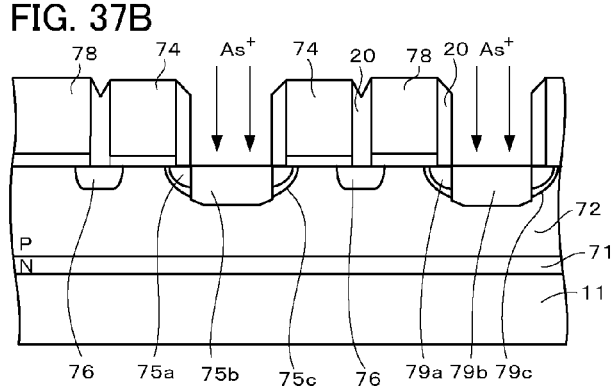
Figure 37C:
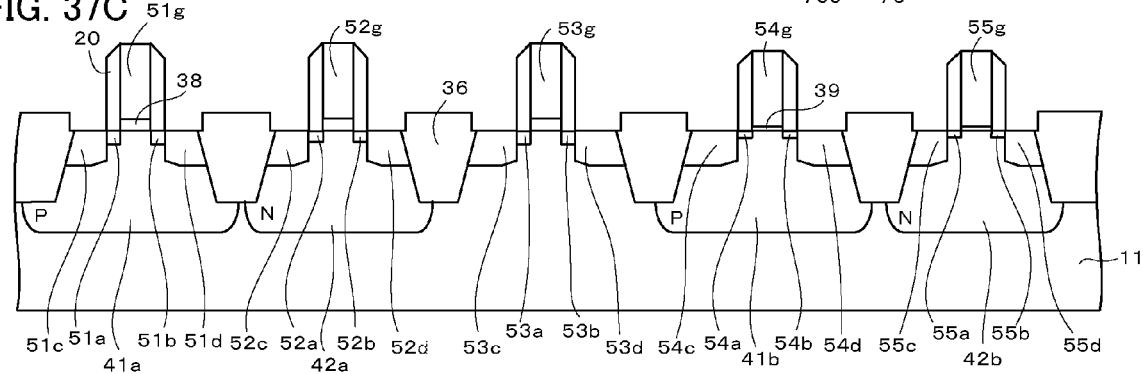

Next, the example steps of fabricating the structure of FIGS. 37A to 37C are described below.

First, in the memory cell array area, the word lines WL1 and WL2, and the side walls 20 are used as a mask to implant arsenic ions as n-type impurity ions in the P-well 72. Thus, in the active region 34, an n-type high-concentration impurity diffusion region 79b is formed in the n-type drain region 79 to be shared by the two adjacent selector transistors ST, and, simultaneously, an n-type high-concentration impurity diffusion region 75b is formed in the n-type source region 75 to be shared by the two adjacent memory transistors MT.

Further, in the peripheral circuit area, the gate electrodes 51g, 53g, and 54g, and the side walls 20 are used as a mask to implant arsenic ions as the n-type impurity ions in the P-wells 41a and 41b, so that n-type high-concentration impurity diffusion regions 51c, 51d, 53c, 53d, 54c and 54d are formed as the source and drain (source/drain) regions.

After that, p-type high-concentration impurity diffusion regions 52c, 52d, 55c, and 55d are formed in the source and drain (source/drain) regions on respective opposite sides of the gate electrodes 52g and 55g, in the N-wells 42a and 42b of the peripheral circuit area.

In implanting the n-type impurity and p-type impurity ions as described above, the non-ion-implanted regions of the silicon substrate 11 are coated with photoresist.

The impurity ions implanted as described above are activated by annealing.

Figure 38A:
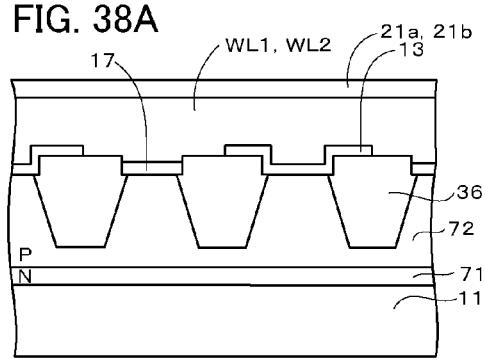
FIGS. 38A-38C are a sixth subset of cross-sectional views for illustrating the example steps of forming the semiconductor device in accordance with the sixth embodiment of the present invention.
Figure 38B:
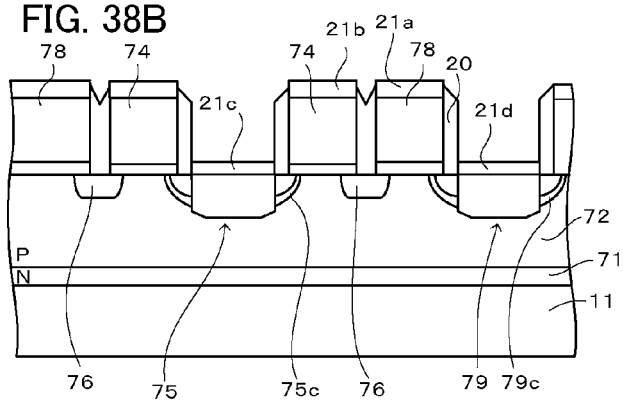
Figure 38C:
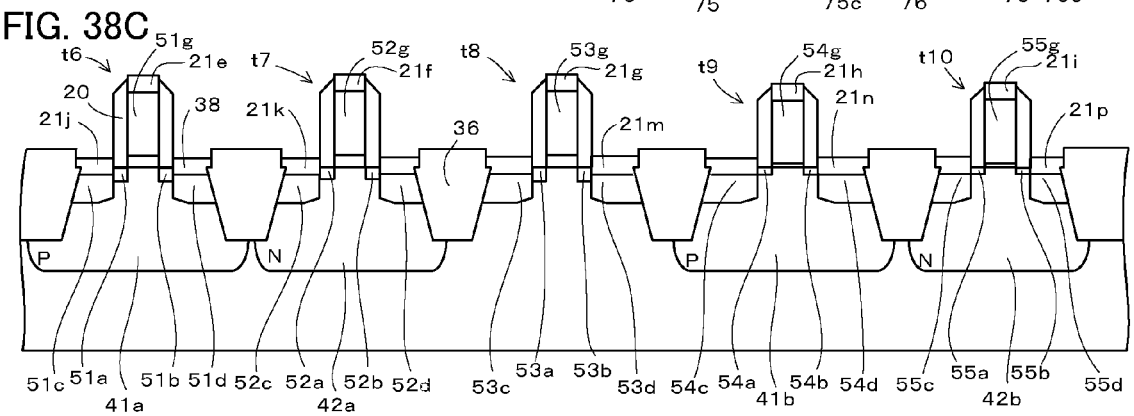

Next, as illustrated in FIGS. 38A to 38C, according to steps similar to those in the first embodiment, silicide layers 21a, 21b, and 21e, 21f, 21g, 21h, and 21i are formed on the upper surfaces of the word lines WL1 and WL2, and the gate electrodes 51g, 52g, 53g, 54g, and 55g, respectively. Simultaneously, silicide layers 21c, 21d, 21j, 21j, 21m, 21m, 21n, 21n, 21k, 21k, 21p and 21p are formed on the upper surfaces of the n-type high-concentration impurity diffusion regions 75b, 79b, 51c, 51d, 53c, 53d, 54c and 54d, and the p-type high-concentration impurity diffusion regions 52c, 52d, 55c and 55d.

Thus, in the stripe active regions 34 of the memory cell array area, a number of the memory cells MC's are formed, so that the selector transistor ST and the memory transistor MT alternate their relative positions and orientations in the memory cells MC's in each stripe active region 34. Thus, for any two adjacent memory cells MC's along the lengths of the word lines WL1 and WL2, relative positions and orientations of the selector transistor ST and the memory transistor MT of one of the two memory cells MC'S are opposite to those of the other memory cell MC.

In this embodiment, the selector transistors ST and the memory transistors MT are of an NMOSFET type. On the other hand, NMOSFET's $t_6$, $t_8$, and $t_9$ are formed in the positions of the P-wells 41a, 41b, and the like, and PMOSFET's $t_7$ and $t_{10}$ are formed in the positions of the N-wells 42a and 42b.

Accordingly, a bulk semiconductor process is completed. After that, wiring layers such as conductive plugs, vias, and wirings are formed in a manner similar to that in the first embodiment.

Seventh Embodiment

Figure 39:
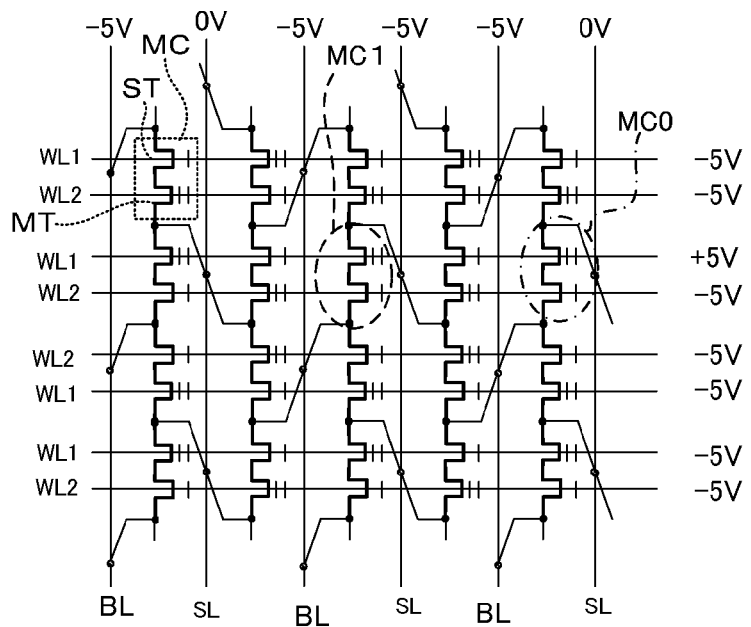
FIG. 39 illustrates an example memory circuit for a semiconductor device in accordance with a seventh embodiment of the present invention.
Figure 40A:
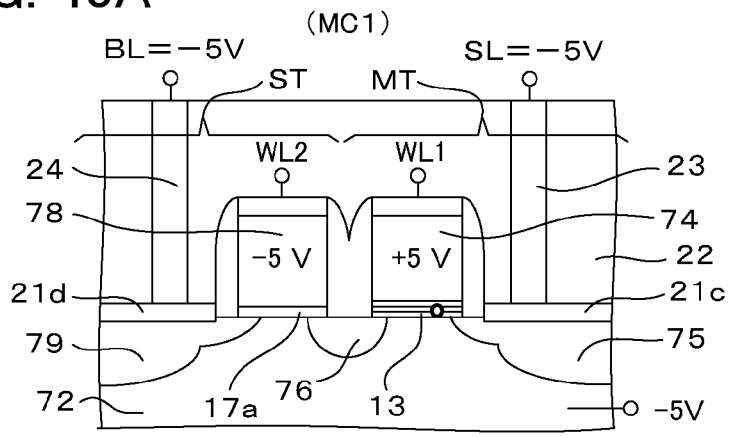
FIGS. 40A and 40B are cross sectional views for illustrating operations of an example semiconductor device of FIG. 39.
Figure 40B:
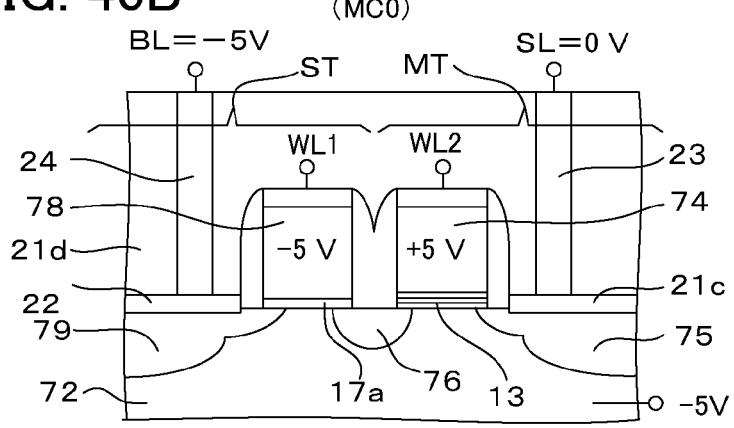

FIG. 39 illustrates an example circuit diagram for a memory cell array as a semiconductor device in accordance with a seventh embodiment of the present invention. FIGS. 40A and 40B are cross sectional views of a memory cell in the memory cell array.

In FIGS. 40A and 40B, the memory cell MC includes an n-channel memory transistor MT and an n-channel selector transistor ST, similarly to those in the sixth embodiment. In FIGS. 40A and 40B, symbols and numerals similar to those of FIG. 32 indicate elements similar to those of FIG. 32.

Next, an FN (Fowler-Nordheim) tunneling write operation is described below.

In FIG. 39, it is assumed that a write operation is performed on a selected memory cell MC1 enclosed with a dashed line, and no write operation is to be performed on a memory cell MC0 enclosed with a dashed-dotted line.

In the FN tunneling write operation for the selected memory cell MC1, a combination of voltages of FIGS. 39 and 40A is applied to the associated bit line BL, the associated source line SL, the associated word lines WL1 and WL2, and the associated P-well 72.

In the memory cell MC1 selected for writing, as illustrated in FIG. 40A, a voltage of +5 V is applied to the word line WL1 coupled to the memory gate electrode 74, a voltage of −5 V is applied to the source line SL, and a voltage of −5 V is also applied to the bit line BL, while a voltage of −5 V is applied to the P-well 72. The voltage at the source line SL coupled to the memory cell MC0 not selected for writing is set to be zero (0) V.

Thus, a potential difference between the channel of the selected memory transistor MT and the associated word line WL1 becomes 10 V. Thus, the electrons generated are injected according to the FN tunneling mechanism into the ONO film 13 for writing.

During this operation, as illustrated in FIG. 40B, the voltage of +5 V is also applied to the memory gate electrode 74 of the non-selected memory cell MC0 coupled to the same word line WL1. However, in the non-selected memory cell MC0, the voltage of the source line SL is set to be zero (0) V, and hence the voltage of the channel formed under the memory gate electrode 74 is set to be zero (0) V through the n-type source region 75. Thus, the potential difference between the memory gate electrode 74 and the formed channel becomes 5 V. Thus, no write operation according to the FN tunneling mechanism is performed on the non-selected memory cell MC0.

Accordingly, employing the memory circuit arrangement as illustrated in FIG. 39 allows the write operation according the FN tunneling mechanism to be performed, although the selector transistor ST is disposed at a position closer to the bit line BL than the memory transistor MT.

Eighth Embodiment

Figure 41:
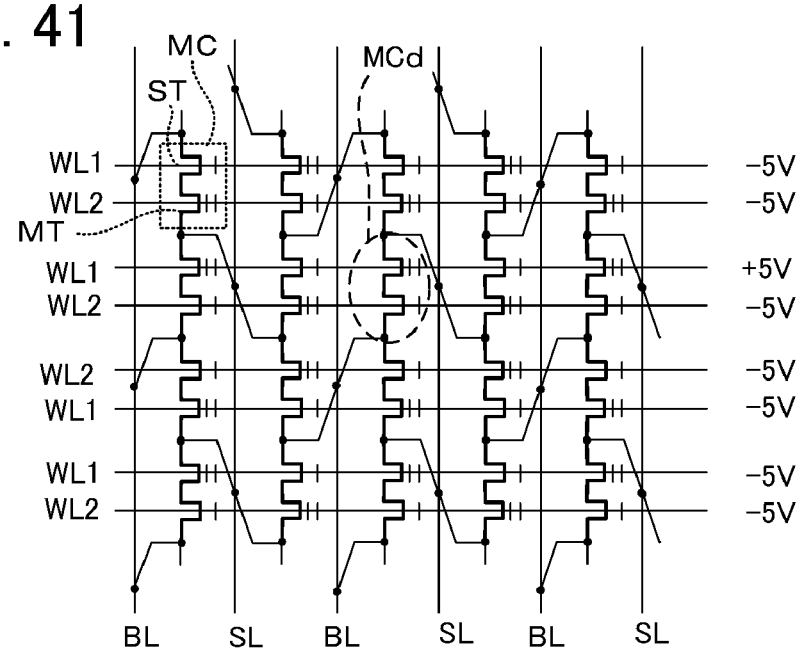
FIG. 41 illustrates an example memory circuit for a semiconductor device in accordance with an eighth embodiment of the present invention.

FIG. 41 illustrates an example circuit diagram for a memory cell array as a semiconductor device in accordance with an eighth embodiment of the present invention.

The following describes a data bit erase operation for the flash memory in accordance with this embodiment, as illustrated in FIG. 41. The bit erase operation erases any selected one or ones of the memory cells. Thus, the data bit or bits only in the selected memory cell or cells are rewritten or overwritten.

For the purpose of description, it is assumed that the memory cell MC in FIG. 41 includes the p-channel memory transistor and the p-channel selector transistor as illustrated in FIG. 2.

First, in an erase operation for a memory cell MCd, a set of voltages in TABLE 4 is applied to the associated bit line BL, the associated source line SL, the associated word lines WL1 and WL2, and the associated N-well 72. In TABLE 4, parenthesized voltage values are applied to non-selected lines.

TABLE 4

| | BL | SL | WL2 (SELECTOR TR) | WL1 (MEMORY TR) | N-WELL |
|---|---|---|---|---|---|
| WRITE | 0 V (0 V) | −5 V (0 V) | 0 V (0 V) | 5 V (0 V) | 0 V |
| READ | −1.8 V (0 V) | 0 V (0 V) | −1.8 V (0 V) | 0 V (0 V) | 0 V |
| BIT ERASE | 0 V (0 V) | 0 V (−5 V) | 0 V (0 V) | −10 V (0 V or −10 V) | 0 V |

In the memory cell MCd selected or addressed for erasing, a voltage of −10 V is applied to the memory gate electrode 14 coupled to the word line WL1, and both of the voltages of the source line SL (23) and the bit line BL (24) are set to be zero (0) V, while the N-well 12 as illustrated in FIG. 2 is set to be zero (0) V.

Thus, the potential difference between the channel region of the selected memory transistor MT and the word line WL1 is −10 V. Thus, the electrons tunnel out of the ONO film 13 to the channel, so that the data bit in the memory cell MCd is erased.

During this operation, the voltage of −10 V is also applied to the memory gate electrode 14 of the non-selected memory cell MC coupled to the same word line WL1. However, a voltage of −5 V is applied to the source line SL coupled to the memory transistor MT of the non-selected memory cell MC, and hence the voltage of the channel formed under the memory gate electrode 14 is set to be −5 V referenced or relative to the p-type source region 15. Thus, the potential difference between the memory gate electrode 14 and this channel becomes small 5 V. Thus, no erase operation is performed on the non-selected memory cell MC.

Next, for the purpose of description, in an alternative bit erase operation for the memory cell MC as illustrated in FIG. 41, it is assumed that the memory cell MC includes the n-channel memory cell and the n-channel selector transistor as illustrated in FIG. 32.

In the erase operation for a memory cell MCd, a set of voltages in TABLE 5 is applied to the associated bit line BL, the associated source line SL, the associated word lines WL1 and WL2, and the associated N-well 12. In TABLE 5, parenthesized voltage values are applied to non-selected lines.

TABLE 5

|  | BL | SL | WL2 (SELECTOR TR) | WL1 (MEMORY TR) | P-WELL |
| --- | --- | --- | --- | --- | --- |
| WRITE | 0 V | 5 V | 0 V | 5 V | 0 V |
|  | (0 V) | (0 V) | (0 V) | (0 V) |  |
| READ | 1.8 V | 0 V | 1.8 V | 0 V | 0 V |
|  | (0 V) | (0 V) | (0 V) | (0 V) |  |
| BIT ERASE | 0 V | 5 V | 0 V | −5 V | 0 V |
|  | (0 V) | (0 V) | (0 V) | (0 V or −5 V) |  |

In the memory cell MCd selected or addressed for the erasing, a voltage of −5 V is applied to the memory gate electrode 74 coupled to the word line WL1, a voltage of 5 V is applied to the source line SL, and the voltage of the source line SL is set to be zero (0) V, while the P-well 72 as illustrated in FIG. 32 is set to be zero (0) V.

Accordingly, the hot holes generated by the band-to-band tunneling effect in the p-n junction between the n-type source region 75 and the P-well 72 are injected into the silicon nitride film 13b of the ONO film 13. Thus, the threshold of the memory transistor MT is changed to have a negative value. As a result, the data bit in the memory cell MCd is erased.

During this operation, the voltage of −5 V is also applied to the memory gate electrode 74 of the non-selected memory cell MC coupled to the same word line WL1. However, when the voltage of the source line SL coupled to the memory transistor MT in the memory cell MC is set to be zero (0) V, no hot hole is generated. Thus, no data bit erase operation is performed on the non-selected memory cell MC.

Accordingly, as illustrated in FIG. 41, the data bit in any selected one or ones of the memory cells MC's can be erased, even if the drain region of the selector transistor ST in the memory cell MC is directly coupled to the bit line BL.

Ninth Embodiment

Figure 42:
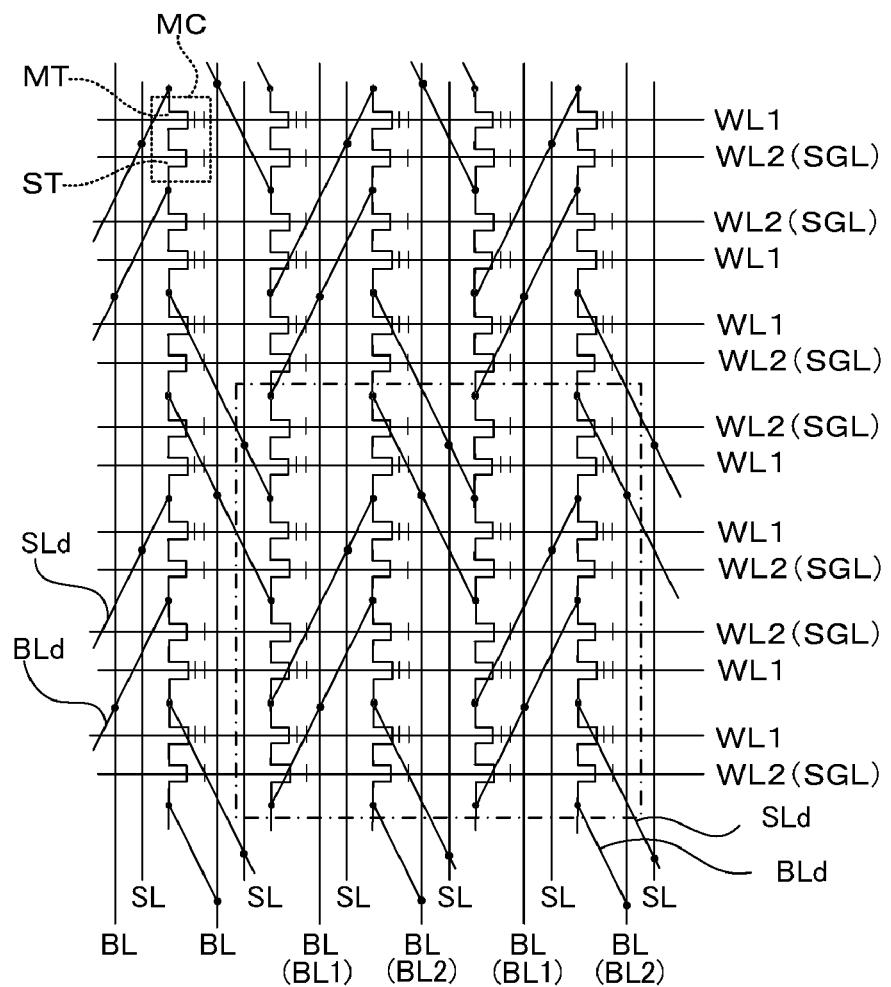
FIG. 42 illustrates an example memory circuit for a semiconductor device in accordance with a ninth embodiment of the present invention.

FIG. 42 illustrates an example circuit diagram for a memory cell array as a semiconductor device in accordance with a ninth embodiment of the present invention. In FIG. 42, symbols and numerals similar to those of FIG. 1 indicate elements similar to those of FIG. 1.

In FIG. 42, the memory cells MC's are arranged such that a number, n, of memory cells MC's are arranged in each row, and a number, m, of memory cells MC's are arranged in each column, for example.

Each of the memory cells MC's includes a memory transistor MT and a selector transistor ST, and may have either one of the structures illustrated in the first to sixth embodiments. For the purpose of description below, it is assumed that the memory cell MC has the structure as illustrated in FIG. 2, for example.

In FIG. 42, the bit lines BL and the source lines SL extend in a direction to cross the word lines WL1 and WL2. A number of memory cells MC's are formed in a number of respective stripe active regions which extend in a longitudinal direction of the bit lines BL, and the source lines SL.

The word lines WL2 are coupled only to the selector transistors ST as described later, and hence are referred to as selection lines SGL hereinafter.

For any two adjacent memory cells MC's in each active region, relative positions of the memory transistor MT and the selector transistor ST in one of the two memory cells MC's are opposite to those of the other adjacent memory cell MC. The two memory cells MC's are coupled in series. Thus, the adjacent memory cell MC shares at least one of its source region 15 and drain region 19 with at least one of the other adjacent one or ones of the memory cells MC's.

On the other hand, the memory transistor MT and the selector transistor ST of each of the adjacent memory cells MC's in a longitudinal direction of the word line WL1 and the selection line SGL are arranged in the same relative positions or orientations. This arrangement is different from that of FIG. 1.

For the adjacent memory cells MC's in a longitudinal direction of the word line WL1 and the selection line SGL, their memory gate electrodes 14 are coupled to the same word line WL1, and their selector gate electrodes 18 are coupled to the same selection line SGL.

The source region 15 of the memory cell MC is electrically coupled to one of the source regions 15 of the other memory cells MC's, which is disposed adjacently in a direction oblique to the associated word line WL1. The drain region 19 of the memory cell MC is electrically coupled to one of the drain regions 19 of the other memory cells MC's, which is disposed adjacently in a direction oblique to the associated word line WL1.

Alternate ones of the shared source regions 15 in each active region are coupled a corresponding one of the source lines SL. The remaining shared source regions 15 in that active region are coupled to another corresponding one of the source lines SL.

Alternate ones of the shared drain regions 19 in each active region are coupled a corresponding one of the bit lines BL. The remaining shared drain regions 19 in that active region are coupled to another corresponding one of the bit lines BL.

The memory circuit arrangement illustrated in FIG. 42 may be used for the memory cell array for an EEPROM. A structure of a memory cell of the memory cell array is described in the tenth embodiment.

Even in the arrangement described above, in which the memory transistor MT and the selector transistor ST of each of the adjacent memory cells MC's arranged along the word line WL1 have the same relative positions or orientations, the source regions 15 of the memory transistors MT can be coupled to the different source lines SL, and the drain regions 19 of the selector transistors ST can be coupled to the different bit lines BL.

In the arrangement described above, selection of one of the word lines WL1 and one of the source lines SL allows only one of the memory transistors MT to be selected for writing. In addition, a read operation and an erase operation in this embodiment can be performed in a manner similar to those in any of the first to eighth embodiments.

The arrangement described above can prevent differences of the written state of the memory transistor MT from affecting parasitic capacitance of the bit line BL.

Tenth Embodiment

Figure 43:
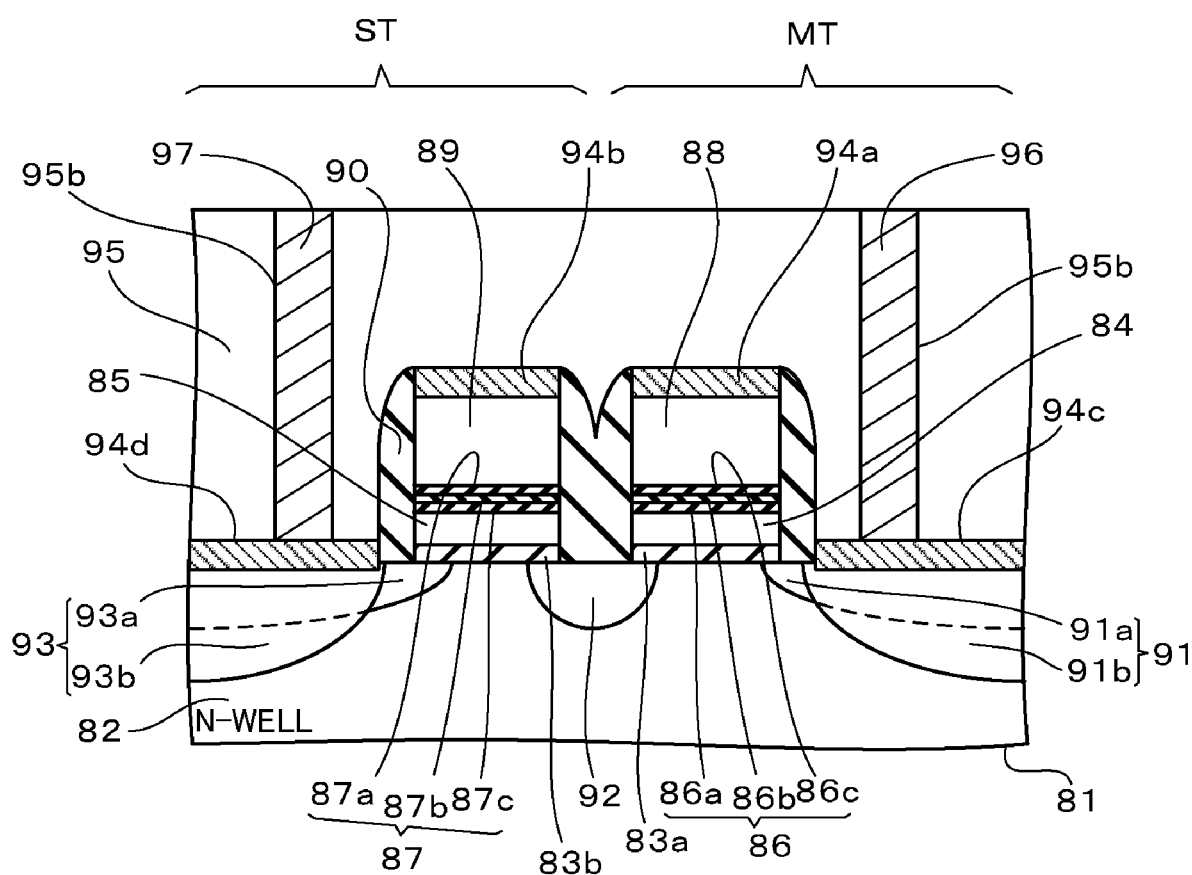
FIG. 43 is a cross sectional view of an example semiconductor device in accordance with a tenth embodiment of the present invention.

FIG. 43 is a cross sectional view of an example memory cell for an EEPROM as a semiconductor device in accordance with a tenth embodiment of the present invention.

The memory cell MC has a structure such that the memory cell MC includes a memory transistor MT and a selector transistor ST coupled in series.

The memory transistor MT includes a gate insulating film 83a formed over an N-well 82 of a silicon substrate 81, and a floating gate electrode 84 formed as a charge storage or trapping layer over the gate insulating film 83a. The memory transistor MT further includes a control gate electrode 88 which is formed on an interposing ONO film 86 and over or above the floating gate electrode 84. The memory transistor MT further includes a p-type source region 91 and a shared p-type source and drain (source/drain) region 92, which are formed within the N-well 82 on respective opposite lateral sides of the floating gate electrode 84. The p-type source region 91 is formed of a p-type impurity diffusion region of high concentration 91b, and a p-type extension region 91a which extends into a region under the floating gate electrode 84.

The selector transistor ST includes a selector gate electrode 85 which is formed on an interposing gate insulating film 83b over or above the N-well 82. The selector transistor ST further includes a shared p-type source and drain (source/drain) region 92 and a p-type drain region 93, which are formed within the N-well 82 on respective opposite lateral sides of the selector gate electrode 85. The p-type drain region 93 is formed of a p-type impurity diffusion region of high concentration 93b, and a p-type extension region 93a which extends into a region under the selector gate electrode 85. A conductive poly-silicon film 89 is formed on an interposing ONO film 87 and over the selector gate electrode 85.

The selector transistor ST and the memory transistor MT share the p-type source/drain region 92.

Silicide layers 94a and 94b are formed as upper layers over or on the control gate electrode 88 and the conductive poly-silicon film 89, respectively. Further silicide layers 94c and 94d are formed over or on respective surfaces of the p-type source region 91 and the p-type drain region 93, respectively.

The two ONO films 86 and 87 are formed to have the same stack layers, and may be formed of respective lower silicon oxide film 86a and 87a of a thickness of 4 nm, respective silicon nitride films 86b and 87b of a thickness of 5 nm, and respective upper silicon oxide films 86c and 87c of a thickness of 4 nm, which are formed in this order.

The gate insulating films 83a and 83b have a thickness of 10 nm.

A first interlayer insulating film 95 is formed over the memory transistor MT and the selector transistor ST. First and second contact holes 95a and 95b are formed in the first interlayer insulating film 95 and formed to reach upper surface portions of the silicide layers 94c and 94d and above the p-type source region 91 and the p-type drain region 93, respectively. A first conductive contact plug 96 and a second conductive contact plug 97 are buried or embedded in the first and second contact holes 95a and 95b, respectively.

The first conductive plug 96 over or above the p-type source region 91 is coupled to the source line SL. The second conductive plug 97 over or above the p-type drain region 93 is coupled to the bit line BL. Thus, differences of the written state of the memory transistor MT can be prevented from affecting parasitic capacitance of the bit line BL.

The control gate electrode 88 and the selector gate electrode 85 are coupled to the word line WL1 and the selection line SGL, respectively.

The thickness of the gate insulating electrode 83b of the selector transistor ST in this embodiment may be made thinner, similarly to that in the second and fifth embodiments. The impurity concentration of the p-type source/drain region 92 in this embodiment may be lower than the impurity concentrations of the p-type extension regions 91a and 93a, similarly to that in the fourth embodiment. An opposite conductivity type or n-type impurity diffusion region may be formed around lower boundaries or interfaces of or beneath the p-type high-concentration impurity regions 91b and 93b, similarly to that in the third embodiment. The memory transistor MT and the selector transistor ST may be n-type transistors, similarly to those in the sixth embodiment.

The memory cell MC with the structures as described above in this embodiment may be used for the memory cell array as illustrated in FIGS. 1 and 42.

For example, in the arrangement of the memory cells MC's in each column disposed adjacently to and along the bit lines BL and the source lines SL as illustrated in FIG. 42, the memory transistor MT and the selector transistor ST of every memory cell MC alternate their relative positions or orientations in the memory cells MC's along the bit line BL and the source lines SL. On the other hand, the memory transistor MT and the selector transistor ST of each of the adjacent memory cells MC's arranged along the word line WL1 have the same relative positions or orientations.

The memory cells MC's are coupled to the source lines SL, the bit lines BL, the word lines W11, and the selection lines SGL, similarly to the memory cells in FIG. 42.

A write operation, a read operation and an erase operation to be used in this embodiment may be similar to those in the first to eighth embodiments. However, a set of values of voltages to be applied to the source line SL, the bit line BL, the word line WL1 and the selection line SGL may be values which are adapted to be suitable for the EEPROM.

Figure 44A:
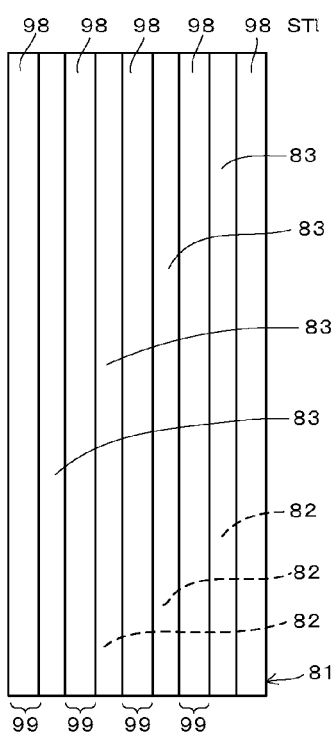
FIGS. 44A-44Q are plan views for illustrating example steps of forming the semiconductor device in accordance with the tenth embodiment of the present invention.
Figure 44B:
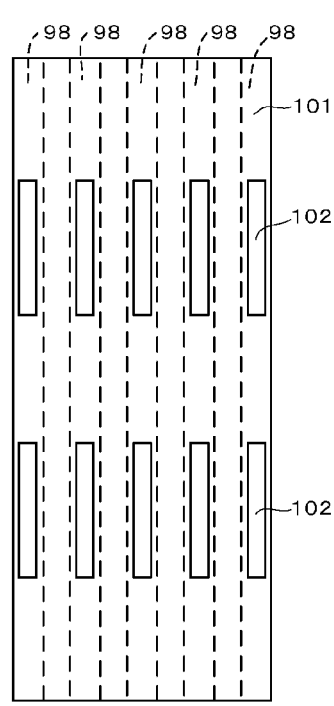
Figure 44C:
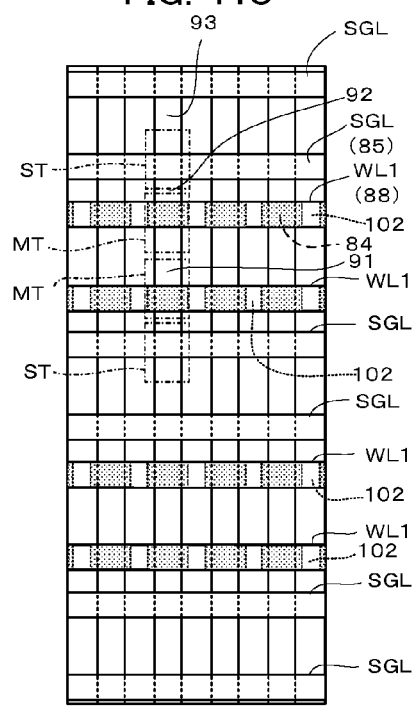
Figure 44G:
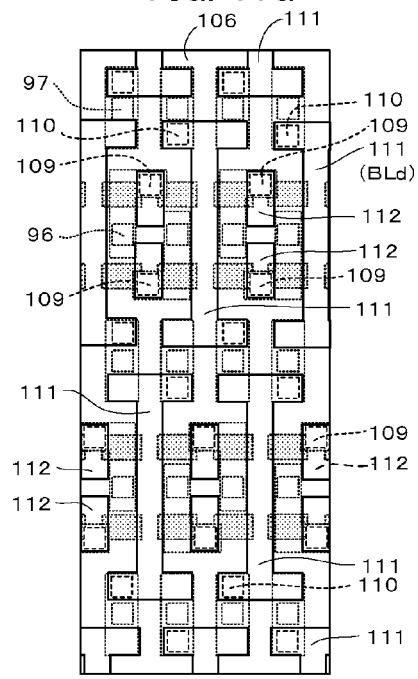
Figure 44H:
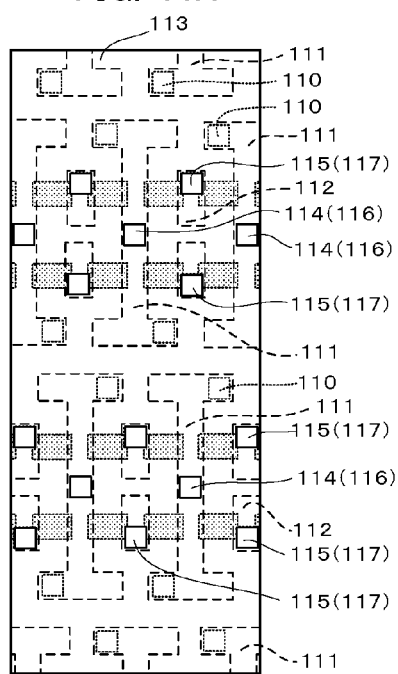
Figure 44I:
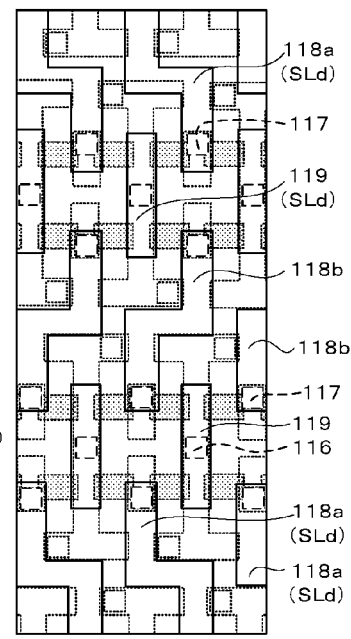
Figure 44J:
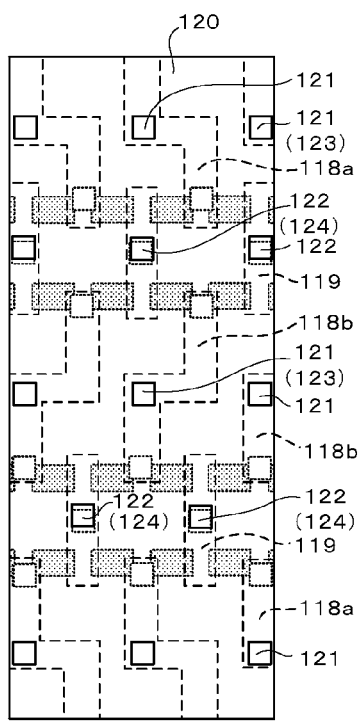
Figure 44K:
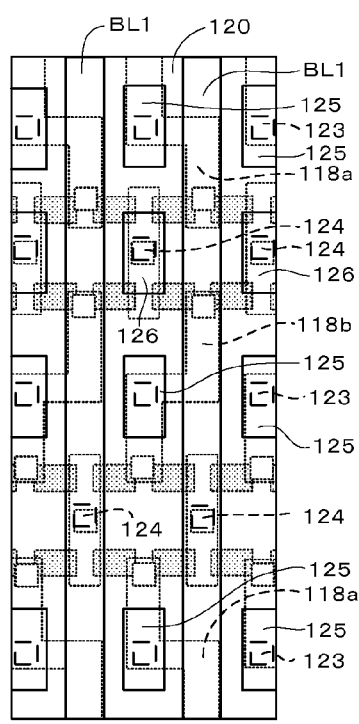
Figure 44L:
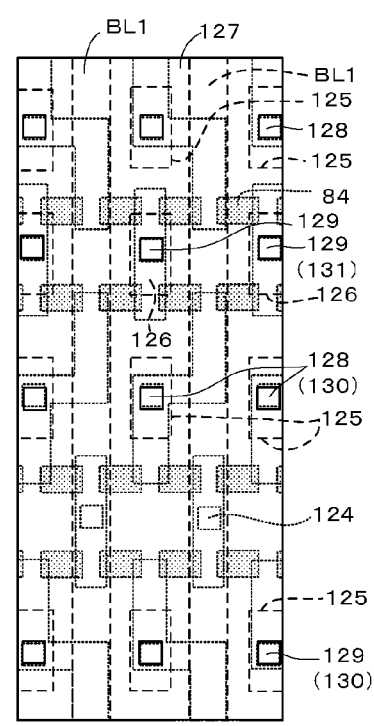
Figure 44M:
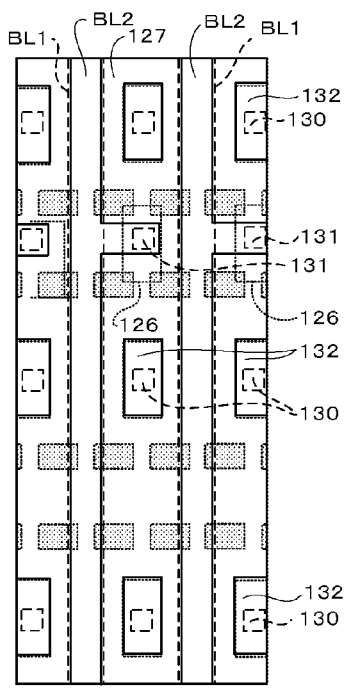
Figure 44N:
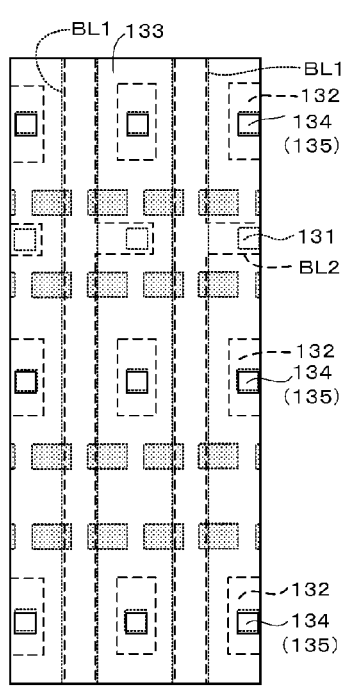
Figure 44O:
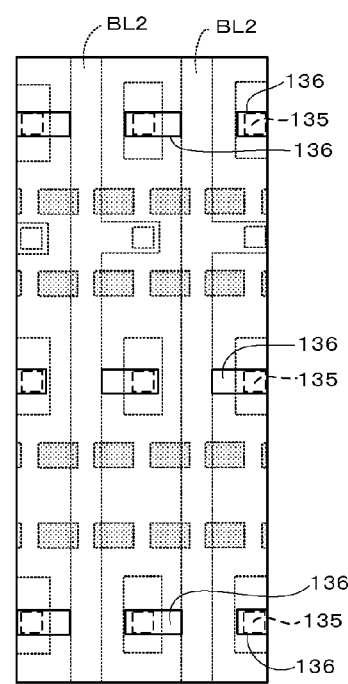
Figure 44P:
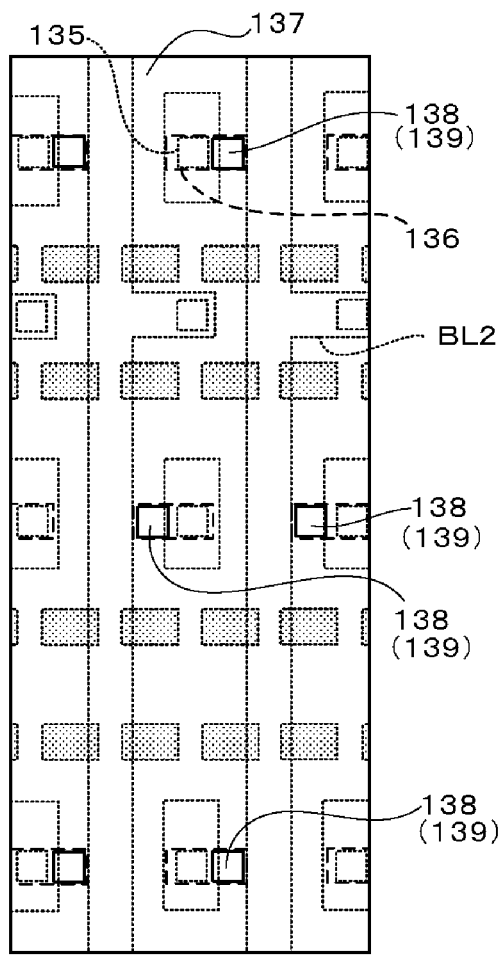
Figure 44Q:
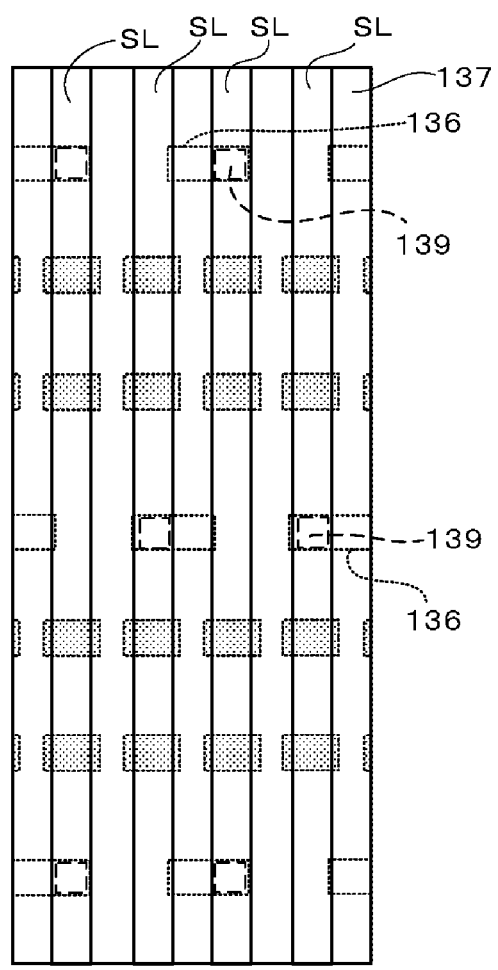

With reference to FIGS. 44A to 44Q, the following describes example steps of forming the semiconductor device, in which the memory cells having the structure illustrated in FIG. 43 are used in the circuit illustrated in FIG. 42. A circuit portion illustrated in FIG. 44A to 44Q corresponds to an area enclosed with a dashed-dotted line in FIG. 42.

First, as illustrated in FIG. 44A, STI regions 98 are formed in element separation regions on a silicon substrate 81. The element separation regions are formed in respective intervening regions between stripe active regions 99.

The STI 98 may be formed in a manner similar to that for the STI regions 36 in the first embodiment. Further, N-wells 82 may be formed by implanting the n-type impurity in the active regions 99 on the silicon substrate 81 in a manner similar to that in the first embodiment.

After that, the active regions 99 on the silicon substrate 81 are thermally oxidized to form a gate insulating film 83 of a thickness of 10 nm, for example. The gate insulating film 83 is used as the gate insulating films 83a and 83b as illustrated in FIG. 43.

Next, a first poly-silicon film 101 of a suitable thickness is formed on the gate insulating film 83.

Subsequently, as illustrated in FIG. 44B, the first poly-silicon film 101 is patterned by means of the photolithography technique for etching, so that openings 102 are formed to reach upper surface portions of the STI regions 98 on the lateral sides of regions for forming the floating gate electrodes 84.

Next, the example steps of fabricating the structure of FIG. 44C are described below.

First, an ONO film is formed on the first poly-silicon film 101. The ONO film is formed by the steps of thermally oxidizing the first poly-silicon film 101 so that the lower silicon oxide film of a thickness of 6 nm, for example, is formed, then forming the silicon nitride film by means of the CVD technique, and then thermally oxidizing a surface of the silicon nitride film so that the upper silicon nitride film of a thickness of 4 nm, for example, is formed. The resultant thickness of the silicon nitride film within the ONO film may be 5 nm, for example.

Further, a second poly-silicon film is formed over the ONO film. After that, by means of photolithography technique for etching, a one mask is used for patterning the layers between the second poly-silicon film and the first poly-silicon film 101 inclusive, so that the long stripe word lines WL1 and the long stripe selection lines SGL are formed in the row direction.

The word lines WL1 are formed of the second poly-silicon film, and are formed to have stripes and run through regions over the openings 102 formed over portions of the STI 98. In the active regions 99 under the word lines WL1, the floating gate electrodes 84 formed of the first poly-silicon film 101 are formed. The floating gate electrodes 84 are separated and isolated by the respective openings 102 formed over the portions of the STI regions 98, and are disposed over or above the respective active regions 99.

A portion of the word line WL1 that is disposed over or above the floating gate electrode 84 corresponds to the control gate electrode 88 of the memory transistor MT as illustrated in FIG. 43. A portion of the ONO film that is formed over the first poly silicon film 101 corresponds to the ONO film 86 between the control gate electrode 88 and the floating gate electrode 84 as illustrated in FIG. 43.

In FIGS. 44C to 44Q, the positions of the floating gate electrodes 84 are indicated as dot-shaded regions.

The selection lines SGL are formed of the poly-silicon film 101. Two adjacent ones of the selection lines SGL are spaced apart from each other and are disposed between two of the word lines WL1. A portion of the selection line SGL that lies in the active region 99 corresponds to the selector gate electrode 85 as illustrated in FIG. 43.

The ONO film and the second poly-silicon film that are formed over the first poly-silicon film 101 remain in the same planar shape as that of the selection line SGL, and correspond to the ONO film 87 and the poly-silicon film 89, respectively, as illustrated in FIG. 43.

Next, the word lines WL1 and the selection lines SGL are used as a mask to implant the p-type impurity ions in the active regions 99, so that the extension regions 91a and 93a are formed. Further, the side walls 90 are formed on the lateral sides of each of the word lines WL1 and the selection line SGL. After that, the word lines WL1, the selection lines SGL, and the side walls 90 are used as a mask to implant the p-type impurity ions, so that the p-type source regions 91 and the p-type drain regions 93 are formed. Subsequently, the silicide layers 94a to 94d are formed over the word lines WL1, the second poly-silicon film 89, the p-type regions 91, and the p-type drain regions 93. These steps may be similar to those in the first to seven embodiments, for example.

In FIG. 44C, the side walls 90 are not illustrated for simplicity.

According to the process described above, the memory cell MC which includes the memory transistor MT and the selector transistor ST as illustrated in FIG. 43 is formed. In this embodiment, as illustrated in FIG. 44C, the control gate electrodes 88 of the adjacent memory transistors MT disposed along the word line WL1 are coupled to each other through the word line WL1. The selector gate electrodes 85 of the adjacent selector transistors ST disposed along the selection line SGL are coupled to each other through the selection line SGL.

The memory transistor MT and the selector transistor ST alternate their relative positions or orientations in the adjacent memory cells MC's along the active region 99. Thus, two adjacent ones of the memory transistors MT disposed along the active region 99 share the p-type source region 91 so as to be coupled to each other. Two adjacent ones of the selector transistors ST disposed along the active region 99 share the p-type drain region 93 so as to be coupled to each other.

Next, the first interlayer insulating film 95 is formed over the word lines WL1, the selection lines SGL, the memory transistors MT, and the selector transistors ST. The first interlayer insulating film 95 is formed according to steps similar to those in the first embodiment. Second to seven interlayer insulating films described below are also formed in a similar manner.

Subsequently, the first interlayer insulating film 95 is patterned by means of the photolithography technique for etching, so that the first contact holes 95a and the second contact holes 95b are formed in the first interlayer insulating film 95 and formed over or above the p-type source regions 91 and the p-type drain regions 93, respectively, as illustrated in FIG. 44D.

Further, the first and second conductive contact plugs 96 and 97 are buried or embedded in the first and second contact holes 95a and 95b, respectively, as illustrated in FIG. 43. The first and second conductive contact plugs 96 and 97 may be formed in a manner similar to that in the first embodiment, for example.

Next, as illustrated in FIG. 44E, a metal film is formed over the first interlayer insulating film 95, and then is patterned by means of the photolithography technique for etching, so that the first wirings 104a, 104b, 104c, and 104d, and the first conductive pads 105 are formed to be separated from each other.

The first conductive pads 105 are coupled to the respective second conductive contact plugs 97 over or above the respective p-type drain regions 93. Each of the first conductive pads 105 has a planar shape to partially overlap with or overlie the two selection lines SGL disposed adjacently to that first conductive pad 105.

There are four different types of the first wirings 104a to 104d, which are coupled to the respective different first conductive contact plugs 96, and are also drawn in bent shapes to respective regions over or above the STI 98.

The first type of the first wiring 104a is bent in a reverse-L-shape and extends forward along the active region 99 and rightward, in FIG. 44E. The second type of the first wiring 104b is bent in an L-shape and extends backward along the active region 99 and leftward, in FIG. 44E. The third type of the first wiring 104c is bent in a reverse-L-shape and extends forward along the active region 99 and leftward, in FIG. 44E. The fourth type of the first wiring 104d is bent in an L-shape and extends backward along the active region 99 and rightward, in FIG. 44E.

The first type of the first wirings 104a and the third type of the first wirings 104c are alternately disposed along and over the same active region 99. The second type of the first wirings 104b and the fourth type of the first wirings 104d are alternately disposed along and over the active region 99 adjacent to the first type of the first wirings 104a. The first type of first wirings 104a and the third type of the first wirings 104c are alternately disposed along the two adjacent word lines WL1. The second type of the first wirings 104b and the fourth type of the first wirings 104d are alternately disposed along two other adjacent word lines WL1.

Subsequently, the second interlayer insulating film 106 is formed to overlie or cover the first wirings 104a and 104b, and the first conductive pads 105. Then, the second interlayer insulating film 106 is patterned by means of the photolithography technique for etching, so that the first via holes 107 and the second via holes 108 are formed as illustrated in FIG. 44F.

The first via holes 107 are formed on and to reach uppersurface end portions of the respective first wirings 104a to 104d that lie above the respective STI 98. The second via hole 108 is formed to reach an upper-surface end portion of the first conductive pad 105 and closer to a straight or unbent end portion of the corresponding one of the first wirings 104a to 104d. Thus, the second via holes 108 are arranged in a staggered or zigzag pattern along the two adjacent selection lines SGL.

After that, the first and second via plugs 109 and 110 are formed within the first and second via holes 107 and 108, respectively. The first and second via plugs 109 and 110 may be formed in a manner similar to that for forming the via plugs described in the first embodiment, for example.

Next, a metal film is formed over the second interlayer insulating film 106, and then is patterned by means of the photolithography technique for etching, so that the second wirings 111, and the second conductive pads 112 are formed to be separated from each other, as illustrated in FIG. 44G.

The second conductive pads 112 are thus coupled to the respective first via plugs 109, and disposed above the STI regions 98. Thus, the second conductive pads 112 are electrically coupled to the respective p-type source regions 91 through the respective first via plugs 109, the respective first wirings 104a to 104d, and the respective first conductive contact plugs 96.

The second wiring 111 has a planar, generally H-shape, so that the second wiring 111 extends beyond the two corresponding adjacent word lines WL1 and on one lateral side of the two respective adjacent second conductive pads 112. The second wiring 111 electrically couples the two via plugs 110 which are disposed at its two respective diagonally opposite ends or at its two respective ends in an oblique direction.

Thus, the p-type drain regions 93 formed in the same active region 99 are electrically coupled through the second wirings 111, the second via plugs 110, the first conductive pads 105 and the first contact plugs 97, alternately to the relatively upper or lower left adjacent p-type drain regions 93 formed in the left adjacent active region 99, and to the relatively upper or lower right adjacent p-type drain regions 93 formed in the right adjacent active region 99. Thus, the second wiring 111 forms a portion of the branch bit line BLd as illustrated in FIG. 42.

Next, the third interlayer insulating film 113 is formed to cover or overlie the second conductive pads 112 and the second wirings 111.

After that, the third interlayer insulating film 113 is patterned by means of the photolithography technique for etching, so that third via holes 114 are formed over respective substantial center portions of the respective second wirings 111, and fourth via holes 115 are also formed over portions of the respective second conductive pads 112, as illustrated in FIG. 44H. Further, third via plugs 116 and fourth via plugs 117 are formed within the third via holes 114 and the fourth via holes 115, respectively. The third via plugs 116 and the fourth via plugs 117 are located above the respective STI regions 98.

Subsequently, a metal film is formed over the third interlayer insulating film 113, and then is patterned by means of the photolithography technique for etching, so that the third wirings 118a and 118b, and the third conductive pads 119 are formed to be separated from each other, as illustrated in FIG. 44I.

The third conductive pads 119 are coupled to the respective third via plugs 116. There are first and second types of the third wirings 118a and 118b. The first type of the third wiring 118a has a generally S-shape. The second type of the third wiring 118b has a generally reverse-S-shape.

The third wirings 118a and 118b form portions of the respective branch source lines SLd for coupling the p-type source regions 91 of the memory transistors MT, as illustrated in FIG. 42.

Each of the third wirings 118a and 118b has a structure to electrically couple the two p-type source regions 91 adjacent in a slanting direction and in the two respective adjacent active regions 99. Thus, each of the third wirings 118a and 118b is coupled through the fourth via plugs 117, the second conductive pads 112, the first via plugs 109, the first wirings 104a to 104d, and the first conductive contact plugs 96, to the two p-type source regions 91.

Each of the third conductive pads 119 is coupled through the third via plug 116 to the H-shaped second wiring 111, and is disposed above the STI 98, and is surrounded by the four third wirings 118a and 118b.

Next, a fourth interlayer insulating film 120 is formed to cover the third conductive pads 119 and the third wirings 118a and 118b.

After that, the fourth interlayer insulating film 120 is patterned by means of the photolithography technique for etching, so that fifth via holes 121 are formed to reach upper surface portions of the respective third wirings 118a and 118b as the branch source lines SLd, as illustrated in FIG. 44J. Simultaneously, sixth via holes 122 are formed to reach upper surface portions of the respective third conductive pads 119, which are electrically coupled to the branch bit lines BLd.

The sixth via holes 122 are formed above portions of all the STI regions 98. On the other hand, the fifth via holes 121 are disposed above portions of every other one of the STI regions 98. Thus, along the word lines WL1 and the selection lines SGL, each of alternate ones of the STI regions 98 underlies or overlaps both of the corresponding fifth and sixth via holes 121 and 122, and each of the remaining alternate ones of the STI regions 98 underlies or overlaps only the corresponding sixth via hole 122.

This arrangement divides, into two groups, the sixth via holes 122 coupled to the branch bit lines BLd, each line coupling the two p-type drain regions 93. The first group of the sixth via holes 122 disposed above the STI region 98 are interposed between the fifth via holes 121, and distanced from the fifth via holes 121. However, the second group of the sixth via holes 122 disposed above the STI region 98 are interposed between none of the fifth via holes 121.

After that, a fifth via plug 123 and a sixth via plug 124 are formed within the fifth via hole 121 and the sixth via hole 122, respectively.

The following steps described below are those for forming the source lines SL and the bit lines BL.

First, a metal film is formed over the fourth interlayer insulating film 120, and then is patterned by means of the photolithography technique for etching, so that the first bit lines BL1, the fourth and fifth conductive pads 126 and 125 are formed to be separated from each other, as illustrated in FIG. 44K.

The first bit lines BL1 are disposed right above ones of the STI regions 98 that overlap none of the fifth via holes 121, so that the first bit lines BL1 are coupled through the second group of the sixth via plugs 124 to ones of the second wirings 111 as the branch bit lines BLd.

The fourth conductive pads 126 are formed over the first group of the sixth via holes 122, and are electrically coupled through the fifth via plugs 123 to the remaining ones of the second wirings 111. Further, the fifth conductive pads 125 are coupled through the fifth via plugs 123 to the third wirings 118a and 118b as the branch source lines SLd.

Next, a fifth interlayer insulting film 12 is formed to cover the fourth and fifth conductive pads 126 and 125, and the first bit lines BL1.

After that, the fifth interlayer insulating film 127 is patterned by means of the photolithography technique for etching, so that seventh via holes 128 and eighth via holes 129 are formed to reach respective upper-surface center portions of the fifth conductive pads 125 and the fourth conductive pads 126, respectively, as illustrated in FIG. 44L. Further, seventh and eighth via plugs 130 and 131 are formed within the seventh and eighth via holes 128 and 129, respectively.

Thus, the seventh via plug 130 is coupled through the fourth conductive pad 125 and the fifth via plug 123, to the third wiring (the branch source line) 118a or 118b. Further, the eighth via plug 131 is coupled through the fifth conductive pad 126, the sixth via plug 124, the third conductive pad 119 and the third via plug 116, to the second wiring (the branch bit line) 111.

Subsequently, a metal film is formed over the fifth interlayer insulating film 127, and then is patterned by means of the photolithography technique for etching, so that the second bit lines BL2 and the sixth conductive pads 132 are formed to be separated from each other, as illustrated in FIG. 44M.

The bit lines BL2 are formed in parallel to and above the first bit lines BL1. Each of the bit lines BL2 is coupled on its lateral side to the eighth via plugs 131.

The sixth conductive pads 132 are disposed so as to be coupled to the seventh via plugs 130, which are not coupled to the second bit lines BL2. The sixth conductive pads 132 are further electrically coupled through the respective underlying fourth conductive pads 125, the respective underlying fifth via plugs 123, and the like which lie under the seventh via plugs 130, to the underlying p-type source regions 91.

Next, a sixth interlayer insulating film 137 is formed to cover the sixth conductive pads 132 and the second bit lines BL2. After that, the sixth interlayer insulating film 137 is patterned by means of the photolithography technique for etching, so that ninth via holes 134 are formed to reach respective upper-surface center portions of the respective sixth conductive pads 132, as illustrated in FIG. 44N. Further, ninth via plugs 135 are formed within the respective ninth via holes 134.

Subsequently, a metal film is formed over the sixth interlayer insulating film 133, and then is patterned by means of the photolithography technique for etching, so that seventh conductive pads 136 are formed to be coupled to the respective ninth via plugs 135 disposed in a region between the second bit lines BL2, as illustrated in FIG. 44O.

The seventh conductive pads 136, which are arranged in the longitudinal direction of the second bit lines BL2, have shapes to extend alternately toward the second bit line BL2 on one lateral side and toward the other second bit line BL2 on the other lateral side.

Next, a seventh interlayer insulting film 137 is formed to cover the seventh conductive pads 136. After that, the seventh interlayer insulating film 137 is patterned by means of the photolithography technique for etching, so that tenth via holes 138 are formed to reach respective upper surface portions of the respective seventh conductive pads 136 that are closer to either one of the second bit lines BL2, as illustrated in FIG. 44P. Further, tenth via plugs 139 are formed within the respective tenth via holes 138.

Subsequently, a metal film is formed over the seventh interlayer insulating film 137, and then is patterned by means of the photolithography technique for etching, so that a number of source lines SL are formed, as illustrated in FIG. 44Q. The source lines SL are disposed to extend in parallel to the active regions 99. The source lines SL are coupled through the respective underlying tenth via plugs 139, the respective underlying seventh conductive pads 136, the respective underlying fifth via plugs 123, the respective underlying sixth conductive pads 132, the respective underlying seventh via plugs 130, the respective underlying fourth conductive pads 125, and the respective further underlying fifth via plugs 123, to the respective third conductive pads (the branch source lines) 119.

The circuits in the embodiments described above are not intended to limit those with the wirings in the directions and orientations as specifically described and illustrated herein, but may be modified to equivalent circuits with different directions and orientations.

The memory cell array formed by the above steps has an electrical circuit as illustrated in FIG. 42, for example. Thus, in the electrical circuit, the source region of the memory transistor MT is coupled to the source line SL, and the drain region of the selector transistor ST is coupled the bit line BL.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
   a first memory cell which includes a first memory transistor and a first selector transistor;
   a second memory cell which includes a second memory transistor and a second selector transistor;
   a first word line electrically coupled to a gate electrode of the first memory transistor and to a gate electrode of the second selector transistor;
   a second word line electrically coupled to a gate electrode of the second memory transistor and to a gate electrode of the first selector transistor; and
   a first source line electrically coupled to a source region of the first memory transistor and to a source region of the second memory transistor.

2. The semiconductor device according to claim 1, further comprising:
   a first bit line coupled to a drain region of the first selector transistor; and
   a second bit line coupled to a drain region of the second selector transistor.

3. The semiconductor device according to claim 1, wherein the first memory cell further includes a first shared source and drain region between the first memory transistor and the first selector transistor, and the second memory cell further includes a second shared source and drain region between the second memory transistor and the second selector transistor.

4. The semiconductor device according to claim 3, wherein the first source and drain region and the second source and drain region have lower impurity concentration than impurity concentrations of the source regions of the first memory transistor and the second memory transistor.

5. The semiconductor device according to claim 1, wherein the first memory cell and the second memory cell are non-volatile memory cells, which allow an avalanche injection write operation to be performed on the first memory transistor and the second memory transistor thereof.

6. The semiconductor device according to claim 1, wherein each of the first memory transistor and the second memory transistor includes a charge storage insulating film formed between the gate electrode thereof and a semiconductor substrate of the semiconductor device.

7. The semiconductor device according to claim 1, wherein each of the first selector transistor and the second selector transistor includes a gate insulating film formed between the gate electrode thereof and a semiconductor substrate of the semiconductor device, and the gate insulating film has a lower withstand voltage than a voltage for erasing to be applied between the first source line and corresponding one of the first word line and the second word line.

8. The semiconductor device according to claim 1, wherein each of the first selector transistor and the second selector transistor has a gate insulating film formed between the gate electrode thereof and a semiconductor substrate of the semiconductor device, and the gate insulating film has a higher withstand voltage than a voltage for reading to be applied to the gate electrode of each of the first selector transistor and the second selector transistor.

9. The semiconductor device according to claim 1, wherein the first selector transistor and the first memory transistor alternate their relative positions or orientations in a plurality of such first memory cells in series coupling, and
  the second selector transistor and the second memory transistor alternate their relative positions or orientations in a plurality of such second memory cells in series coupling, which are arranged along a side of the plurality of such first memory cells.

10. A semiconductor device comprising:
  a first memory cell which includes a first memory transistor and a first selector transistor;
  a second memory cell which includes a second memory transistor and a second selector transistor;
  a third memory cell which includes a third memory transistor, and includes a third selector transistor which shares a first drain region with the first selector transistor;
  a fourth memory cell which includes a fourth memory transistor, and which includes a fourth selector transistor which shares a second drain region with the second selector transistor;
  a first word line electrically coupled to a gate electrode of the first memory transistor and to a gate electrode of the second memory transistor;
  a second word line electrically coupled to a gate electrode of the third memory transistor and to a gate electrode of the fourth memory transistor;
  a first source line electrically coupled to a source region of the first memory transistor and to a source region of the fourth memory transistor;
  a second source line electrically coupled to a source region of the second memory transistor;
  a third source line electrically coupled to a source region of the third memory transistor;
  a first bit line electrically coupled to the first shared drain region; and
  a second bit line electrically coupled to the second shared drain region.

11. The semiconductor device according to claim 10, further comprising:
  a first selection line electrically coupled to a gate electrode of the first selector transistor and to a gate electrode of the second selector transistor; and
  a second selection line electrically coupled to a gate electrode of the third selector transistor and to a gate electrode of the fourth selector transistor.

12. The semiconductor device according to claim 10, wherein the first memory cell, the second memory cell, the third memory cell, and the fourth memory cell are non-volatile memory cells, which allow an avalanche injection write operation to be performed on the first memory transistor, the second memory transistor, the third memory transistor, and the fourth memory transistor thereof.

13. The semiconductor device according to claim 10, wherein each of the first memory transistor, the second memory transistor, the third memory transistor, and the fourth memory transistor includes a charge storage insulating film formed between the gate electrode thereof and a semiconductor substrate of the semiconductor device.

14. The semiconductor device according to claim 10, each of the first memory transistor, the second memory transistor, the third memory transistor, and the fourth memory transistor includes a floating gate electrode sandwiched between upper and lower insulating films that are formed between the gate electrode thereof and a semiconductor substrate of the semiconductor device.

15. The semiconductor device according to claim 10, wherein the first memory cell includes a shared source and drain region between the first memory transistor and the first selector transistor,
  the second memory cell includes another shared source and drain region between the second memory transistor and the second selector transistor,
  the third memory cell includes a further shared source and drain region between the third memory transistor and the third selector transistor, and
  the fourth memory cell includes a further shared source and drain region between the fourth memory transistor and the fourth selector transistor.

16. The semiconductor device according to claim 15, wherein the first shared source and drain region, the second shared source and drain region, the third shared source and drain region, and the fourth shared source and drain region have lower impurity concentrations than respective impurity concentrations of the respective source regions of the first memory transistor, the second memory transistor, the third memory transistor, and the fourth memory transistor, respectively.

17. The semiconductor device according to claim 10, wherein each of the first selector transistor, the second selector transistor, the third selector transistor, and the fourth selector transistor includes a gate insulating film formed between the gate electrode thereof and a semiconductor substrate of the semiconductor device, and the gate insulating film has a lower withstand voltage than a voltage for erasing to be applied between corresponding one of the first and second word lines, and corresponding one of the first, second and third source lines.

18. The semiconductor device according to claim 10, wherein each of the first selector transistor, the second selector transistor, the third selector transistor, and the fourth selector transistor includes a gate insulating film formed between the gate electrode thereof and a semiconductor substrate of the semiconductor device, and the gate insulating film has a higher withstand voltage than a voltage for reading to be applied to the gate electrode of each of the first selector transistor, the second selector transistor, the third selector transistor, and the fourth selector transistor.

19. The semiconductor device according to claim 1, wherein the two source regions coupled to the first source line are disposed at positions aligned in a direction oblique to the first word line and the second word line.

20. The semiconductor device according to claim 1, wherein an impurity diffusion region is formed beneath each of the source regions, and has a conductivity type which is different from that of each source region.

* * * * *